(12) United States Patent
Kobayashi et al.

(10) Patent No.: US 11,335,813 B2
(45) Date of Patent: May 17, 2022

(54) SEMICONDUCTOR DEVICE

(71) Applicant: SEMICONDUCTOR ENERGY LABORATORY CO., LTD., Atsugi (JP)

(72) Inventors: Hidetomo Kobayashi, Kanagawa (JP); Takayuki Ikeda, Kanagawa (JP); Takashi Nakagawa, Kanagawa (JP); Takeya Hirose, Kanagawa (JP); Shuichi Katsui, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/054,926

(22) PCT Filed: May 23, 2019

(86) PCT No.: PCT/IB2019/054254
§ 371 (c)(1),
(2) Date: Nov. 12, 2020

(87) PCT Pub. No.: WO2019/229593
PCT Pub. Date: Dec. 5, 2019

(65) Prior Publication Data
US 2021/0217891 A1      Jul. 15, 2021

(30) Foreign Application Priority Data

May 31, 2018   (JP) .............................. JP2018-104736

(51) Int. Cl.
*G11C 16/04*      (2006.01)
*H01L 29/786*     (2006.01)
(Continued)

(52) U.S. Cl.
CPC ...... *H01L 29/7869* (2013.01); *G11C 11/4074* (2013.01); *G11C 11/4096* (2013.01);
(Continued)

(58) Field of Classification Search
CPC ............. G11C 11/4074; G11C 11/4096; H01L 29/7869; H01L 27/10808; H01L 27/10855;
(Continued)

(56) References Cited

U.S. PATENT DOCUMENTS 6,222,357 B1 *   4/2001   Sakuragi .............. G09G 3/3216
                                                                      323/315
7,746,161 B2 *   6/2010   Okamoto ............... G11C 5/147
                                                                      327/538
(Continued)

FOREIGN PATENT DOCUMENTS

CN      108701480 A       10/2018
DE      112017001203      11/2018
(Continued)

OTHER PUBLICATIONS

International Search Report (Application No. PCT/IB2019/054254) dated Aug. 27, 2019.
(Continued)

*Primary Examiner* — Pho M Luu
(74) *Attorney, Agent, or Firm* — Nixon Peabody, LLP; Jeffrey L. Costellia

(57) ABSTRACT

A semiconductor device in which the accuracy of arithmetic operation is increased by correction of the threshold voltage of a transistor can be provided. The semiconductor device includes first and second current supply circuits, and the second current supply circuit has the same configuration as the first current supply circuit. The first current supply circuit includes first and second transistors, a first capacitor, (Continued)

and first to third nodes. A first terminal of the first transistor is electrically connected to the first node, and a back gate of the first transistor is electrically connected to a first terminal of the second transistor and a first terminal of the first capacitor. A gate of the first transistor is electrically connected to the second node, and a second terminal of the first capacitor is electrically connected to a second terminal of the first transistor. The first node of the first current supply circuit is electrically connected to a second node of each of the first and second current supply circuits. The threshold voltage of the first transistor is corrected by writing a correction voltage to the back gate of the first transistor.

9 Claims, 36 Drawing Sheets

(51) Int. Cl.
G11C 11/4074 (2006.01)
G11C 11/4096 (2006.01)
H01L 27/108 (2006.01)
H01L 29/66 (2006.01)

(52) U.S. Cl.
CPC .. *H01L 27/10808* (2013.01); *H01L 27/10855* (2013.01); *H01L 27/10873* (2013.01); *H01L 29/66742* (2013.01); *H01L 29/78696* (2013.01)

(58) Field of Classification Search
CPC ......... H01L 27/10873; H01L 29/66742; H01L 2/78696
See application file for complete search history.

(56) References Cited

U.S. PATENT DOCUMENTS

| | | | |
|---|---|---|---|
| 9,054,695 B2 * | 6/2015 | Dasgupta | ......... H03K 19/01818 |
| 9,851,942 B2 | 12/2017 | Kurokawa | |
| 10,114,611 B2 | 10/2018 | Kurokawa | |
| 10,120,470 B2 | 11/2018 | Kurokawa | |
| 2017/0263291 A1 | 9/2017 | Kurokawa | |
| 2018/0024663 A1 | 1/2018 | Kurokawa | |
| 2020/0110990 A1 * | 4/2020 | Harada | ................. H01L 27/108 |

FOREIGN PATENT DOCUMENTS

| | | |
|---|---|---|
| JP | 2017-168099 A | 9/2017 |
| JP | 2018-022147 A | 2/2018 |
| JP | 2019-046374 A | 3/2019 |
| JP | 2019-046375 A | 3/2019 |
| KR | 2018-0123025 A | 11/2018 |
| TW | 201802810 | 1/2018 |
| WO | WO-2017/153864 | 9/2017 |
| WO | WO-2018/189619 | 10/2018 |

OTHER PUBLICATIONS

Written Opinion (Application No. PCT/IB2019/054254) dated Aug. 27, 2019.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

* cited by examiner

FIG. 12

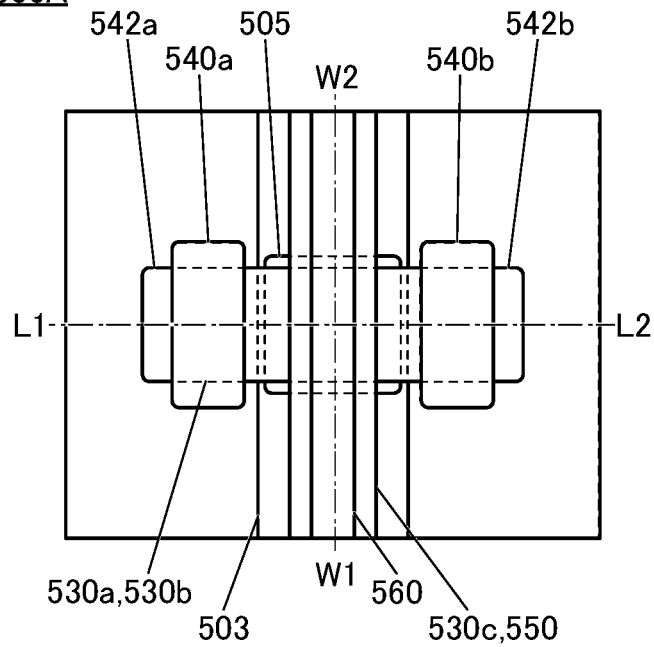
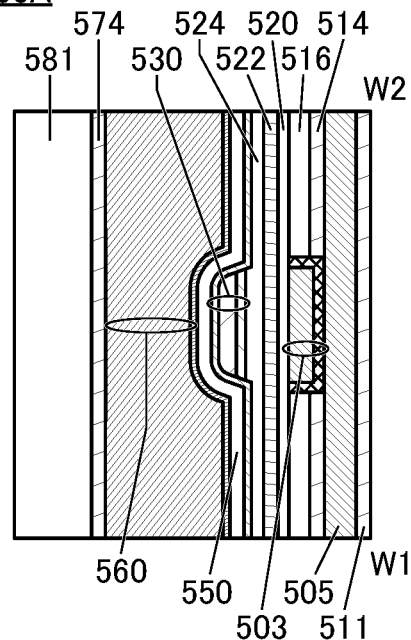
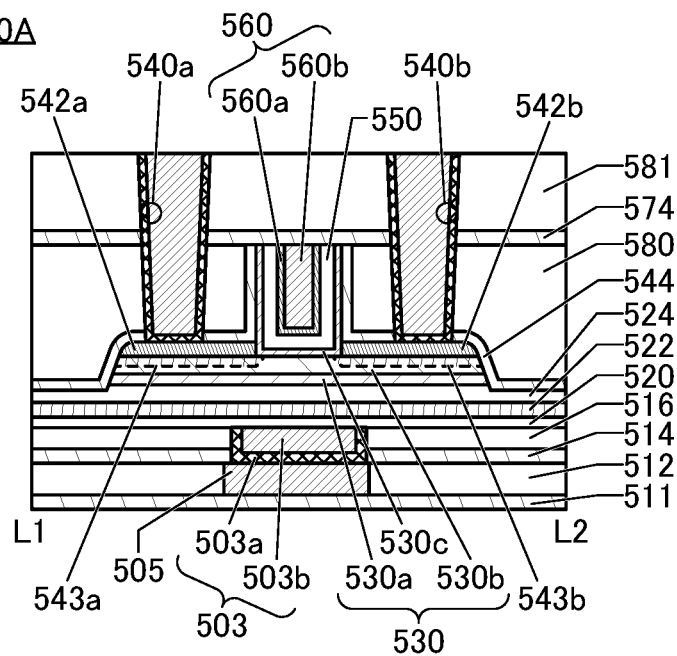

SEMICONDUCTOR DEVICE

TECHNICAL FIELD

In this specification, a semiconductor device, an operation method thereof, a manufacturing method thereof, and the like are described. Examples of a technical field of one embodiment of the present invention include a semiconductor device, a memory device, a processor, an imaging device, a switch circuit (e.g., a power switch and a wiring switch), a display device (e.g., a liquid crystal display device and an organic electroluminescence display device), a light-emitting device, a lighting device, a power storage device, an input device, and the like. Alternatively, an operation method thereof, a manufacturing method thereof, usage thereof, and the like can be given.

BACKGROUND ART

As a semiconductor that can be used in a transistor, a metal oxide has been attracting attention. An In-Ga-Zn oxide called "IGZO" and the like is a typical multi-component metal oxide. From the researches on IGZO, a CAAC (c-axis aligned crystalline) structure and an nc (nanocrystalline) structure, which are not single crystal nor amorphous, have been found (e.g., Non-Patent Document 1).

It has been reported that a transistor including a metal oxide semiconductor in a channel formation region (hereinafter, such a transistor may be referred to as an "oxide semiconductor transistor" or an "OS transistor") has an extremely low off-state current (e.g., Non-Patent Documents 1 and 2). A variety of semiconductor devices using OS transistors have been manufactured (e.g., Non-Patent Documents 3 and 4). The manufacturing process of an OS transistor can be incorporated in a CMOS process with a conventional Si transistor, and an OS transistor can be stacked over a Si transistor (e.g., Non-Patent Document 4). Patent Document 1 discloses performing a product-sum operation utilizing a memory cell in which an OS transistor is used.

REFERENCES

Patent Document

Japanese Published Patent Application No. 2017-168099

Non-Patent Documents

[Non-Patent Document 1] S. Yamazaki et al., "Properties of crystalline In-Ga-Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51,021201 (2012).

[Non-Patent Document 3] S. Amano et al., "Low Power LC Display Using In-Ga-Zn-Oxide TFTs Based on Variable Frame Frequency", SID Symp. Dig. Papers, vol. 41, pp. 626-629 (2010).

[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

The polarity of transistors has two types: an n-channel type and a p-channel type. A circuit in which an n-channel transistor and a p-channel transistor are combined is called a complementary circuit, a CMOS circuit, or the like. On the other hand, a circuit in which only a single conductivity type transistor of an n-channel transistor or a p-channel transistor is used is called a single-polarity circuit, a single conductivity type circuit, or the like. A circuit using only an n-channel transistor is called an NMOS circuit, and a circuit using only a p-channel transistor is called a PMOS circuit in some cases.

For Si transistors, the polarity of the n-channel type or the p-channel type can be selected depending on the kind of an impurity with which a semiconductor layer is doped. However, n-type semiconductors of, for example, a metal oxide containing indium (e.g., an In oxide) and a metal oxide containing zinc (e.g., a Zn oxide) have been manufactured but p-type semiconductors thereof are difficult to manufacture in terms of mobility and reliability. Therefore, a circuit formed of OS transistors is an n-channel single-polarity circuit in many cases.

In the case where a single-polarity circuit is formed, the number of transistors tends to be large, so that the circuit size of the single-polarity circuit is larger than that of a CMOS circuit in some cases. In a single-polarity circuit, since the number of transistors is large, heat generation of the circuit itself is increased to change characteristics of the transistors in some cases. Also in a single-polarity circuit, the large number of transistors increases a variation in characteristics (particularly, the threshold voltage or the like) of the transistors at the time of circuit manufacture or the like in some cases.

An object of one embodiment of the present invention is to provide a semiconductor device that is a single-polarity circuit. Another object of one embodiment of the present invention is to provide a semiconductor device capable of arithmetic processing. Another object of one embodiment of the present invention is to provide a semiconductor device in which the accuracy of arithmetic operation is increased by correction of the threshold voltage of a transistor. Another object of one embodiment of the present invention is to provide a semiconductor device that is less affected by environmental temperature.

Note that the objects of one embodiment of the present invention are not limited to the objects listed above. The objects listed above $d_0$ not preclude the existence of other objects. The other objects are objects that are not described in this section and will be described below. The objects that are not described in this section will be derived from the descriptions of the specification, the drawings, and the like by those skilled in the art and can be extracted as appropriate from these descriptions. Note that one embodiment of the present invention is to solve at least one of the objects listed above and the other objects. Note that one embodiment of the present invention does not necessarily solve all the objects listed above and the other objects.

Means for Solving the Problems (1) One embodiment of the present invention is a semiconductor device including a first current supply circuit and a second current supply circuit. The second current supply circuit has the same configuration as the first current supply circuit. The first current supply circuit includes first to fourth transistors, a first capacitor, a second capacitor, and first to third nodes. A first terminal of the first transistor is electrically connected to a first terminal of the second transistor and the first node. A back gate of the first transistor is electrically connected to a first terminal of the third transistor and a first terminal of the first capacitor. A second terminal of the third transistor is electrically connected to the second node. A gate of the first transistor is electrically connected to the third node. A second terminal of the first capacitor is electrically connected to a second terminal of the first transistor. A gate of the second transistor is electrically connected to a first terminal of the fourth transistor and a first terminal of the second capacitor. A second terminal of the second capacitor is electrically connected to the first terminal of the second transistor. The first current supply circuit has a function of varying a threshold voltage of the first transistor by writing a first correction voltage from the second node to the back gate of the first transistor when the third transistor is in an on state, and a function of retaining a voltage between the second terminal and the back gate of the first transistor by the first capacitor when the third transistor is in an off state. The first node of the first current supply circuit is electrically connected to the third node of the first current supply circuit and the third node of the second current supply circuit.

(2) Alternatively, one embodiment of the present invention is a semiconductor device including a first current supply circuit and a second current supply circuit. The second current supply circuit has the same configuration as the first current supply circuit. The first current supply circuit includes first to fifth transistors, a first capacitor, a second capacitor, and first to fifth nodes. A first terminal of the first transistor is electrically connected to a first terminal of the fifth transistor and the fifth node. A first terminal of the second transistor is electrically connected to a second terminal of the fifth transistor and the first node. A back gate of the first transistor is electrically connected to a first terminal of the third transistor and a first terminal of the first capacitor. A second terminal of the third transistor is electrically connected to the second node. A gate of the first transistor is electrically connected to the third node. A second terminal of the first capacitor is electrically connected to a second terminal of the first transistor. A gate of the fifth transistor is electrically connected to the fourth node. A gate of the second transistor is electrically connected to a first terminal of the fourth transistor and a first terminal of the second capacitor. A second terminal of the second capacitor is electrically connected to the first terminal of the second transistor. The first current supply circuit has a function of varying a threshold voltage of the first transistor by writing a first correction voltage from the second node to the back gate of the first transistor when the third transistor is in an on state, and a function of retaining a voltage between the second terminal and the back gate of the first transistor by the first capacitor when the third transistor is in an off state. The first node of the first current supply circuit is electrically connected to the fourth node of the first current supply circuit and the fourth node of the second current supply circuit. The fifth node of the first current supply circuit is electrically connected to the third node of the first current supply circuit and the third node of the second current supply circuit.

(3) Alternatively, one embodiment of the present invention is a semiconductor device with the above structure (2), in which the first current supply circuit includes a sixth transistor, a first terminal of the sixth transistor is electrically connected to the first terminal of the first transistor, and a function of bringing the fifth transistor into an off state and the sixth transistor into an on state, monitoring a current flowing between the second terminal of the first transistor and the second terminal of the sixth transistor, and determining the first correction voltage in accordance with the current is included.

(4) Alternatively, one embodiment of the present invention is a semiconductor device with any one of the structures (1) to (3), including a first circuit, a second circuit, and a reading circuit. The first circuit is electrically connected to the first node of the first current supply circuit. The second circuit is electrically connected to the first node of the second current supply circuit. The reading circuit is electrically connected to the first node of the second current supply circuit. The first circuit has a function of drawing a first current or a second current from the first node of the first current supply circuit. The second circuit has a function of drawing a third current or a fourth current from the first node of the second current supply circuit. The second transistor of the first current supply circuit has a function of flowing a fifth current corresponding to a gate-source voltage of the second transistor of the first current supply circuit when the first current is drawn from the first node of the first current supply circuit. The first transistor of the first current supply circuit has a function of flowing a first differential current between the fifth current and the first current when the first current is drawn from the first node of the first current supply circuit, and a function of flowing a second differential current between the fifth current and the second current when the second current is drawn from the first node of the first current supply circuit. The first transistor of the second current supply circuit has a function of flowing the first differential current when the first current is drawn from the first node of the first current supply circuit, and a function of flowing the second differential current when the second current is drawn from the first node of the first current supply circuit. The second transistor of the second current supply circuit has a function of flowing a sixth current corresponding to a gate-source voltage of the second transistor of the second current supply circuit when the third current and the first differential current are drawn from the first node of the second current supply circuit. The reading circuit has a function of drawing a seventh current obtained by subtracting a sum of the second differential current and the fourth current from the sixth current when the first current drawn from the first node of the first current supply circuit is varied to the second current and the third current drawn from the first node of the second current supply circuit is varied to the fourth current.

(5) Alternatively, one embodiment of the present invention is a semiconductor device with the above structure (4), in which the second circuit has the same configuration as the first circuit. The first circuit includes a seventh transistor, an eighth transistor, and a third capacitor. A gate of the seventh transistor is electrically connected to a first terminal of the eighth transistor and a first terminal of the third capacitor. A first terminal of the seventh transistor of the first circuit is electrically connected to the first node of the first current supply circuit. A first terminal of the seventh transistor of the second circuit is electrically connected to the first node of the second current supply circuit. The seventh transistor of the first circuit has a function of flowing the first current when a first potential is applied to a gate of the seventh transistor and a second potential is applied to a second terminal of the third capacitor in the first circuit, and a function of flowing the second current when the first potential is applied to the gate of the seventh transistor of the first circuit and a third potential is applied to the second terminal of the third capacitor in the first circuit. The seventh transistor of the second circuit has a function of flowing the third current when a fourth potential is applied to a gate of the seventh transistor and the second potential is applied to a second terminal of the third capacitor in the second circuit, and a function of flowing the fourth current when the fourth potential is applied to the gate of the seventh transistor and the third potential is applied to the second terminal of the third capacitor in the second circuit. A difference between the first potential and the fourth potential is a potential difference corresponding to the first data. A difference between the second potential and the third potential is a potential difference corresponding to the second data. The seventh current is a current corresponding to a product of the first data and the second data.

(6) Alternatively, one embodiment of the present invention is a semiconductor device with the above structure (5), in which the first circuit includes a ninth transistor and a fourth capacitor. The seventh transistor includes a back gate. The back gate of the seventh transistor is electrically connected to a first terminal of the ninth transistor and a first terminal of the fourth capacitor. A second terminal of the fourth capacitor is electrically connected to a second terminal of the seventh transistor. The first circuit has a function of writing a second correction voltage from a second terminal of the ninth transistor to the back gate of the seventh transistor to vary a threshold voltage of the seventh transistor when the ninth transistor is in an on state, and a function of retaining a voltage between the second terminal and the back gate of the seventh transistor by the fourth capacitor when the ninth transistor is in an off state.

(7) Alternatively, one embodiment of the present invention is a semiconductor device with any one of the structures (1) to (6), in which the first current supply circuit includes a fifth capacitor and a first terminal of the fifth capacitor is electrically connected to the gate of the second transistor.

(8) Alternatively, one embodiment of the present invention is a semiconductor device with any one of the structures (1) to (6), in which the first circuit includes a tenth transistor. A source and a drain of the tenth transistor are electrically connected to each other. One of the gate and the source is electrically connected to a gate of the second transistor. The channel width of the tenth transistor is less than or equal to 0.5 times the channel width of the fourth transistor.

(9) Alternatively, one embodiment of the present invention is a semiconductor device in which all the transistors included in the semiconductor device with any one of the above structures (1) to (8) include a metal oxide in a channel formation region and have the same polarity.

In this specification, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a semiconductor wafer or a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than a connection relation shown in drawings or text is regarded as being disclosed in the drawings or the text. Each of X and Y denotes an object (e.g., a device, an element, a circuit, a wiring, an electrode, a terminal, a conductive film, or a layer).

A transistor includes three terminals called a gate, a source, and a drain. The gate functions as a control terminal controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be used interchangeably in this specification and the like. In addition, in this specification and the like, the two terminals other than the gate may be referred to as a first terminal and a second terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

A voltage refers to a potential difference between a given potential and a reference potential (e.g., a ground potential (GND) or a source potential) in many cases. Thus, a voltage can be replaced with a potential. Note that a potential is relative. Thus, the expression "GND" does not necessarily mean 0 V.

In this specification, ordinal numbers such as "first", "second", and "third" may be used to show the order. Alternatively, ordinal numbers may be used to avoid confusion among components. In these cases, the ordinal numbers do not limit the number or order of the components of one embodiment of the invention. For example, it is possible to replace the term "first" with the term "second" or "third" in describing one embodiment of the present invention.

In this specification, terms for describing arrangement, such as "over" and "under", are sometimes used for convenience to describe the positional relation between components with reference to drawings. The positional relation between components is changed as appropriate in accordance with a direction in which the components are described. Thus, terms for the description are not limited to those used in this specification, and the description can be rephrased appropriately depending on the situation.

In this specification and the like, the terms "film" and "layer" can be interchanged with each other depending on the case or circumstances. For example, the term "conductive layer" can be changed to the term "conductive film" in some cases. For example, the term "insulating film" can be changed to the term "insulating layer" in some cases.

In the drawings, the size, the layer thickness, or the region is exaggerated for clarity in some cases. Therefore, they are not limited to the illustrated scale. The drawings are schematic views showing ideal examples, and shapes or values are not limited to those shown in the drawings.

For example, variation in signal, voltage, or current due to noise or variation in signal, voltage, or current due to difference in timing can be included.

Effect of the Invention

One embodiment of the present invention can provide a semiconductor device that is a single-polarity circuit. Another embodiment of the present invention can provide a semiconductor device capable of arithmetic processing. Another embodiment of the present invention can provide a semiconductor device in which the accuracy of arithmetic operation is increased by correction of the threshold voltage of a transistor. Another embodiment of the present invention can provide a semiconductor device that is less affected by environmental temperature.

Note that the effects of one embodiment of the present invention are not limited to the effects listed above. The effects listed above do not preclude the existence of other effects. The other effects are effects that are not described in this section and will be described below. The other effects that are not described in this section will be derived from the descriptions of the specification, the drawings, and the like by those skilled in the art and can be extracted as appropriate from these descriptions. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 12 is a circuit diagram showing a configuration structure of a circuit included in a semiconductor device.

FIG. 26(A) is a top view showing a structure example of a transistor, and FIGS. 26(B) and 26(C) are cross-sectional views showing the structure example of the transistor.

MODE FOR CARRYING OUT THE INVENTION

Figure 1:
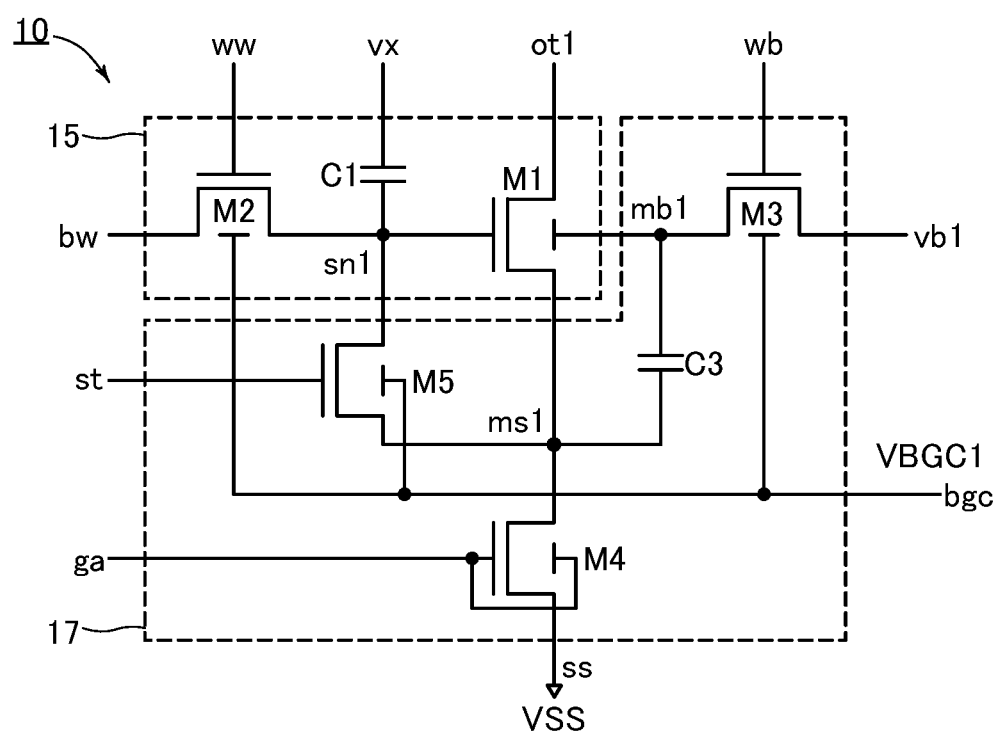
FIG. 1 is a circuit diagram showing a configuration structure of a circuit included in a semiconductor device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

A plurality of embodiments described below can be combined as appropriate. In addition, in the case where a plurality of structure examples (including a manufacturing method example, an operation method example, a usage example, and the like) are given in one embodiment, the structure examples can also be combined as appropriate, and any of the structure examples can also be combined with one or more structure examples described in the other embodiments.

The same components, components having similar functions, components made of the same material, components formed at the same time, and the like in the drawings are denoted by the same reference numerals, and repetitive description thereof is skipped in some cases.

Moreover, when a plurality of components are denoted by the same reference numerals, and, in particular, need to be distinguished from each other, an identification sign such as "_1", "[n]", or "[m,n]" is sometimes added to the reference numerals.

In this specification, a power supply potential VDD may be abbreviated to a potential VDD, VDD, or the like, for example. The same applies to other components (e.g., a signal, a voltage, a circuit, an element, an electrode, a wiring, and the like).

Embodiment 1

In this embodiment, a single-polarity circuit having a data memory function included in a semiconductor device is described.

A circuit 10 illustrated in FIG. 1 includes a circuit 15, a circuit 17, and nodes ss, bgc, bw, ww, vx, ot1, wb, vb1, ga, and st. The node ss is electrically connected to a voltage line for supply of a voltage VSS, and the node bgc is electrically connected to a voltage line for supply of a voltage VBGC1. The voltage VSS is a low power supply voltage of the circuit 10, and can be a low level ("L") voltage applied to the nodes ww, wb, and the like. Note that a high power supply voltage of the circuit 10 is a voltage VDD, and can be a high level ("H") voltage applied to the nodes ww, wb, and the like.

The circuit 15 includes transistors M1 and M2 and a capacitor C1. The circuit 17 includes transistors M3 to M5 and a capacitor C3. The transistors M1 to M5 are OS transistors including back gates. The voltage VBGC1 is input to the back gates of the transistors M2, M3, and M5 through the node bgc. The voltage VBGC1 enables the threshold voltages (Vth) of the transistors M2, M3, and M5 to be adjusted. The on state and off state of the transistors M2 to M5 can be switched by the voltages of the nodes ww, wb, ga, and st.

The circuit 15 has the same circuit configuration as that of a 2T (2-transistor) gain cell. In this specification, a storage node of the circuit 15 is referred to as a node sn1. In other words, a gate of the transistor M1 corresponds to the node sn1. The transistor M1 is a reading transistor in the 2T gain cell. The node ot1 is an output node. Here, nodes corresponding to the back gate and a source of the transistor M1 are referred to as nodes mb1 and ms1, respectively.

The capacitor C1 is a storage capacitor for retaining a voltage of the node sn1. The node sn1 is capacitively coupled to the node vx by the capacitor C1. The transistor M2 is an access transistor (also referred to as a writing transistor) in the 2T gain cell and has a function of making conductivity or non-conductivity between the node sn1 and the node bw.

The circuit 15 can function as a memory circuit. When data is written, the node vx is set to "L" and a voltage corresponding to the data is input to the node bw, for example. The transistor M2 is then turned on, whereby the voltage of the node bw is input to the node sn1. When data is read, the node vx is set to "H" and the node ms1 is set to a constant potential, for example, VSS. Thus, a drain current depending on the voltage of the node sn1 flows to the transistor M1; since the voltage of the node ot1 changes depending on the drain current of the transistor M1, sensing the voltage of the node ot1 enables the data to be read.

The circuit 15 can be used as a multiplier circuit by utilizing Vds-Id characteristics of the transistor M1. Note that Vds is a voltage between a drain and a source and Id is a drain current.

An arithmetic function of the circuit 15 is described taking an example of the multiplication of w by d. Data corresponding to a multiplier and data corresponding to a multiplicand are input to the circuit 15 as voltages. The voltages corresponding to w and d are referred to as a voltage w and a voltage d for convenience. Note that the voltage VSS is 0 V for simple description of the arithmetic function of the circuit 15.

First, the voltage w is input to the circuit 15. Specifically, the voltage VSS is input to the node vx, and the voltage w is input to the node bw. Next, the node ww is set to "H" to turn on the transistor M2. Accordingly, the voltage w is input to the node sn1. Next, the voltage d is input to the node vx in a state where the node ww is set to "L." Since the node vx and the node sn1 are capacitively coupled, the voltage of the node sn1 becomes $w+A_{sn}d$. Here, $A_{sn}$ is a capacitive coupling coefficient between the node sn1 and the node vx and depends on gate capacitance of the transistor M1, parasitic capacitance of the node sn1, and the like.

[Formula 1]

$$Id = \tfrac{1}{2}\beta(Vgs-Vth)^2 \quad (1.1)$$

In the case where a transistor operates in a saturation region, the drain current Id is expressed by the above formula (1.1) according to the gradual channel approximation model. Note that β is a constant determined by the carrier mobility, channel length, channel width, and gate capacitance in a semiconductor. Vgs is a voltage between the gate and the source and Vth is the threshold voltage.

Note that in this specification and the like, on a Vgs–$Id^{1/2}$ characteristic curve plotted based on the voltage Vgs represented by the horizontal axis and the square root of the drain current Id represented by the vertical axis, the threshold voltage Vth refers to the voltage Vgs at the intersection of the tangent to the highest inclination of the characteristic curve and $Id^{1/2}=0$ [A]. Alternatively, when the ratio between the channel length/channel width of a transistor is L/W, the threshold voltage Vth refers to the voltage Vgs when Id×L/W is $1\times10^{-12}$ [A] in some cases. Note that L and W represent the channel length and the channel width of a transistor, respectively.

For convenience, the voltage between the back gate and the source (Vbgs) of the transistor M1 is fixed to Vc, and the threshold voltage of the transistor M1 is regarded as $V_{T1}$. In the case where the transistor M1 operates in a saturation region and the voltage Vgs is $w+A_{sn}d$, a drain current Id1 (w, d) of the transistor M1 is represented by the following formula (2.1).

[Formula 2]

$$Id1(w, d) = \tfrac{1}{2}\beta(w+A_{sn}d-V_{T1})^2 \quad (2.1)$$

The drain current Id1 (w, d) is expressed as the sum of a current Ipr(w, d) that is proportional to the product w·d and a current Iost(w, d) that is not proportional to its product, as shown in the following formulae (2.2) to (2.4).

[Formula 3]

$$Id1(w, d) = Ipr(w, d) + Iost(w, d) \quad (2.2)$$

$$Ipr(w, d) = A_{sn}\beta wd \quad (2.3)$$

$$Iost(w, d) = \frac{1}{2}\beta(w^2 + A_{sn}^2 d^2 - 2wV_{T1} - 2A_{sn}dV_{T1} + V_{T1}^2) \quad (2.4)$$

$$= \frac{1}{2}\beta(w - V_{T1})^2 + \frac{1}{2}\beta(A_{sn}d - V_{T1})^2 - \frac{1}{2}\beta V_{T1}^2$$

In the formula (2.4), the first term of the right side is the drain current Id1 when the voltage d is 0 V; the second term of the right side is the drain current Id1 when the voltage w is 0 V. Thus, the current Iost(w, d) is expressed by a formula (2.5).

[Formula 4]

$$Iost(w, d) = Id1(w, 0) + Id1(0, d) - \frac{1}{2}\beta V_{T1}^2 \quad (2.5)$$

When the current Iost(w, d) is removed from the drain current Id1(w, d), whereby the current Ipr(w, d) can be acquired. In this specification and the like, the current Iost(w, d) is referred to as an "offset current." The operation for removing the offset current from the current Id1(w, d) is referred to as an "offset cancellation."

For example, currents $I_1$ to $I_4$ are defined as shown in formulae (2.6) to (2.9). Then, a formula (2.10) is executed, whereby the current Ipr(w, d) can be obtained.

[Formula 5]

$$I_1 = Id1(w_0 + w, d_0 + d) \quad (2.6)$$

$$I_2 = Id1(w_0, d_0 + d) \quad (2.7)$$

$$I_3 = Id1(w_0 + w, d_0) \quad (2.8)$$

$$I_4 = Id1(w_0, d_0) \quad (2.9)$$

$$I_1 - I_3 + I_4 - I_2 \quad (2.10)$$

The calculation process of the formula (2.10) is described below. Note that hardware for executing the formula (2.10) will be described in Embodiment 2 to Embodiment 5.

[Formula 6]

$$I_1 - I_3 + I_4 - I_2 = Ipr(w_0 + w, d_0 + d) - \quad (2.11)$$
$$Ipr(w_0 + w, d_0) + Ipr(w_0, d_0) -$$
$$Ipr(w_0, d_0 + d)$$
$$= Ipr(w, d)$$

The circuit 15 can be an analog arithmetic circuit that utilizes the Vds-Id characteristics of the transistor M1. In the case of arithmetic operation using a plurality of circuits 15, the threshold voltages $V_{T1}$ of the circuits 15 might vary, thereby reducing the accuracy of the arithmetic operation in some cases. For this reason, the threshold voltage $V_{T1}$ is corrected by the circuit 17. For the correction of the threshold voltage of the transistor M1, the capacitor C3 is charged with the drain current Id1, whereby the Vbgs of the transistor M1 is adjusted. Thus, the circuit 17 is referred to as a "circuit programmed by current."

Figure 2A:
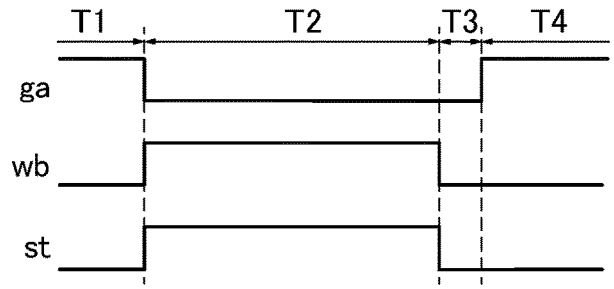
FIG. 2(A) is a timing chart illustrating an operation example of a circuit included in a semiconductor device.

FIG. 2(A) is a timing chart of the threshold voltage correction. FIG. 2(B) to FIG. 2(D), FIG. 3(A), and FIG. 3(B) are circuit diagrams showing operation examples of the circuit 10 in a period T1 to a period T4 in the timing chart, and the transistors M3 to M5 are illustrated as switches in these diagrams. Note that for easy understanding of operation of the circuit 10, leakage currents of the transistors M1 to M5, the capacitors C1 and C3, and the like are ignored in the following description.

While the threshold voltage is being corrected, for example, the transistor M2 is in an off state, and the voltages of the nodes vx and ot1 are set to VSS and V1, respectively.

Figure 2B:
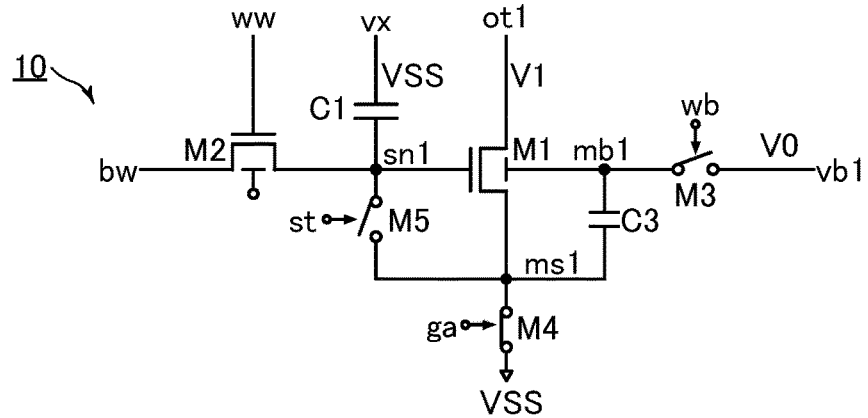
FIGS. 2(B), 2(C), and 2(D) are circuit diagrams illustrating the operation example of a circuit included in a semiconductor device.
Figure 2C:
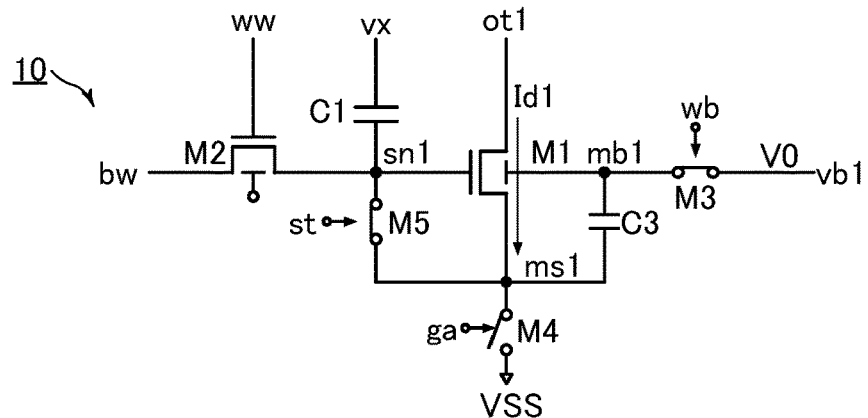

In the period T1, the potentials of the nodes ga, wb, and st are "H," "L," and "L," respectively. As illustrated in FIG. 2(B), the transistor M4 is on and the voltage VSS is input to the node ms1. Furthermore, a voltage V0 is input to the node vb1. In the period T2, the nodes ga, wb, and st are set to "L," "H," and "H," respectively. As illustrated in FIG. 2(C), the transistor M4 is turned off and the transistors M3 and M5 are turned on. A conduction state between the node vb1 and the node mb1 is made, so that the voltage V0 is input to the node mb1. In addition, a conduction state between the node sn1 and the node ms1 is made, so that the voltage Vgs of the transistor M1 becomes 0 V. Note that the voltage V0 is set such that the threshold voltage $V_{T1}$ is made lower than 0 V, and the voltage V1 is set such that the drain current Id1 flows.

Figure 2D:
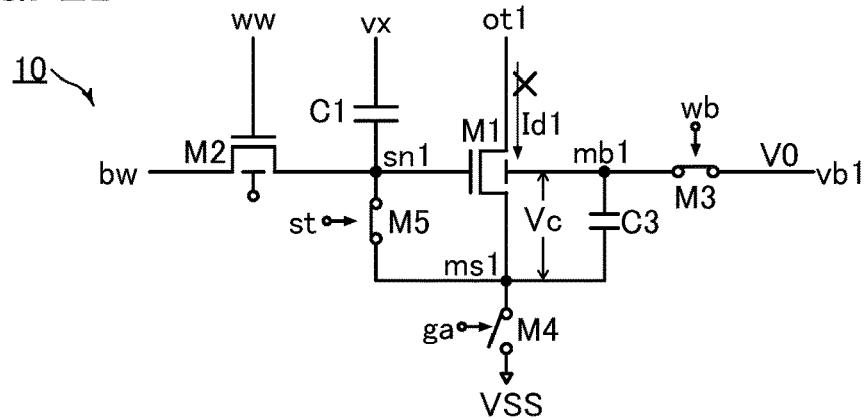

At this time, the drain current Id1 is input to the node ms1, so that the voltage of the node ms1 increases. Since the transistor M3 is on, the voltage of the node mb1 is not changed by capacitive coupling of the capacitor C3 in accordance with the increase in the voltage of the node ms1. However, the voltage Vbgs of the transistor M1 decreases and the threshold voltage $V_{T1}$ increases accordingly. Then, when the threshold voltage $V_{T1}$ becomes equal to the voltage Vgs of the transistor M1, the drain current Id1 stops flowing as illustrated in FIG. 2(D). At this time, Vc, which denotes the voltage difference between the node mb1 and the node ms1, is referred to as the voltage Vbgs for setting the threshold voltage $V_{T1}$ to 0 V. Through the above operation, programming of the voltage Vbgs into the circuit 17 is completed.

Figure 3A:
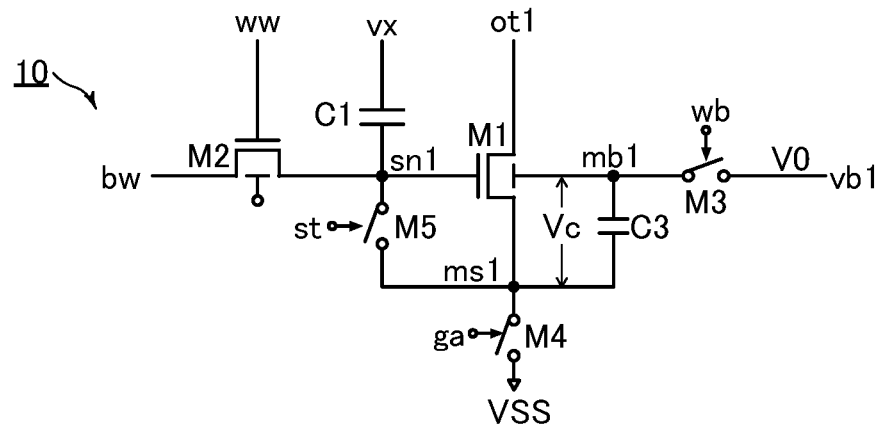
FIGS. 3(A), (B), and 3(C) are circuit diagrams illustrating an operation example of a circuit included in a semiconductor device.
Figure 3B:
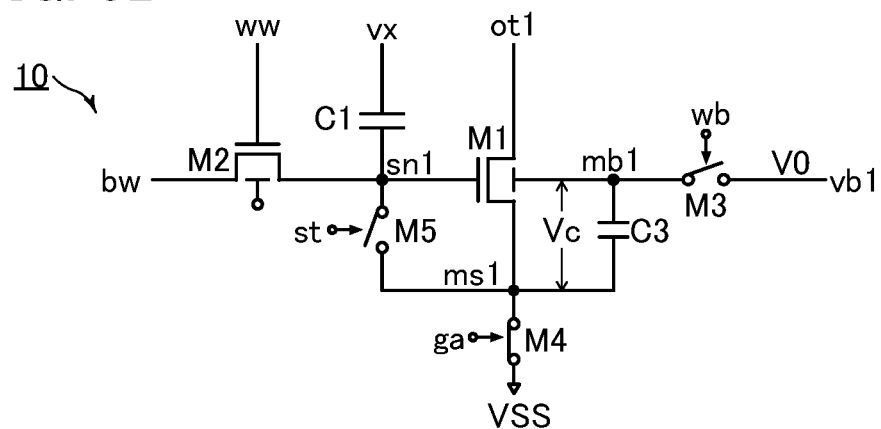
Figure 3C:
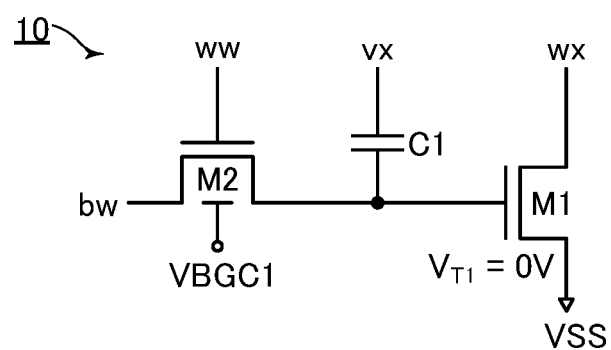

Then, in the period T3, the node wb is set to "L" and the node st is set to "L," whereby the transistor M3 is turned off and the transistor M5 is turned off (see FIG. 3(A)). Note that the node wb and the node st are each set to "L" at the same time in the timing chart of FIG. 2(A) but may be set to "L" at different timings. Next, in the period T4, the node ga is set to "H" to turn on the transistor M4 (see FIG. 3(B)). By the correction of the threshold voltage $V_{T1}$, the circuit 10 can be equivalent to the circuit including the transistor M1 whose threshold voltage $V_{T1}$ is 0 V, the transistor M2, and the capacitor Cl illustrated in FIG. 3(C).

A change in the voltage of the node mb1 due to leakage of charge retained in the capacitor C3 may cause a fluctuation in threshold voltage $V_{T1}$. Hence, preferably, the threshold voltages of the transistors M3 and M5 are increased by the voltage VBGC1 to reduce the off-state currents of the transistors M3 and M5, for example.

As described above, the threshold voltage $V_{T1}$ can be set to 0 V. Since characteristics of transistors are changed depending on, for example, operating temperature or the like, a variation in arithmetic results due to the change in operating temperature can be reduced with the configuration of the circuit 10 illustrated in FIG. 1. A variation in the arithmetic results in a plurality of circuits 10 can also be reduced.

Figure 4A:
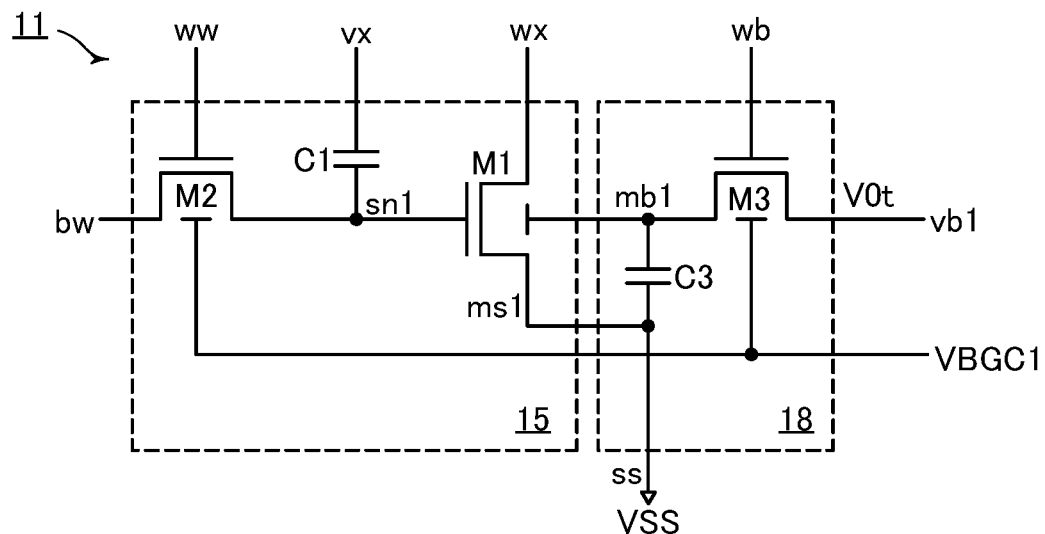
FIG. 4(A) is a circuit diagram illustrating an operation example of a circuit included in a semiconductor device.

A circuit 11 illustrated in FIG. 4(A) includes the circuit 15 and a circuit 18. The circuit 18 is a circuit from which the transistors M4 and M5 are excluded from the circuit 17 illustrated in FIG. 1, and functions as a 1T1C memory cell. In the circuit 11, the circuit 18 stores the voltage Vbgs of the transistor M1. A node wx of the circuit 11 illustrated in FIG. 4(A) corresponds to the node otl of the circuit 10 illustrated in FIG. 1.

In the circuit 10, the voltage Vbgs of the transistor M1 is acquired by the internal circuit 17 to set the threshold voltage $V_{T1}$. By contrast, in the circuit 11, the voltage Vbgs of the transistor M1 can be adjusted by a voltage V0t input to the node vb1.

The transistor M3 is turned on, and the voltage V0t is input to the node mb1. After that, the transistor M3 is turned off, so that the voltage Vbgs of the transistor M1 is retained by the capacitor C3. For example, when the threshold voltage $V_{T1}$ is set to 0 V, the voltage V0t satisfying V0t−VSS=Vc is input to the node vb1.

<Semiconductor Device 100>

Figure 4B:
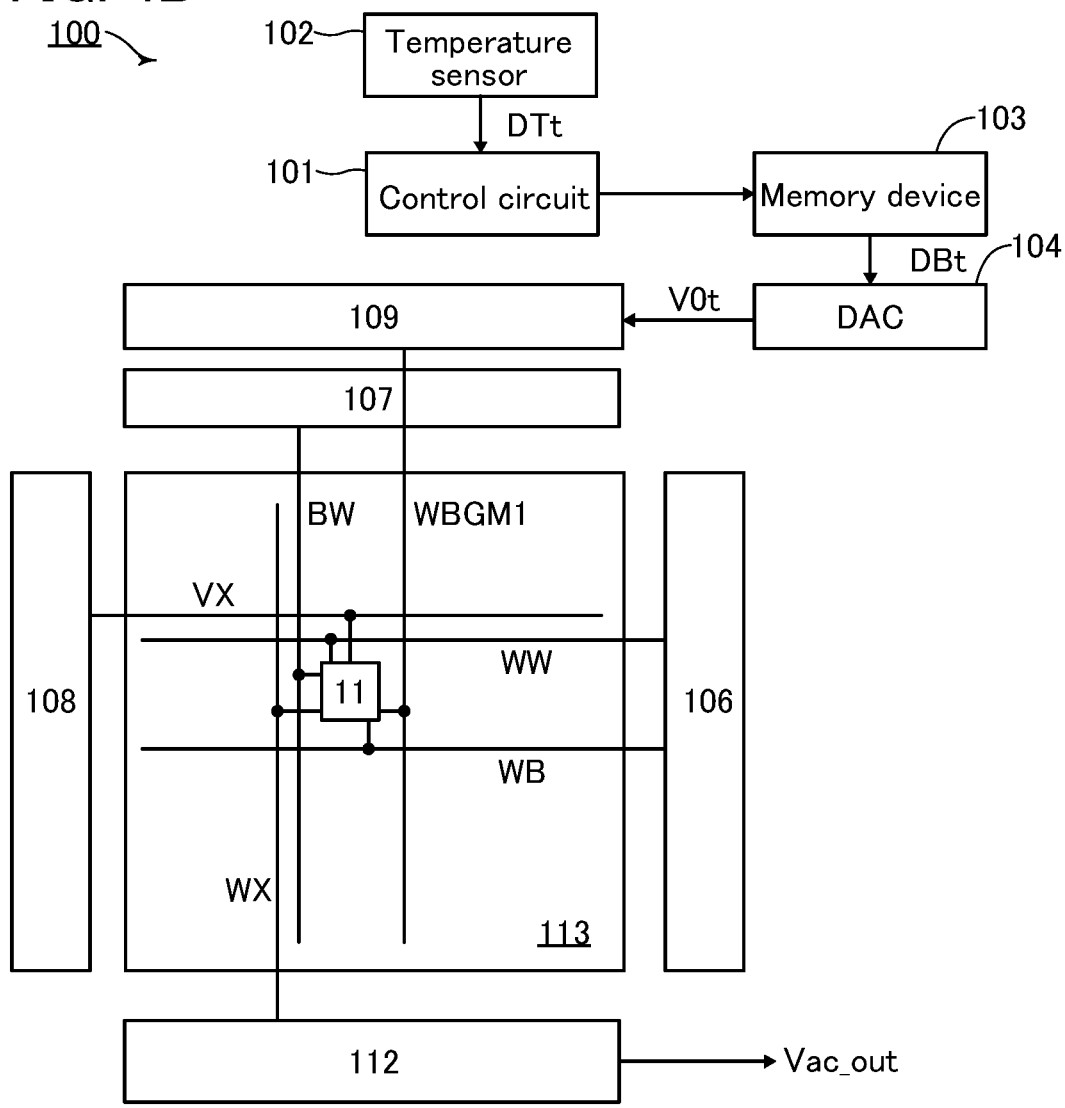
FIG. 4(B) is a block diagram showing a configuration structure of the semiconductor device.

The voltage V0t is preferably changed in accordance with temperature in order to reduce a fluctuation in threshold voltage $V_{T1}$ due to temperature. FIG. 4(B) shows an example of a semiconductor device for performing temperature correction of the threshold voltage $V_{T1}$. The semiconductor device 100 illustrated in FIG. 4(B) includes a control circuit 101, a temperature sensor 102, a memory device 103, a DAC (digital analog converter circuit) 104, driver circuits 106 to 109, a reading circuit 112, and an arithmetic array 113.

A plurality of circuits 11 are provided in a matrix in the arithmetic array 113. In the arithmetic array 113, wirings WW, WB, BW, VX, WX, and WBGM1 are provided in accordance with arrangement of the plurality of circuits 11. Note that the wirings WW, WB, BW, VX, WX, and WBGM1 are electrically connected to nodes ww, wb, bw, vx, wx, and vb1, respectively in the circuits 11. Furthermore, a circuit for removing an offset current from the output current of the circuit 11 is provided in the arithmetic array 113.

The driver circuits 106 to 109 each have a function of supplying a predetermined signal (or voltage) to the wirings WW, WB, BW, VX, and WBGM1. The reading circuit 112 is a circuit for reading arithmetic results of the circuits 11. For example, the reading circuit 112 generates a voltage Vac out corresponding to a current flowing to the wiring WX.

The memory device 103 stores the data DBt corresponding to the voltage V0t. The range of the operation temperature of the semiconductor device 100 is divided into a plurality of ranges. The data DBt is determined for each divided temperature range and contained in the memory device 103.

The control circuit 101 controls the whole semiconductor device 100. For example, the control circuit 101 performs control for the correction of the threshold voltage $V_{T1}$ in accordance with the data DTt acquired by the temperature sensor 102. Note that the data DTt represents temperature. The control circuit 101 generates a control signal of the memory device 103 in accordance with the data DTt. The memory device 103 outputs data DBt corresponding to the data DTt in response to the control signal. The DAC 104 converts the data DBt into analog data and generates the voltage V0t. The voltage V0t is analog data corresponding to the data DTt and is a voltage dependent on temperature.

The voltage V0t is output to the driver circuit 109. The control circuit 101 generates timing signals for the driver circuits 106 and 109. The drive circuits 106 and 109 operate in accordance with the timing signals and the voltage V0t is input to the node mb1 of the circuit 11.

The data DBt can be obtained for each circuit 11. For example, at a reference temperature Tref, a voltage whose arithmetic result is known is input to the node sn1 of one circuit 11. Next, a voltage that is so sufficiently low that the drain current Id1 does not leak to the wiring WX is input to the nodes sn1 of the other circuits 11. The data DBt at the time of the reference temperature Tref can be determined based on the voltage Vac_out read by the reading circuit 112. The data DBt can be determined for each temperature range on the basis of the data DBt at the time of the reference temperature Tref. When the data DBt for each temperature range is stored in the memory device 103, the temperature dependence of the arithmetic result of the circuit 11 due to change in operating temperature can be reduced, whereby the variation in the arithmetic results between the plurality of circuits 11 can be reduced.

Note that this embodiment can be combined with other embodiments in this specification as appropriate.

Embodiment 2

In this embodiment, a current supply circuit included in a semiconductor device, which is formed of a single-polarity circuit, is described.

<Current Supply Circuit 30>

Figure 5A:
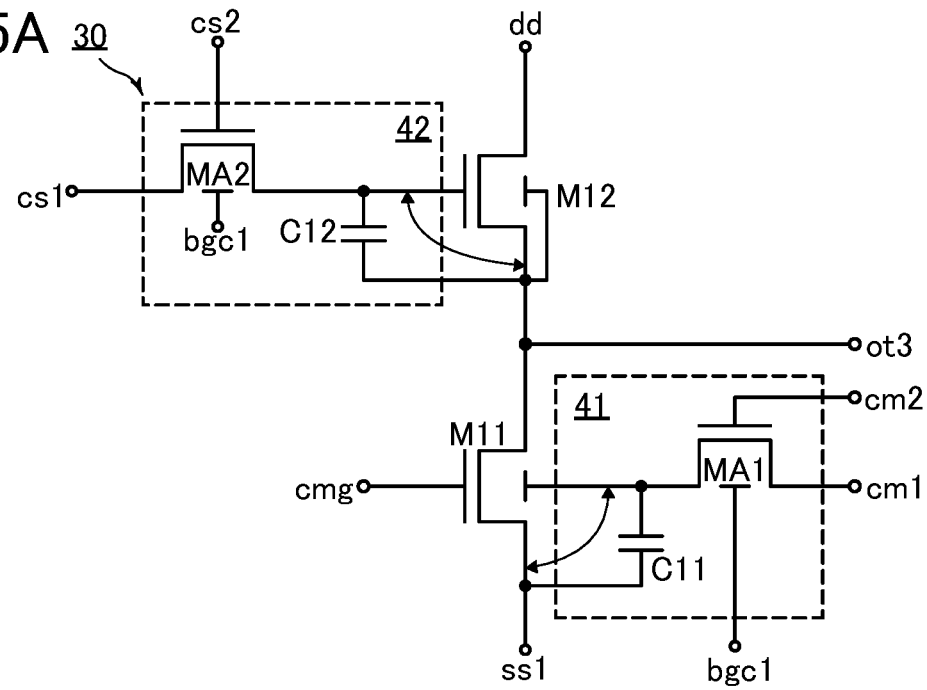
FIG. 5(A) is a circuit diagram illustrating an operation example of a circuit included in a semiconductor device.

A current supply circuit 30 illustrated in FIG. 5(A) is a single-polarity circuit and includes transistors M11, M12, MA1, and MA2, capacitors C11 and C12, and nodes bgc1, cmg, ot3, cm1, cm2, cs1, cs2, dd, and ss1. The transistors M11, M12, MA1, and MA2 are OS transistors including back gates. The back gates of the transistors MA1 and MA2 are electrically connected to the node bgc1.

The transistor M11 functions as part of a current mirror circuit described later. A gate, a source, and a drain of the transistor M11 are electrically connected to the nodes cmg, ss1, and ot3, respectively. The node ot3 is an output node of the current supply circuit 30.

A circuit 41 including the capacitor C11 and the transistor MA1 functions as a 1T1C memory cell like the circuit 18 (see FIG. 4(A)) and stores the voltage Vbgs of the transistor M11. The capacitor C11 retains the voltage Vbgs of the transistor M11. The transistor MA1 has a function of making conductivity or non-conductivity between the node cm1 and the back gate of the transistor M11. The conduction state and the non-conduction state of the transistor MA1 can be switched by the voltage of the node cm2. Note that preferably, a back gate voltage of the transistor MA1 is adjusted and the threshold voltage of the transistor MA1 is increased so that a variation in the back gate voltage of the transistor M11 due to leakage of charge retained in the capacitor C11 is reduced.

The transistor M12 functions as a current source. A drain and a source of the transistor M12 are electrically connected to the nodes dd and ot3, respectively. The back gate and the source of the transistor M12 are electrically connected to each other.

A circuit 42 including the capacitor C12 and the transistor MA2 functions as a 1T1C memory cell like the circuit 18 (FIG. 4(A)) and stores the voltage between the gate and the source of the transistor M12. The capacitor C12 retains the voltage Vgs of the transistor M12. The transistor MA2 has a function of making conductivity or non-conductivity between the node cs1 and the gate of the transistor M12. The conduction state and the non-conduction state of the transistor MA2 can be switched by the voltage of the node cs2.

Note that preferably, a back gate voltage of the transistor MA2 is adjusted and the threshold voltage of the transistor MA2 is increased so that a variation in the back gate voltage of the transistor M12 due to leakage of charge retained in the capacitor C12 is reduced.

Figure 5B:
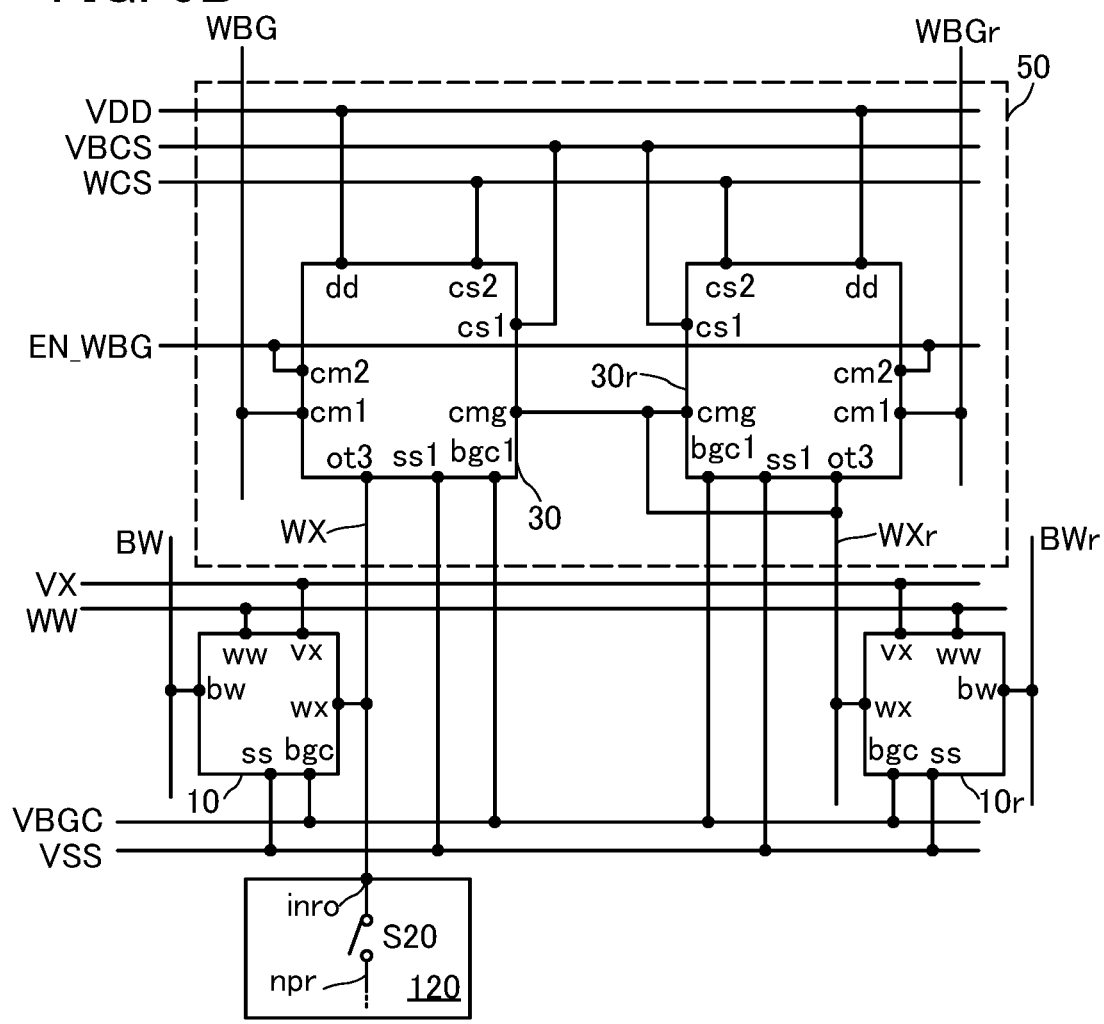
FIG. 5(B) is a block diagram showing a configuration structure of a circuit included in the semiconductor device.

When two current supply circuits 30 are electrically connected as illustrated in FIG. 5(B), an offset cancellation circuit 50 can be formed. The offset cancellation circuit 50 is used to cancel the offset current from an output current of the multiplier circuit in Embodiment 1. For a distinction between the two current supply circuits 30, one of them is referred to as a current supply circuit 30r.

The offset cancellation circuit 50 is electrically connected to wirings WCS, EN_WBG, WBG, and WBGr and voltage lines for supply of the voltages VDD, VSS, VBCS, and VBGC. The circuits 10 and 10r are electrically connected to the wirings WX and WXr, respectively. The circuit 10r is a replica circuit of the circuit 10 and functions as a reference multiplier circuit. The circuits 10 and 10r are electrically connected to the wirings VX and WW and voltage lines for supply of the voltages VSS and VBGC. The circuits 10 and 10r are electrically connected to the wirings BW and BWr, respectively.

Specifically, the wiring WCS is electrically connected to the node cs2 of each of the current supply circuits 30 and 30r, and the wiring EN_WBG is electrically connected to the node cm2 of each of the current supply circuits 30 and 30r. The wiring WBG is electrically connected to the node cm1 of the current supply circuit 30, and the wiring WBGr is electrically connected to the node cm1 of the current supply circuit 30r. A voltage line for supply of the voltage VDD is electrically connected to the node dd of each of the current supply circuits 30 and 30r. A voltage line for supply of the voltage VSS is electrically connected to the node ss1 of each of the current supply circuits 30 and 30r and the node ss of each of the current supply circuits 10 and 10r. A voltage line for supply of the voltage VBCS is electrically connected to the node cs1 of each of the current supply circuits 30 and 30r. A voltage line for supply of the voltage VBGC is electrically connected to the node bgc1 of each of the current supply circuits 30 and 30r and the node bgc of each of the current supply circuits 10 and 10r. The wiring WX is electrically connected to the node ot3 of the current supply circuit 30 and the node wx of the circuit 10, and the wiring WXr is electrically connected to the node ot3 of the current supply circuit 30r, the node wx of the circuit 10r, and the node cmg of each of the current supply circuits 30 and 30r. The wiring BW is electrically connected to the node bw of the current supply circuit 10, and the wiring BWr is electrically connected to the node bw of the circuit 10r.

As illustrated in FIG. 5(B), the reading circuit 120 is electrically connected to the wiring WX. The reading circuit 120 includes nodes inro and npr and a switch S20. The node inro is an input node. The switch S20 has a function of making a conduction state or a non-conduction state between the node inro and the node npr. The reading circuit 120 may have a function as a current voltage converter circuit that generates a voltage corresponding to a current flowing to the node npr.

In the case where components (such as transistors or wirings) related to the current supply circuits 30 and 30r are identified, "r" is added to the reference numerals of the components related to the current supply circuit 30r. The same applies to components related to the circuits 10 and 10r. Note that instead of the circuits 10 and 10r, the circuit 11 and a replica circuit of the circuit 11 may be provided.

Figure 6:
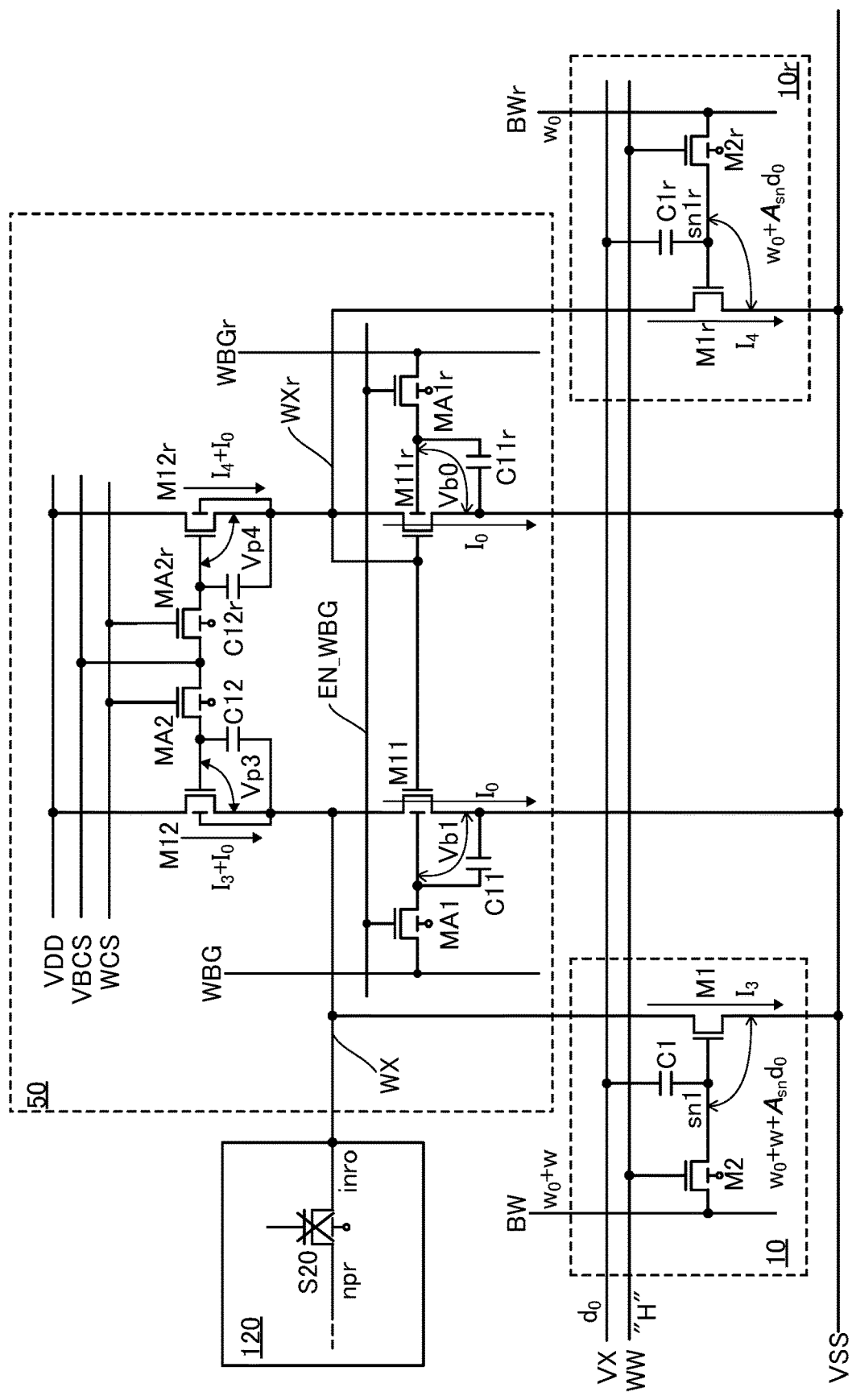
FIG. 6 is a circuit diagram showing a configuration structure of a circuit included in a semiconductor device.
Figure 7:
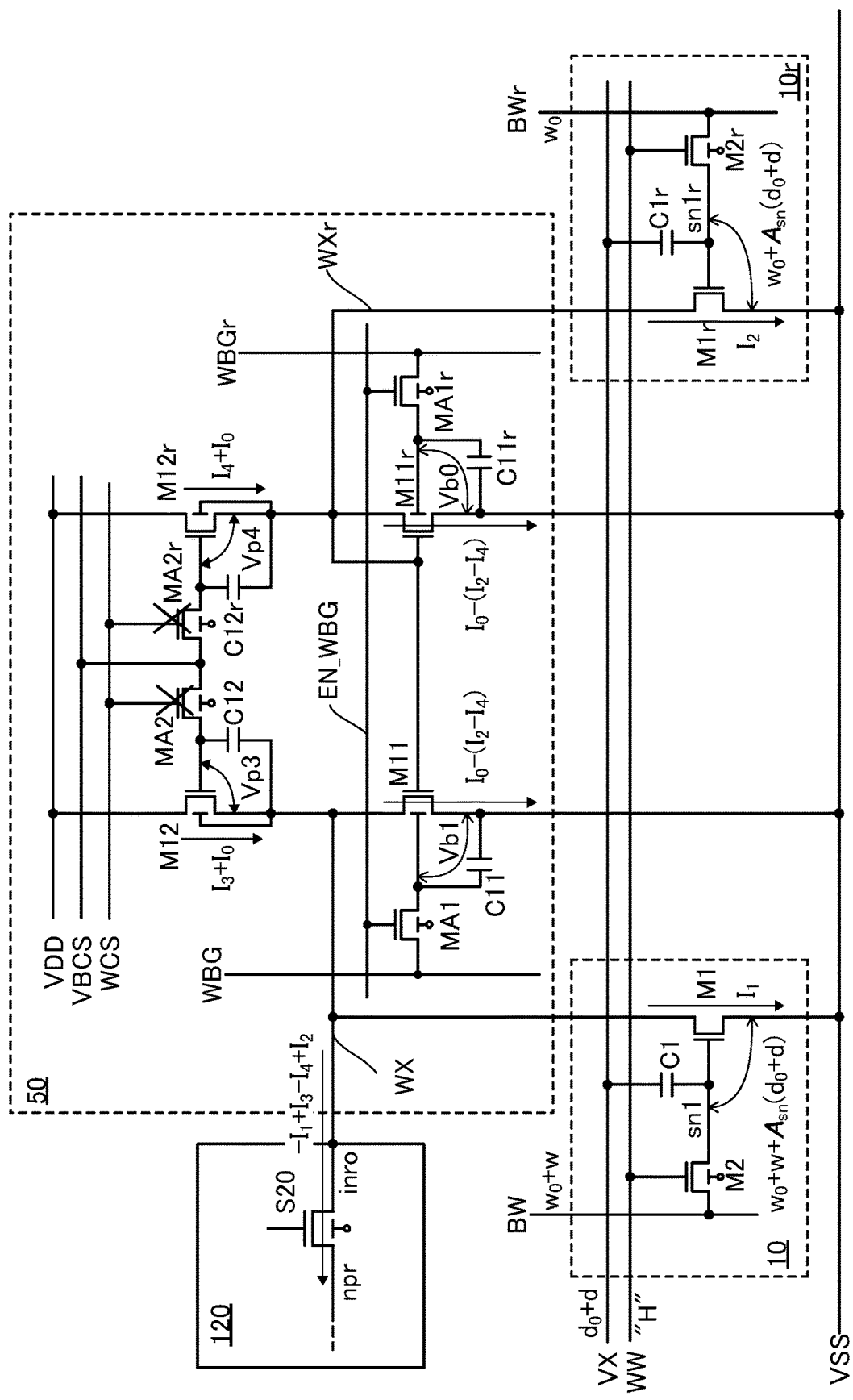
FIG. 7 is a circuit diagram showing a configuration structure of a circuit included in a semiconductor device.

With reference to FIG. 6 and FIG. 7, an offset cancellation operation is described taking an example of the case where multiplication of data w by data d is performed. States of the offset cancellation circuit 50 and the circuits 10 and 10r are transferred from the "initialization state" to the "state of writing the data d," whereby the offset current is canceled from the output current of the circuit 10, and a current Ipr(w, d) proportional to the product w.d can be acquired. FIG. 6 is a circuit diagram for illustrating the initialization state and FIG. 7 is a circuit diagram illustrating the state of writing the data d.

FIG. 6 and FIG. 7 show an example in which the switch S20 is formed of an OS transistor including a back gate. In the following description, the voltage VSS is 0 V for convenience.

<<Threshold Voltage Correction>>

Before the multiplication is performed in the circuit 10, the threshold voltages of the transistors M1, M1r, M11, and M11r are corrected.

As described in Embodiment 1, the threshold voltages of the transistors M1 and M1r are set to 0 V. Thus, the circuits 10 and 10r are represented by the equivalent circuit diagram of FIG. 3(C). Note that when the threshold voltages of the transistors M1 and M1r are corrected, the wiring WCS is set to "H" and the drain current is made to flow to each of the transistors M12 and M12r.

The transistors M11 and M11r constitute a current mirror circuit in the offset cancellation circuit 50. Since the transistor M1 1r is a replica transistor of the transistor M11, the drain current of the transistor M11r is ideally copied to the transistor M11. However, because of an influence of a manufacturing process or the like, the transistor M11r and the transistor M11 $d_0$ not have the same characteristics in some cases. Thus, before the multiplication is performed in the circuit 10, the voltages Vbgs of the transistors M11r and M11 are adjusted so that the threshold voltages of the transistors M11r and M11 are corrected.

The voltages Vbgs of the transistors M11r and M11 where the threshold voltages of the transistors M11r and M11 become 0 V are referred to as Vb0 and Vb1, respectively. In order that the voltages Vbgs of the transistors M11r and M11 be set to Vb0 and Vb1, respectively, Vb0−VSS and Vb1−VSS are input to the wirings WBGr, and WBG, respectively. Next, the wiring EN_WBG is set to "H" for a certain period to turn on each of the transistors MA1 and MA1r. Accordingly, Vb0−VSS and Vb1−VSS are input to the back gates of the transistors M11r and M11, respectively. Then, the wiring EN_WBG is set to "L" to turn off the transistors MA1 and MA1r, whereby the voltage Vbgs of the transistor M11r is fixed to Vb0 by the capacitor C11r and the voltage Vbgs of the transistor M11 is fixed to Vb1 by the capacitor C11.

<<Initialization Operation>>

An initialization operation is an operation for setting currents supplied from the transistors M12r and M12. The switch S20 is in an off state during the initialization operation.

As shown in FIG. 6, voltages $w_0$ and $w_0+w$ are input to the wirings BWr and BW, respectively. Next, the wiring WW is set to "H" to turn on each of the transistors M2r and M2, whereby the voltages $w_0$ and $w_0+w$ are written to nodes sn1r and sn1, respectively. Furthermore, the voltages $w_0$ and $w_0+w$ are retained in capacitors C1r and C1, respectively. Then, after the wiring WW is set to "L" to turn off each of the transistors M2r and M2, $d_0$ is input to the wiring VX. Thus, the voltages Vgs of the transistors M1r and M1 become $w_0+A_{sn}d_0$ and $w_0+w+A_{sn}d_0$, respectively, whereby currents $I_4$ and $I_3$ flow to the transistors M1r and M1, respectively (see the formulae (2.9) and (2.8)).

The wiring WCS is set to "H" to turn on transistors MA2r and MA2. Note that the voltage VBCS, the channel lengths and the channel widths of the transistors M12 and M12r, and the like are set such that a current $I_4+I_0$ exceeding the current $I_4$ flows to the transistor M12r, a current $I_3+I_0$ exceeding the current $I_3$ flows to the transistor M12, and the transistors M12 and M12r operate in a saturation region. The voltage Vgs when the drain current of the transistor M12r is $I_4+I_0$ is denoted by Vp4, and the voltage Vgs when the drain current of the transistor M12 is $I_3+I_0$ is denoted by Vp3.

Since the current $I_4+I_0$ flows to the transistor M12r, a current Io flows to the transistor M11r. Since the transistors M11r and M11 constitute the current mirror circuit, the current $I_0$ also flows to the transistor M11.

Next, the wiring WCS is set to "L." By the above-described operation, the offset cancellation circuit 50 is brought into an initialization state. In the initialization state, the voltage Vgs of the transistor M12r is fixed to the voltage Vp4 by the capacitor C12r and the voltage Vgs of the transistor M12 is fixed to the voltage Vp3 by the capacitor C12. Consequently, the current supplied by the transistor M12r is set to $I_4+I_0$ and the current supplied by the transistor M12 is set to $I_3+I_0$.

<<Writing of Data d>>

Next, as illustrated in FIG. 7, a voltage $d_0+d$ is input to the wiring VX. Since the transistors M2r and M2 are off, the voltages Vgs of the transistors M1r and M1 become $w_0+A_{sn}(d_0+d)$ and $w_0+w+A_{sn}(d_0+d)$, respectively. Thus, $I_2$ and $I_1$ flow to the transistors M1r and M1, respectively (see the formulae (2.7) and (2.6)).

Since the voltage Vgs of the transistor M12r is fixed to the voltage Vp4, the current $I_4+I_0$ flows to the transistor M12r even when the voltage of the wiring WXr changes. Consequently, the drain current of the transistor M11r becomes $I_0-(I_{21}-I_4)$ and the drain current of the transistor M11r is copied to the transistor M11.

Since the voltage Vgs of the transistor M12 is fixed to the voltage Vp3, the current $I_3+I_0$ flows to the transistor M12 even when the voltage of the wiring WX changes.

When the switch S20 is turned on at a predetermined timing, a current $-I_1+I_3-I_4+I_2$ flows to the node npr. In other words, the current −Ipr(w, d) flows to the node npr (see the formula (2.11)). The reading circuit 120 converts the current −Ipr(w, d) into a voltage.

As described above, with the use of the offset cancellation circuit 50, the offset current is canceled from the current $I_1$ generated by the circuit 10, so that the current proportional to the product w·d can be obtained.

Although the current supply circuit 30 and the offset cancellation circuit 50 described in this embodiment are single-polarity circuits, the semiconductor device of one embodiment of the present invention is not limited thereto. For example, the current supply circuit 30 or the offset cancellation circuit 50 may have a configuration in which a source current source and a sink current source of a PMOS circuit or a NMOS circuit are combined.

Note that this embodiment can be combined with other embodiments in this specification as appropriate.

Embodiment 3

In this embodiment, other configuration examples of the current supply circuit 30 and the offset cancellation circuit 50 described in Embodiment 1 and Embodiment 2 are described.

Note that in this embodiment, the description of the portions overlapping with the current supply circuit 30 and the offset cancellation circuit 50 in the above embodiment is omitted and only different portions are mainly described.

<Current Supply Circuit 60>

Figure 8:
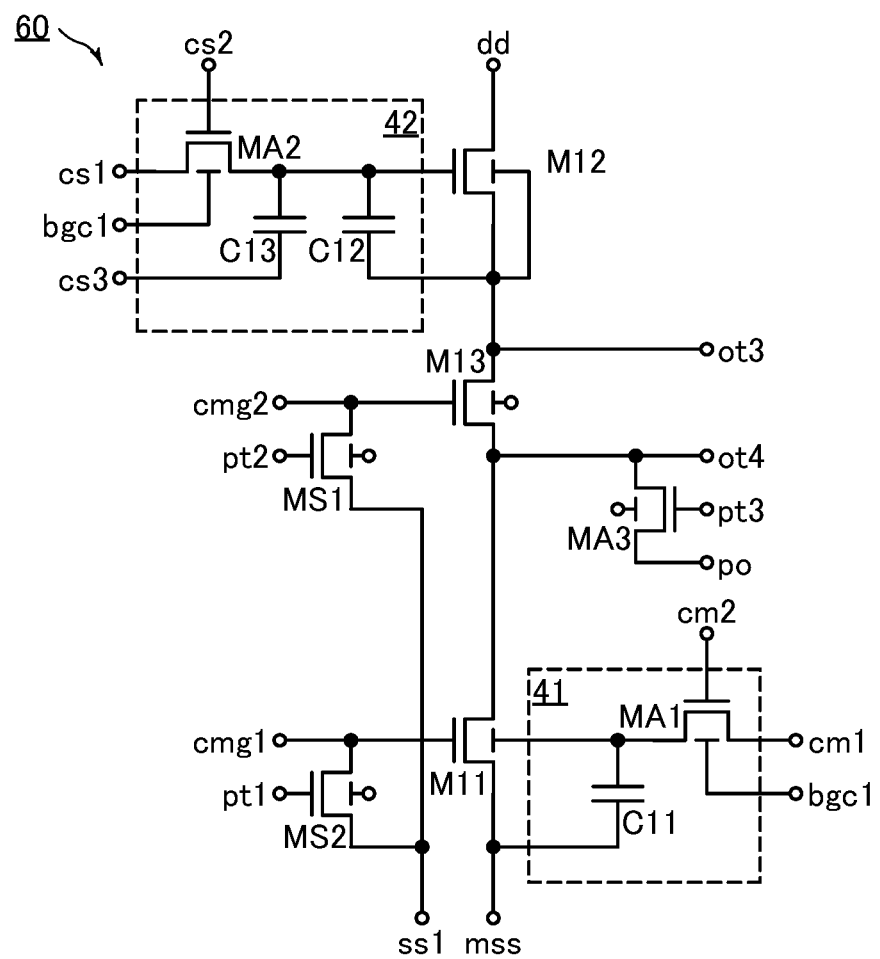
FIG. 8 is a circuit diagram showing a configuration structure of a circuit included in a semiconductor device.

A current supply circuit 60 illustrated in FIG. 8 is a single-polarity circuit and includes the transistors M11, M12, M13, MA1, MA2, MA3, MS1, and MS2, the capacitors C11, C12, and C13, the nodes bgc1, cmg1, cmg2, ot3, cm1, cm2, cs1, cs2, cs3, ot3, ot4, pt1, pt2, pt3, po, dd, ss1, and mss. In other words, the current supply circuit 60 has a configuration in which the transistors M13, MA3, MS1, and MS2, the capacitor C13, the nodes cmg1, cmg2, pt1, pt2, pt3, po, cs3, ot3, ot4, and mss are added to the configuration of the current supply circuit 30 illustrated in FIG. 5(A) and the node cmg is removed.

The transistor M11 functions as part of the current mirror circuit. The gate, source, and drain of the transistor M11 are electrically connected to the nodes cmg1, mss, and ot4, respectively.

The node po is an input/output node for monitoring the current flowing to the transistor M11, and the transistor MA3 functions as a switching element for controlling whether the current is input/output to the node po or not. Thus, one of a source and a drain of the transistor MA3 is electrically connected to one of the drain of the transistor M11. A gate of the transistor MA3 is electrically connected to the node pt3.

The description in the above embodiment is taken into account in the circuit 41.

The transistor M12 functions as a current source. The drain and the source of the transistor M12 are electrically connected to the nodes dd and ot3, respectively, as in the current supply circuit 30. The back gate and the source of the transistor M12 are electrically connected to each other.

The transistor M13 functions as part of the current mirror circuit. A gate, a source, and a drain of the transistor M13 are electrically connected to the nodes cmg2, ot4, and ot3, respectively. Note that the node ot3 is an output node of the current supply circuit 60.

In other words, the source of the transistor M13 is electrically connected to the drain of the transistor M11, and the drain of the transistor M13 is electrically connected to the source of the transistor M12.

The circuit 42 of the current supply circuit 60 illustrated in FIG. 8 stores the voltage between the gate and the source of the transistor M12, like the circuit 42 of the current supply circuit 30. The circuit 42 of the current supply circuit 60 has a configuration in which the capacitor C13 is added to the circuit 42 of the current supply circuit 30 for a countermeasure against a charge injection effect. The term charge injection effect refers to a kind of switching noise, a phenomenon in which, when a transistor is switched from an on state to an off state, charge included in a channel formation region flows to the source side and the drain side, so that a source potential and a drain potential of the transistor vary in response to the charge. The capacitor C13 included in the circuit 42 of the current supply circuit 30 has a function of retaining charge flowing from a channel formation region of the transistor MA2 when the transistor MA2 is switched from an on state to an off state, thereby preventing the variation in the voltage between the gate and the source of the transistor M12.

As the capacitor C13, a transistor in which a gate is one of two pairs of electrodes and a terminal electrically connecting a source and a drain is the other electrode is preferably used. The channel width of the transistor is preferably greater than or equal to 0.4 times and less than or equal to 0.6 times the channel width of the transistor MA2, more preferably greater than or equal to 0.45 times and less than or equal to 0.55 times. Not the channel width but the channel length may be greater than or equal to 0.4 times and less than or equal to 0.6 times, more preferably greater than or equal to 0.45 times and less than or equal to 0.55 times that of the transistor MA2. Accordingly, the influence of the charge injection effect in the circuit 42 can be more reduced.

The description of the circuit 42 in the current supply circuit 30 in the above embodiment is taken into account in the operation other than the above of the circuit 42 in the current supply circuit 60 illustrated in FIG. 8.

Figure 9:
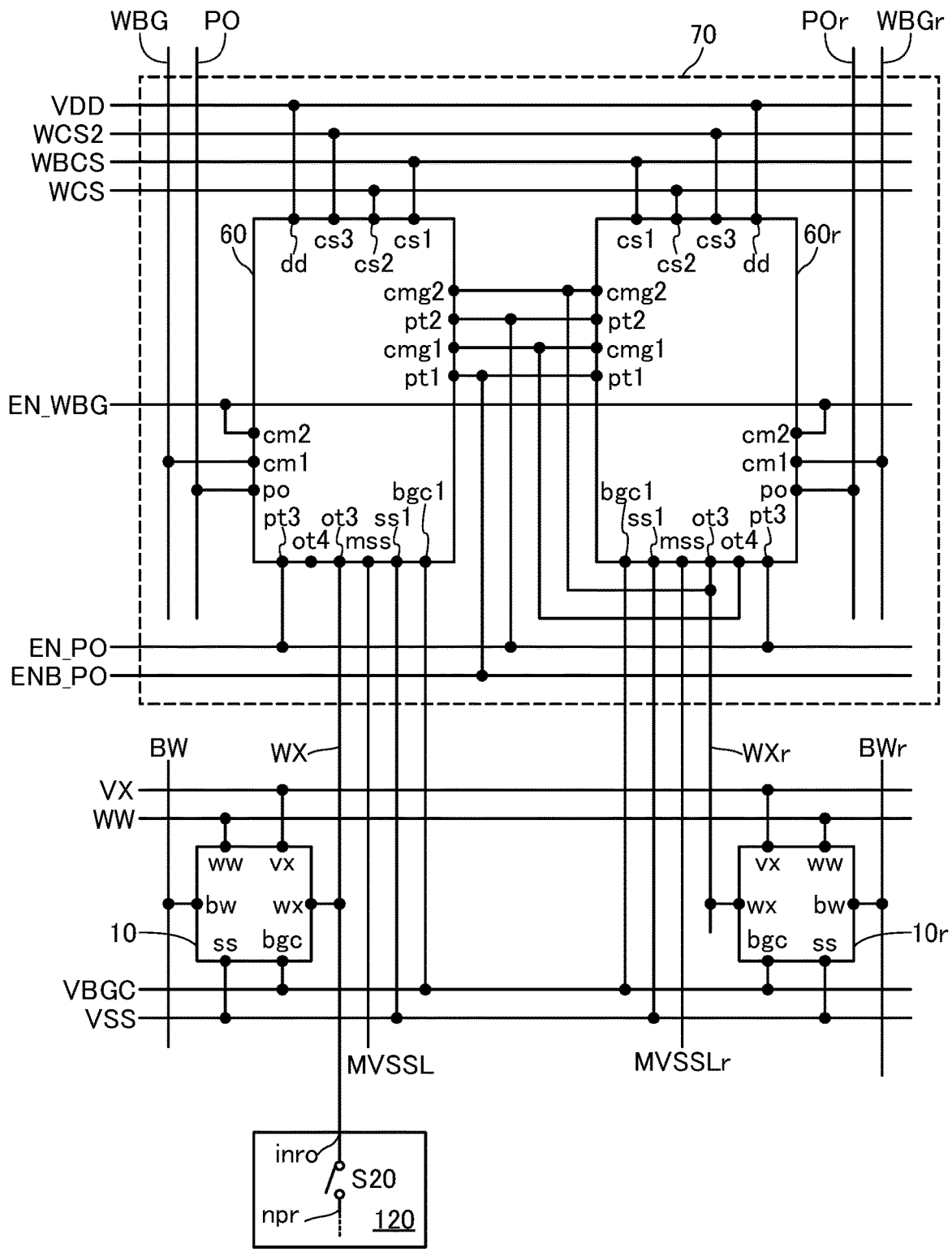
FIG. 9 is a block diagram showing a configuration example of a circuit included in a semiconductor device.

When two current supply circuits 60 are electrically connected as illustrated in FIG. 9, an offset cancellation circuit 70 can be formed. The use of the offset cancellation circuit 70 enables the offset current to be canceled from the output current of the multiplier circuit in Embodiment 1 more accurately than the use of the offset cancellation circuit 70 described in Embodiment 2. For a distinction between the two current supply circuits 60, one of them is referred to as a current supply circuit 60r.

The offset cancellation circuit 70 is electrically connected to the wirings WCS, WCS2, WBCS, EN_WBG, WBG, WBGr, PO, POr, EN_PO, ENB_PO, MVSSL, and MVSSLr and voltage lines for supply of the voltages VDD, VSS, and VBGC. The circuits 10 and 10r are electrically connected to the wirings WX and WXr, respectively. The details of the circuits 10 and 10r described in the above embodiment are taken into account in the circuits 10 and 10r. Note that wirings MVSSL and MVSSLr are voltage lines for supply of a voltage MVSS.

Specifically, the wiring WCS is electrically connected to the node cs2 of each of the current supply circuits 60 and 60r; the wiring WCS2 is electrically connected to the node cs3 of each of the current supply circuits 60 and 60r; and the wiring WBCS is electrically connected to the node cs1 of each of the current supply circuits 60 and 60r. The wiring EN_WBG is electrically connected to the node cm2 of each of the current supply circuits 60 and 60r. The wiring WBG is electrically connected to the node cm1 of the current supply circuit 60, and the wiring WBGr is electrically connected to the node cm1 of the current supply circuit 60r. The wiring PO is electrically connected to the node po of the current supply circuit 60, and the wiring POr is electrically connected to the node po of the current supply circuit 60r. The wiring EN_PO is electrically connected to the nodes pt2 and pt3 of each of the current supply circuits 60 and 60r, and the wiring ENB_PO is electrically connected to the node pt1 of each of the current supply circuits 60 and 60r. The wiring MVSSL is electrically connected to the node mss of the current supply circuit 60, and the wiring MVSSLr is electrically connected to the node mss of the current supply circuit 60r. A voltage line for supply of the voltage VDD is electrically connected to the node dd of each of the current supply circuits 60 and 60r. A voltage line for supply of the voltage VSS is electrically connected to the node ss1 of each of the current supply circuits 60 and 60r and the node ss of each of the current supply circuits 10 and 10r. A voltage line for supply of the voltage VBGC is electrically connected to the node bgc1 of each of the current supply circuits 60 and 60r and the node bgc of each of the current supply circuits 10 and 10r. The wiring WX is electrically connected to the node ot3 of the current supply circuit 60 and the node wx of the circuit 10, and the wiring WXr is electrically connected to the node ot3 of the current supply circuit 60r, the node wx of the circuit 10r, and the node cmg2 of each of the current supply circuits 60 and 60r. The wiring BW is electrically connected to the node bw of the current supply circuit 10, and the wiring BWr is electrically connected to the node bw of the circuit 10r. The node ot4 of the current supply circuit 60r is electrically connected to the node cmg1 of each of the current supply circuits 60 and 60r.

As illustrated in FIG. 9, the reading circuit 120 is electrically connected to the wiring WX. The description of the reading circuit 120 in the above embodiment is taken into account in the reading circuit 120.

In the case where components (such as transistors or wirings) related to the current supply circuits 60 and 60r are identified, "r" is added to the reference numerals of the components related to the current supply circuit 60r. The same applies to components related to the circuits 10 and 10r. Note that instead of the circuits 10 and 10r, the circuit 11 and a replica circuit of the circuit 11 may be provided.

Figure 10:
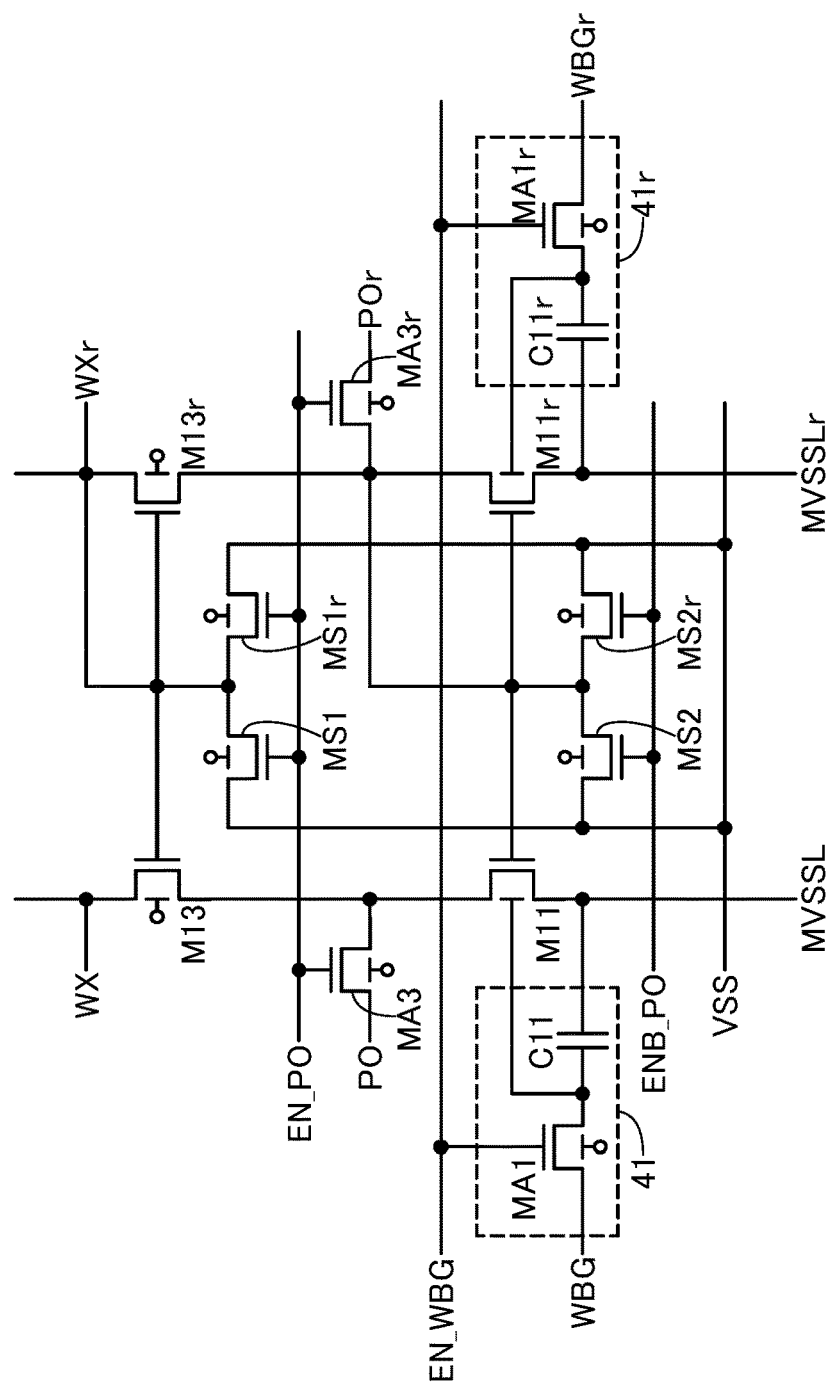
FIG. 10 is a circuit diagram showing a configuration structure of a circuit included in a semiconductor device.

FIG. 10 shows the configuration of electrical connection between the transistors M11, M13, MA3, MS1, and MS2 of the current supply circuit 60 and the transistors M11r, M13r, MA3r, MS1r, and MS2r of the current supply circuit 60r. Note that FIG. 10 illustrates a circuit 41r as a replica circuit of the circuit 41. When the transistors M11, M11r, M13, and M13r are focused on, these transistors constitute a cascode current mirror circuit. The use of the cascode current mirror circuit enables the current to be copied more accurately than the use of the current mirror circuit formed of the transistors M11 and M11r illustrated in FIG. 6 and FIG. 7. Thus, the amount of current substantially equal to that of the current flowing between the source and the drain of the transistor M13r can flow between the source and the drain of the transistor M13. Note that at this time, the voltage MVSS input to the node mss is preferably a low potential, further preferably a negative potential for an increase in voltage range treated by the cascode current mirror circuit.

Figure 11:
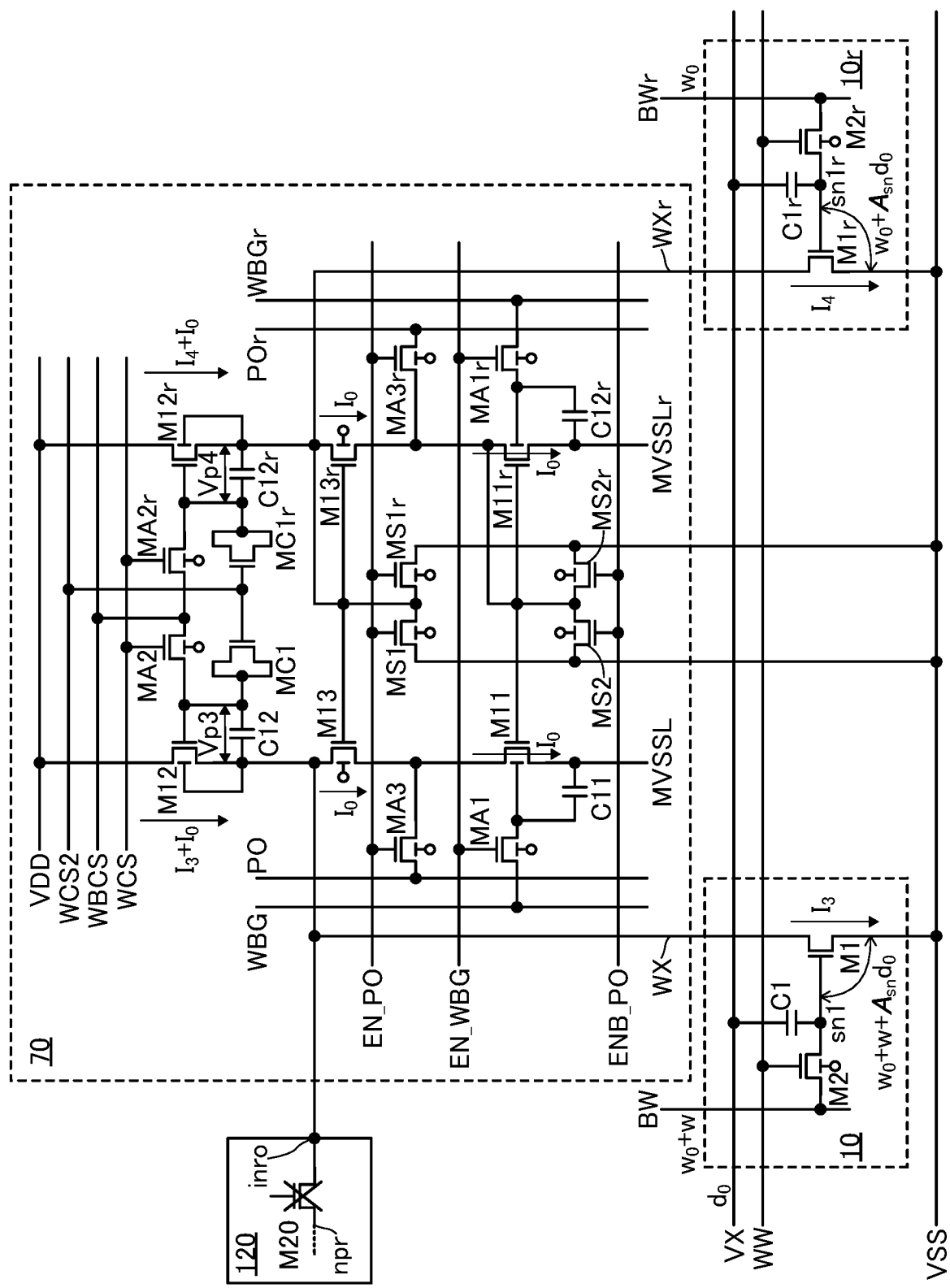
FIG. 11 is a circuit diagram showing a configuration structure of a circuit included in a semiconductor device.
Figure 12:
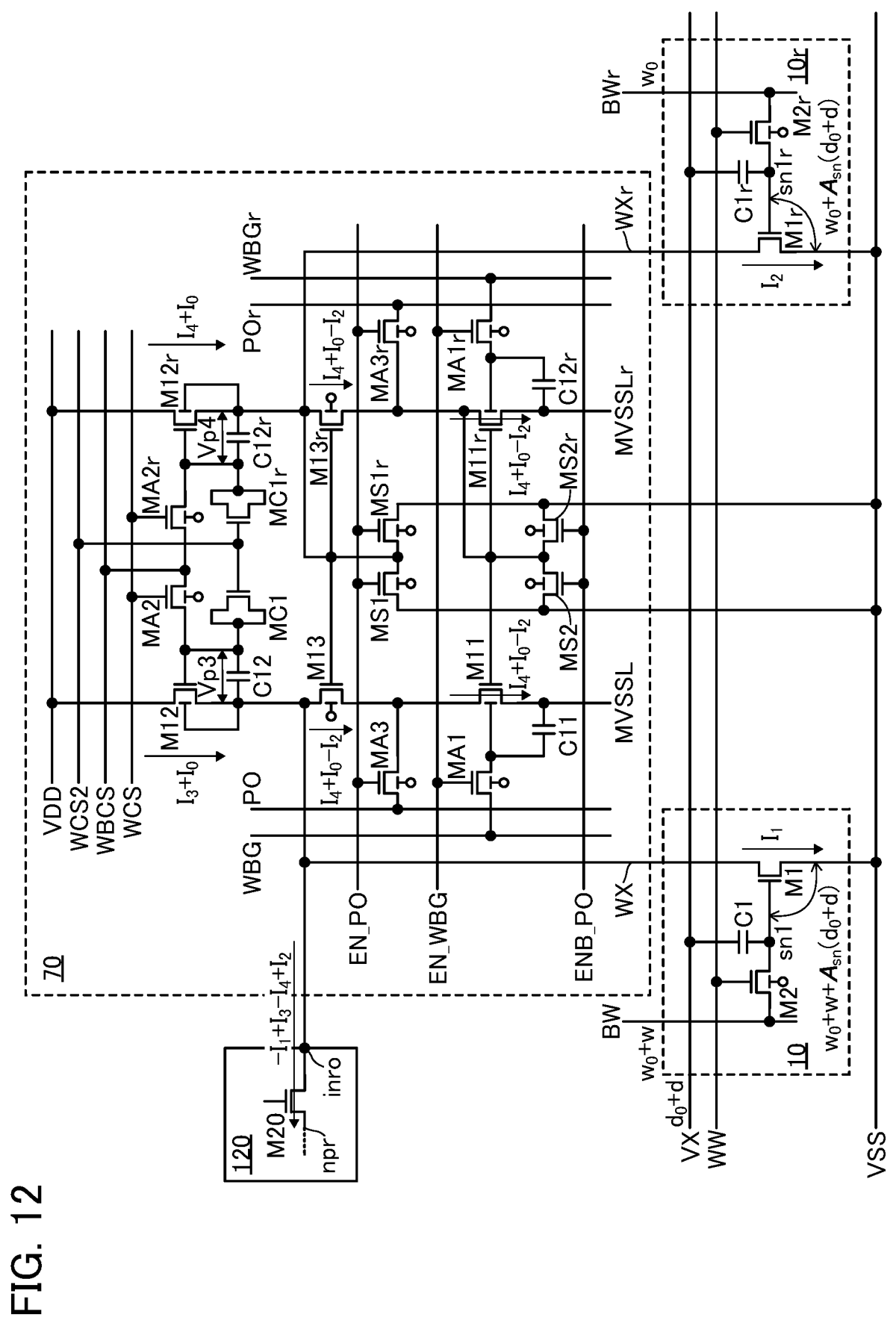

With reference to FIG. 11 and FIG. 12, an offset cancellation operation is described taking an example of the case where multiplication of the data w by the data d is performed. States of the offset cancellation circuit 70 and the circuits 10 and 10r are transferred from the "initialization state" to the "state of writing the data d," whereby the offset current is canceled from the output current of the circuit 10, and the current Ipr(w, d) proportional to the product w·d can be acquired. FIG. 11 is a circuit diagram for illustrating the initialization state and FIG. 12 is a circuit diagram illustrating the state of writing the data d.

<<Threshold Voltage Correction>>

In the current mirror circuit, since the transistor M11r is a replica transistor of the transistor M11, the drain current of the transistor M11r is ideally copied to the transistor M11. However, because of an influence of a manufacturing process or the like, the transistor M11r and the transistor M11 d₀ not have the same characteristics in some cases. Thus, correction of the threshold voltages of the transistors M11 and M11r in the offset cancellation circuit 70 is described first.

When the threshold voltages of the transistors M11 and M11r in the offset cancellation circuit 70 are corrected, a wiring EN_PO is set to "H" to turn on each of the transistors MS1, MS1r, MA3, and MA3r. At this time, VSS is input to the gates of the transistors M13 and M13r, so that the transistors M13 and M13r are turned off. Furthermore, the wiring ENB_PO is set to "L" to turn off the transistors MS2 and MS2r. Here, a potential higher than the voltage MVSS is supplied to each of the wiring PO and the wiring POr, whereby the current mirror circuit composed of the transistors M11 and M11r causes the current to flow between the source and the drain of each of the transistors M11 and M11r. At this time, the current flowing between the source and the drain of the transistor M11 is monitored by the wiring MVSSL, and the current flowing between the source and the drain of the transistor M11r is monitored by the wiring MVSSLr.

Here, the voltages Vbgs of the transistors M11r and M11 are set such that the threshold voltages of the transistors M11r and M11 are 0 V on the basis of the currents flowing to the wirings MVSSL and MVSSLr. When the voltages Vbgs of the transistors M11r and M11 at this time are set to Vbin0 and Vbin1, respectively, Vbin1−MVSS and Vbin2−MVSS are input to the wirings WBG and WBGr, respectively. Next, the wiring EN_WBG is set to "H" to turn on the transistors MA1 and MA1r, whereby Vbin1−MVSS, Vbin2−MVSS are input to the back gates of the transistors M11r and M11, respectively. Then, the transistors MA1 and MA1r are turned off, whereby the voltage Vbgs of the transistor M11r is fixed to Vbin0 by the capacitor C11r and the voltage Vbgs of the transistor M11 is fixed to Vbin1 by the capacitor C11.

Furthermore, after the voltages Vbgs of the transistors M11r and M11 are set to Vbin0 and Vbin1, respectively, the currents flowing to the wirings MVSSL and MVSSLr are monitored so that the voltages Vbgs of the transistors M11r and M11 may be set again. Such repeated setting of the voltage Vbgs of each of the transistors M11r and M11 enables the threshold voltage of each of the transistors M11r and M11 to be close to 0 V.

The details of the description in the above embodiment are taken into account in the correction of the transistors M1 and M1r included in the circuits 10 and 10r, respectively.

<<Initialization Operation>>

An initialization operation is an operation for setting currents supplied from the transistors M12r and M12. The switch S20 is in an off state during the initialization operation.

As shown in FIG. 11, voltages $w_0$ and $w_0+w$ are input to the wirings BWr and BW, respectively. Next, the wiring WW is set to "H" to turn on each of the transistors M2r and M2, whereby the voltages $w_0$ and $w_0+w$ are written to the nodes sn1 and sn1r, respectively. Then, after the wiring WW is set to "L" to turn off each of the transistors M2r and M2, $d_0$ is input to the wiring VX. Thus, the voltages Vgs of the transistors M1r and M1 become $w_0+A_{sn}d_0$ and $w_0+w+A_{sn}d_0$, respectively, whereby the currents $I_4$ and $I_3$ flow to the transistors M1r and M1, respectively (see the formulae (2.9) and (2.8)).

The wiring WCS is set to "H" to turn on transistors MA2r and MA2. Note that the voltage VBCS, the channel lengths and the channel widths of the transistors M12 and M12r, and the like are set such that a current $I_4+I_0$ exceeding the current $I_4$ flows to the transistor M12r, a current $I_3+I_0$ exceeding the current $I_3$ flows to the transistor M12, and the transistors M12r and 12 operate in a saturation region. The voltage Vgs when the drain current of the transistor M12r is $I_4+I_0$ is denoted by Vp4, and the voltage Vgs when the drain current of the transistor M12 is $I_3+I_0$ is denoted by Vp3.

Since the current $I_4+I_0$ flows to the transistor M12r, the current Io flows to the transistor M13r. At this time, the wiring EN_PO is set to "L" to turn off the transistors MS1, MS1r, MA3, and MA3r, whereby the current mirror circuit of the transistors M13r and M13 functions. Thus, the current Io also flows to the transistor M13.

The wiring ENB_PO is set to "L" to turn off the transistors MS2 and MS2r, whereby the current mirror circuit of the transistors M11r and M11 functions. In other words, the transistors M11r and M11 function as a cascode current mirror circuit, together with the transistors M13r and M13. Thus, the current $I_0$ flows to each of the transistors M11r and M11.

Here, the wiring WCS is set to "L" to turn off the transistors MA2r and MA2, whereby the offset cancellation circuit 70 is brought into an initialization state. In the initialization state, the voltage Vgs of the transistor MA2r is fixed to the voltage Vp4 by the capacitor C12r and the voltage Vgs of the transistor MA2 is fixed to the voltage Vp3 by the capacitor C12. Consequently, the current supplied by the transistor M12r is set to $I_4+I_0$ and the current supplied by the transistor M12 is set to $I_3+I_0$.

Note that in the offset cancellation circuit 70, the transistors MC1 and MC1r are employed as the capacitors C13 and C13r, respectively. The wiring WCS2 functions as a wiring for transmitting an inversion signal of a signal transmitted to the wiring WCS. In other words, when the transistors MA2 and MA2r are turned off, "H" is input to the gates of the transistors MC1 and MC1r. This can inhibit the charge injection effect caused by the transistors MA2 and MA2r. Thus, the variation in the voltages of the gates of the transistors M12 and M12r due to the charge injection effect can be smaller than in the offset cancellation circuit 50, and the variation in the currents $I_3+I_0$ and $I_4+I_0$ flowing to the transistors M12 and M12r, respectively, can be reduced.

<<Writing Data d>>

Next, as illustrated in FIG. 12, the voltage $d_0+d$ is input to the wiring VX. Since the transistors M2r and M2 are off, the voltages Vgs of the transistors M1r and M1 become $w_0+A_{sn}(d_0+d)$ and $w_0+w+A_{sn}(d_0+d)$, respectively. Thus, $I_2$ and $I_1$ flow to the transistors M1r and M1 (see the formulae (2.7) and (2.6)).

Since the voltage Vgs of the transistor M12r is fixed to the voltage Vp4, the current $I_4+I_0$ flows to the transistor M12r even when the voltage of the wiring WXr changes. Consequently, the drain current of the transistor M11r becomes $I_0-(I_2-I_4)$ and the drain current of the transistor M11 is copied to the transistor M11.

Since the voltage Vgs of the transistor M12 is fixed to the voltage Vp3, the current $I_3+I_0$ flows to the transistor M12 even when the voltage of the wiring WX changes.

When the switch S20 is turned on at a predetermined timing, the current $-I_1+I_3-I_4+I_0$ flows to the node npr. In other words, the current −Ipr(w, d) flows to the node npr (see the formula (2.11)). The reading circuit 120 converts the current −Ipr(w, d) into a voltage.

As described above, with the use of the offset cancellation circuit 70, the offset current is canceled from the current $I_1$ generated by the circuit $I_0$, so that the current proportional to the product w·d can be obtained.

Note that this embodiment can be combined with other embodiments in this specification as appropriate.

Embodiment 4

In this embodiment, an offset cancellation circuit 80 which is different from the offset cancellation circuit 50 described in Embodiment 2 is described.

<Offset Cancellation Circuit 80>

Figure 13:
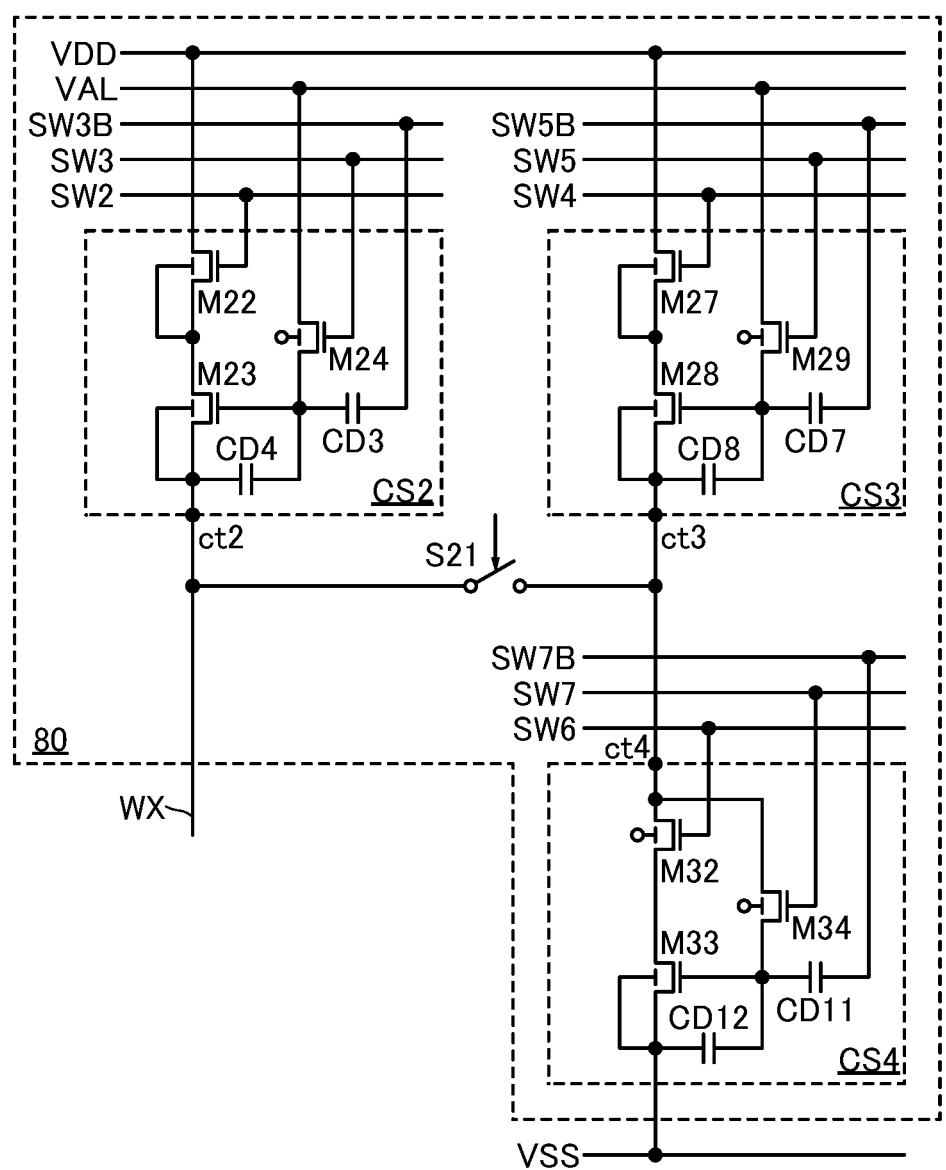
FIG. 13 is a circuit diagram showing a configuration structure of a circuit included in a semiconductor device.

The offset cancellation circuit 80 illustrated in FIG. 13 is a single-polarity circuit and includes a circuit CS2, a circuit CS3, a circuit CS4, and a switch S21.

In the offset cancellation circuit 80, the circuit CS2 includes transistors M22, M23, and M24, capacitors CD3 and CD4, and a terminal ct2; the circuit CS3 includes transistors M27, M28, and M29, capacitors CD7 and CD8, and a terminal ct3; and the circuit CS4 includes transistors M32, M33, and M34, capacitors CD11 and CD12, and a terminal ct4.

The circuit CS2 is a constant current circuit that generates a current output to the terminal ct2, and the circuit CS3 is a constant current circuit that generates a current output to the terminal ct3. The circuit CS2 has a function of generating a current on the basis of potentials retained in a first terminal of the capacitor CD3 and a first terminal of the capacitor CD4, and the circuit CS3 has a function of generating a current on the basis of potentials retained in a first terminal of the capacitor CD7 and a first terminal of the capacitor CD8.

The circuit CS4 is a current sink circuit that draws a current from the terminal ct4. The circuit CS4 has a function of drawing a current through a source and a drain of each of the transistor M32 and the transistor M33 on the basis of potentials held in a first terminal of the capacitor CD11 and a first terminal of the capacitor CD12.

In the circuit CS2, a first terminal of the transistor M22 is electrically connected to the voltage line for supply of the voltage VDD, a second terminal and a back gate of the transistor M22 are electrically connected to a first terminal of the transistor M23, and a gate of the transistor M22 is electrically connected to a wiring SW2. A second terminal and a back gate of the transistor M23 are electrically connected to a second terminal of the capacitor CD4 and the terminal ct2, and a gate of the transistor M23 is electrically connected to a first terminal of the transistor M24, the first terminal of the capacitor CD3, and the first terminal of the capacitor CD4. A second terminal of the transistor M24 is electrically connected to a wiring VAL for supply of a given voltage, a gate of the transistor M24 is electrically connected to a wiring SW3, and a second terminal of the capacitor CD3 is electrically connected to a wiring SW3B.

In the circuit CS3, a first terminal of the transistor M27 is electrically connected to the voltage line for supply of the voltage VDD, a second terminal and a back gate of the transistor M27 are electrically connected to a first terminal of the transistor M28, and a gate of the transistor M27 is electrically connected to a wiring SW4. A second terminal and a back gate of the transistor M28 are electrically connected to a second terminal of the capacitor CD8 and the terminal ct3, and a gate of the transistor M28 is electrically connected to a first terminal of the transistor M29, the first terminal of the capacitor CD7, and the first terminal of the capacitor CD8. A second terminal of the transistor M29 is electrically connected to the wiring VAL for supply of a given voltage, a gate of the transistor M29 is electrically connected to a wiring SW5, and a second terminal of the capacitor CD7 is electrically connected to a wiring SW5B.

A given voltage supplied by the wiring VAL is preferably a voltage higher than the voltage VSS.

In the circuit CS4, the first terminal of the transistor M32 is electrically connected to a first terminal of the transistor M34 and the terminal ct4, the second terminal of the transistor M32 is electrically connected to the first terminal of the transistor M33, and a gate of the transistor M32 is electrically connected to a wiring SW6. The second terminal of the transistor M33 is electrically connected to the voltage line for supply of the voltage VSS, a back gate of the transistor M33 is electrically connected to the voltage line for supply of the voltage VSS, and a gate of the transistor M33 is electrically connected to a second terminal of the transistor M34, the first terminal of the capacitor CD11, and the first terminal of the capacitor CD12. A gate of the transistor M34 is electrically connected to a wiring SW7, a second terminal of the capacitor CD11 is electrically connected to a wiring SW7B, and a second terminal of the capacitor CD12 is electrically connected to the voltage line for supply of the voltage VSS.

A first terminal of the switch S21 is electrically connected to the terminal ct2 and the wiring WX, and a second terminal of the switch S21 is electrically connected to the terminal ct3 and the terminal ct4.

The wiring SW1 to the wiring SW7 are each a wiring to which one of a low-level potential and a high-level potential is supplied. The wiring SW3B is a wiring to which an inverted signal of a signal input to the wiring SW3 is input, the wiring SW5B is a wiring to which an inverted signal of a signal input to the wiring SW5 is input, and the wiring SW7B is a wiring to which an inverted signal of a signal input to the wiring SW7 is input.

The capacitors CD3, CD7, and CD11 are circuit elements for inhibiting the charge injection effect that occurs when the transistors M24, M29, and M34 are changed from an on state to an off state. Thus, the offset cancellation circuit 80 operates so that the inversion signals of the signals input to gates of the transistors M24, M29, and M34 are input to the second terminals of the capacitors CD3, CD7, and CD11, respectively. As each of the capacitors CD3, CD7, and CD11, a transistor in which a gate is one of two pairs of electrodes and a terminal electrically connecting a source and a drain is the other electrode is preferably used. The channel width of the transistor is preferably greater than or equal to 0.4 times and less than or equal to 0.6 times the channel width of the transistors M24, M29, and M34, more preferably greater than or equal to 0.45 times and less than or equal to 0.55 times. Not the channel width but the channel length may be greater than or equal to 0.4 times and less than or equal to 0.6 times, more preferably greater than or equal to 0.45 times and less than or equal to 0.55 times that of the transistors M24, M29, and M34.

Figure 14:
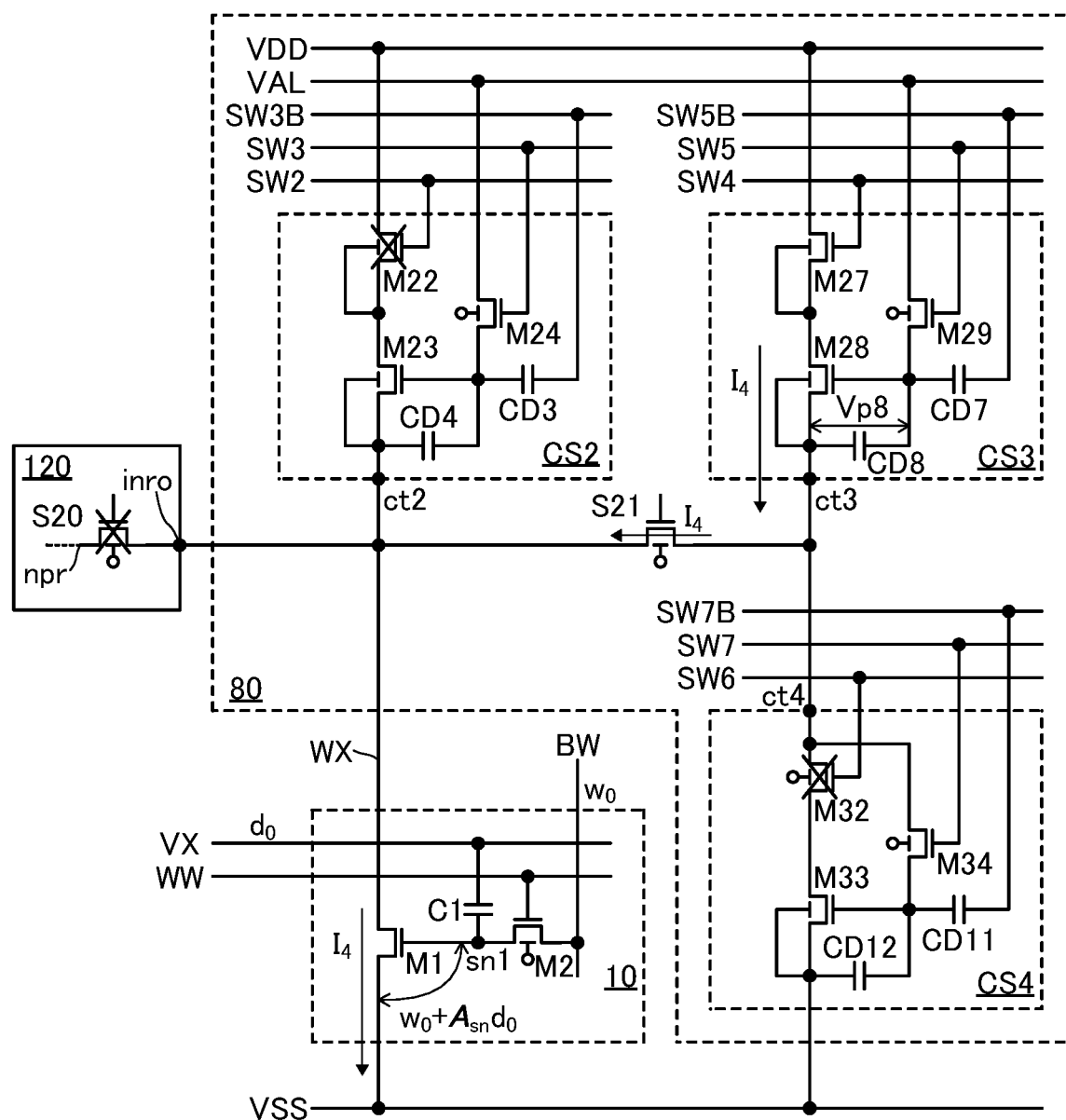
FIG. 14 is a circuit diagram showing a configuration structure of a circuit included in a semiconductor device.
Figure 15:
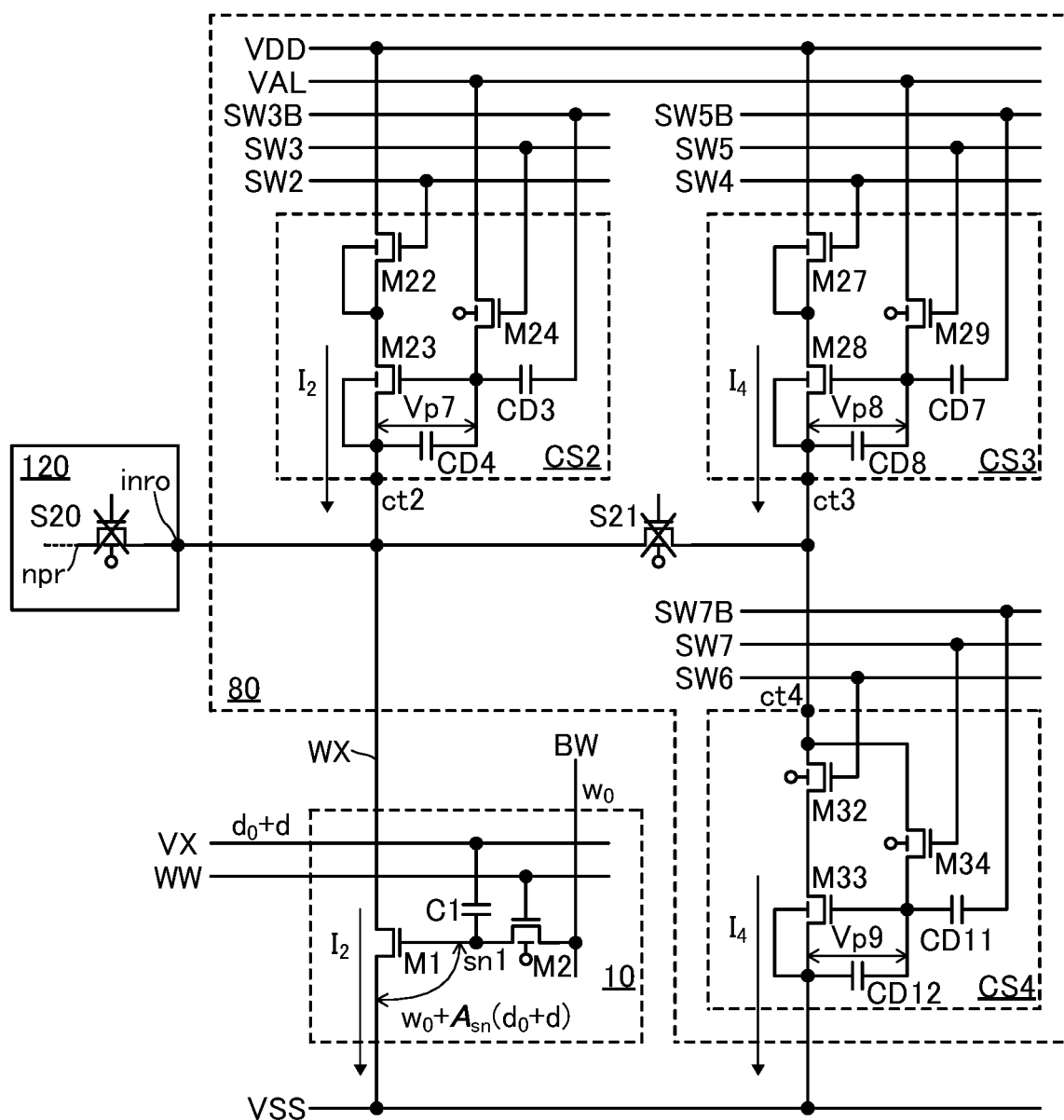
FIG. 15 is a circuit diagram showing a configuration structure of a circuit included in a semiconductor device.
Figure 16:
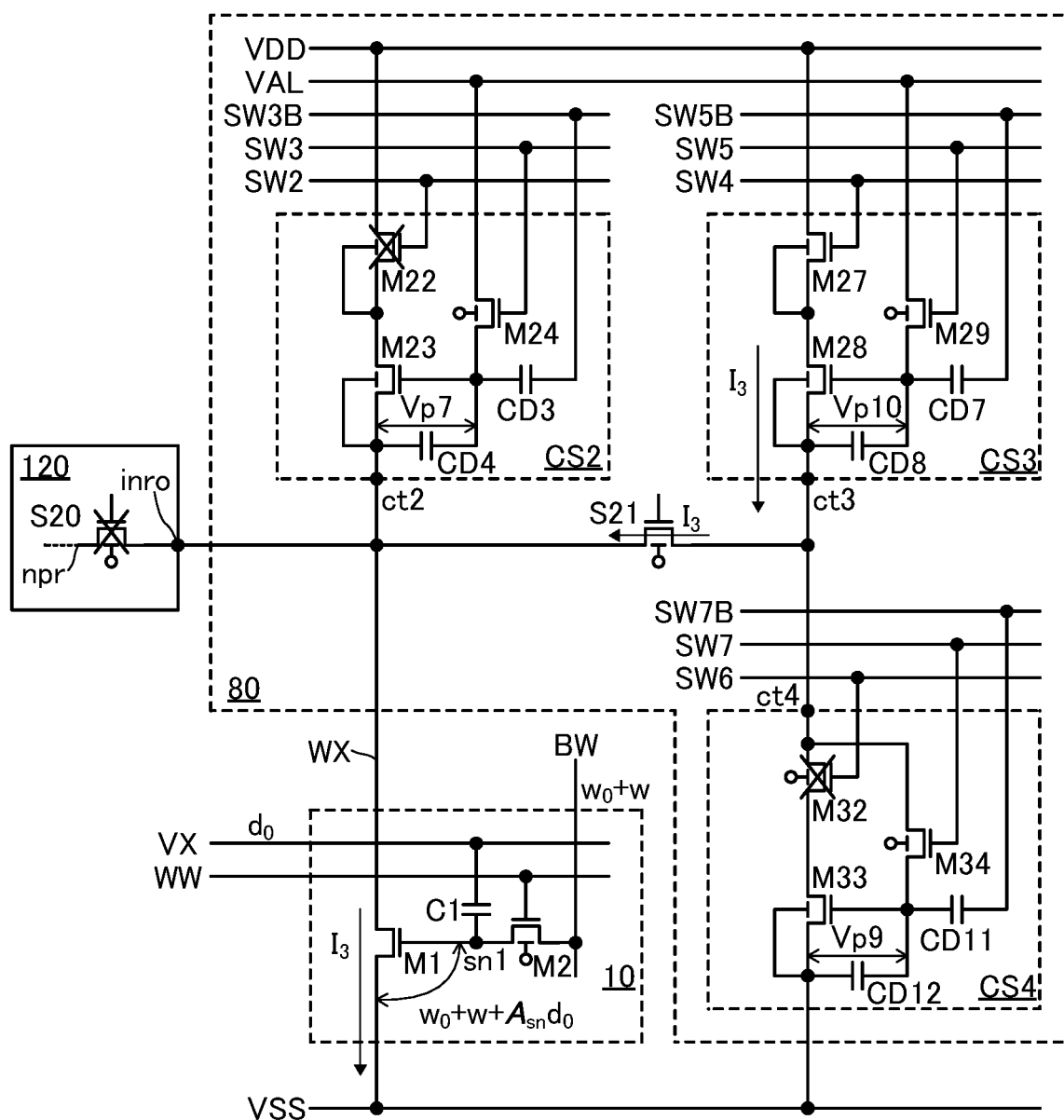
FIG. 16 is a circuit diagram showing a configuration structure of a circuit included in a semiconductor device.
Figure 17:
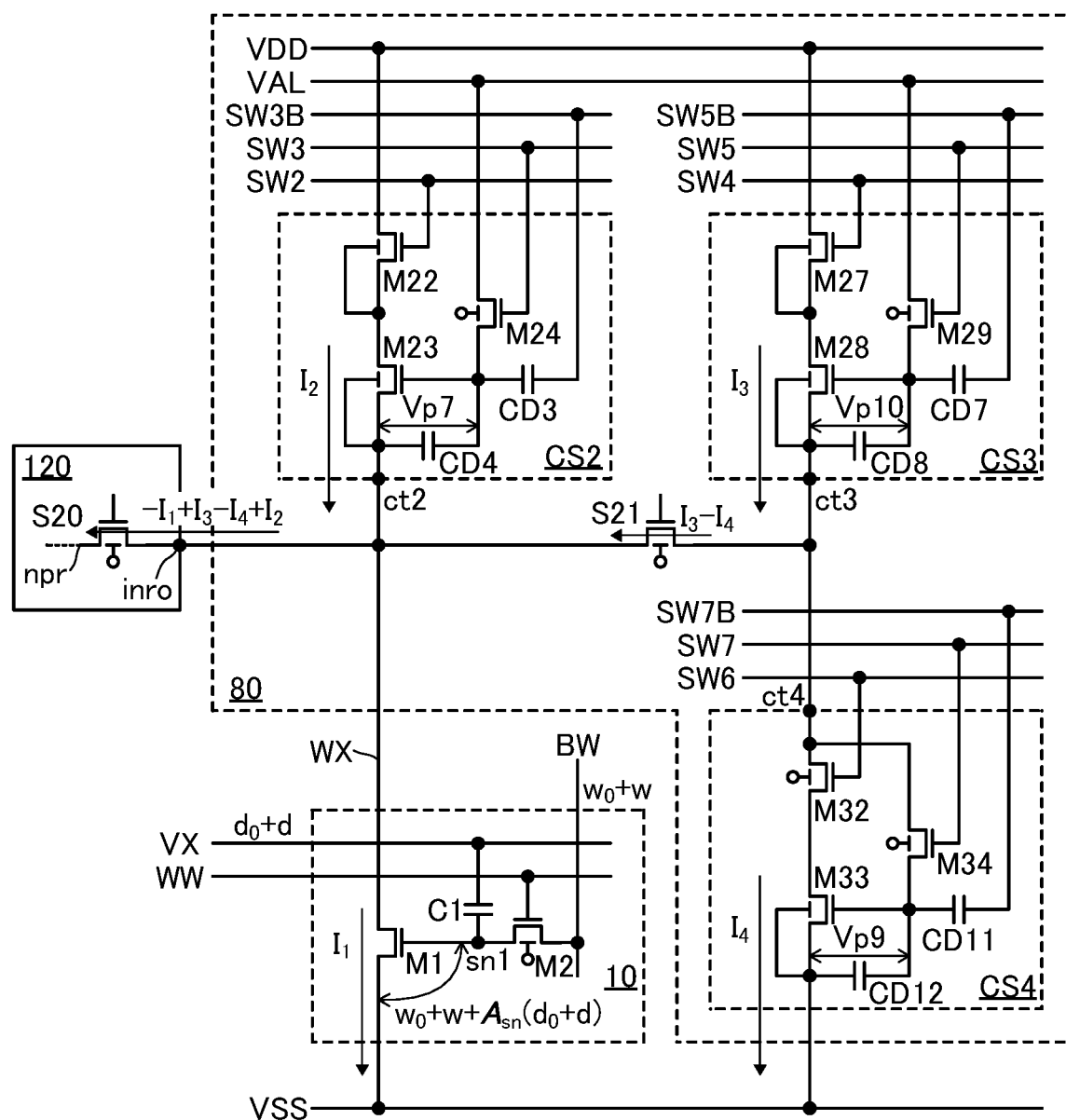
FIG. 17 is a circuit diagram showing a configuration structure of a circuit included in a semiconductor device.

With reference to FIG. 14 to FIG. 17, an offset cancellation operation is described taking an example of the case where multiplication of the data w by the data d is performed. Operations of the offset cancellation circuit 80 and the circuit 10 are transferred from a "first operation" to a "second operation," a "third operation," and a "fourth operation" in this order, whereby the offset current is canceled from the output current of the circuit 10, and the current Ipr(w, d) proportional to the product w.d can be acquired. FIG. 14 is a circuit diagram for illustrating the "first operation," FIG. 15 is a circuit diagram for illustrating the "second operation," FIG. 16 is a circuit diagram for illustrating the "third operation," and FIG. 17 is a circuit diagram for illustrating the "fourth operation."

Note that FIG. 14 to FIG. 17 illustrate the reading circuit 120 and the circuit 10. The reading circuit 120 and the circuit 10 are electrically connected to the terminal ct2 of the circuit CS2 of the offset cancellation circuit 80. Note that the details of the description in the above embodiments are taken into account in the reading circuit 120 and the circuit 10.

FIG. 14 to FIG. 17 show an example in which the switch S21 is formed of an OS transistor including a back gate. In the following description, the voltage VSS is 0 V for convenience.

<<First Operation>>

The first operation is an operation for setting a current supplied by the transistor M28 in the circuit CS3. During the first operation, the switch S20 is in an off state and the switch S21 is in an on state. During the first operation, the wiring SW2 is set to "L" and the wiring SW6 is set to "L," so that the transistor M22 of the circuit CS2 and the transistor M32 of the circuit CS4 are brought into an off state.

As illustrated in FIG. 14, the voltage $w_0$ is input to the wiring BW. In addition, VSS is input to the wiring VX at first. Next, the wiring WW is set to "H" to turn on the transistor M2, whereby the voltage $w_0$ is written to the node sn1. Then, after the wiring WW is set to "L" to turn off the transistor M2, the voltage $d_0$ is input to the wiring VX. Thus, the voltage Vgs of the transistor M1 becomes $w_0+A_{sn}d_0$, whereby the current $I_4$ flows to the transistor M1 (see the formula (2.9)).

The wiring SW4 is set to "H" and the wiring SW5 is set to "H" to turn on the transistor M27 and the transistor M29. The voltage supplied by the wiring VAL is set such that the current $I_4$ flows to the transistor M28 and the transistor M28 operates in a saturation region. Note that in FIG. 14, Vp8 denotes the voltage Vgs at the time when the drain current of the transistor M28 is $I_4$.

Next, the wiring SW5 is set to "L." This brings the transistor M29 into an off state, and the voltage Vgs of the transistor M28 is fixed to the voltage Vp8 by the capacitor CD8. Thus, the current supplied by the transistor M28 is set to $I_4$. Note that since the capacitor CD7 is a circuit element for inhibiting the charge injection effect that occurs when the transistor M29 is changed from on state to an off state, the wiring SW5B becomes "H" when the transistor M29 is turned off, that is, when the SW5 becomes "L."

<<Second Operation>>

The second operation is an operation for setting the current supplied by the transistor M23 in the circuit CS2 and is an operation for setting the current drawn by the transistor M33 in the circuit CS4. During the second operation, the switch S20 is in an off state and the switch S21 is in an off state.

First, the operation for setting the current supplied by the transistor M23 in the circuit CS2 is described.

As illustrated in FIG. 15, the voltage $w_0$ is input to the wiring BW. In addition, VSS is input to the wiring VX at first. Next, the wiring WW is set to "H" to turn on the transistor M2, whereby the voltage $w_0$ is written to the node sn1. Then, the wiring WW is set to "L" to turn off the transistor M2. Note that in the case where the second operation is performed continuing from the first operation, the above-described writing operation is not necessarily needed because the voltage $w_0$ is already written to the node sn1. When the voltage $w_0$ is written to the node sn1, the voltage $d_0+d$ is input to the wiring VX, whereby the voltage Vgs of the transistor M1 becomes $w_0+A_{sn}(d_0+d)$; consequently, the current $I_2$ flows to the transistor M1 (see the formula (2.7)).

The wiring SW2 is set to "H" and the wiring SW3 is set to "H" to turn on the transistor M22 and the transistor M24. The voltage supplied by the wiring VAL is set such that the current $I_4$ flows to the transistor M23 and the transistor M23 operates in a saturation region. Note that in FIG. 15, Vp7 denotes the voltage Vgs at the time when the drain current of the transistor M23 is $I_2$.

Next, the wiring SW3 is set to "L." This brings the transistor M24 into an off state, and the voltage Vgs of the transistor M23 is fixed to the voltage Vp7 by the capacitor CD4. Thus, the current supplied by the transistor M24 is set to $I_2$. Note that since the capacitor CD3 is a circuit element for inhibiting the charge injection effect that occurs when the transistor M24 is changed from on state to an off state, the wiring SW3B becomes "H" when the transistor M24 is turned off, that is, when the SW3 becomes "L."

Next, the operation for setting the current drawn by the transistor M33 in the circuit CS4 is described.

The wiring SW6 is set to "H" and the wiring SW7 is set to "H" to turn on the transistor M32 and the transistor M34. Thus, the drain and the gate of the transistor M33 are electrically connected to form a diode-connected configuration. Therefore, the voltage Vgs of the transistor M33 is set such that the current $I_4$ flowing from the circuit CS3 flows to the transistor M33. Note that in FIG. 15, Vp9 denotes the voltage Vgs at the time when the drain current of the transistor M33 is $I_4$. In the case where the size, the structure, or the like of the transistor M33 is the same as that of the transistor M28, Vp9 becomes the same voltage as Vp8.

Next, the wiring SW7 is set to "L." This brings the transistor M34 into an off state, and the voltage Vgs of the transistor M33 is fixed to the voltage Vp9 by the capacitor CD12. Thus, the current supplied by the transistor M28 is set to $I_4$. Note that since the capacitor CD11 is a circuit element for inhibiting the charge injection effect that occurs when the transistor M34 is changed from on state to an off state, the wiring SW7B becomes "H" when the transistor M34 is turned off, that is, when the SW7 becomes "L."

<<Third Operation>>

The third operation is an operation for setting a current supplied by the transistor M28 in the circuit CS3. During the third operation, the switch S20 is in an off state and the switch S21 is in an on state. During the third operation, the wiring SW2 is set to "L" and the wiring SW6 is set to "L," so that the transistor M22 of the circuit CS2 and the transistor M32 of the circuit CS4 are brought into an off state.

As illustrated in FIG. 16, the voltage $w_0+w$ is input to the wiring BW. In addition, VSS is input to the wiring VX at first. Next, the wiring WW is set to "H" to turn on the transistor M2, whereby the voltage $w_0+w$ is written to the node sn1. Then, after the wiring WW is set to "L" to turn off the transistor M2, $d_0$ is input to the wiring VX. Thus, the voltage Vgs of the transistor M1 becomes $w_0+w+A_{sn}d_0$, whereby the current $I_3$ flows to the transistor M1 (see the formula (2.8)).

The wiring SW4 is set to "H" and the wiring SW5 is set to "H" to turn on the transistor M27 and the transistor M29. The voltage supplied by the wiring VAL is set such that the current $I_3$ flows to the transistor M28 and the transistor M28 operates in a saturation region. Note that in FIG. 16, Vp10 denotes the voltage Vgs at the time when the drain current of the transistor M28 is $I_3$.

Next, the wiring SW5 is set to "L." This brings the transistor M29 into an off state, and the voltage Vgs of the transistor M28 is fixed to the voltage Vp10 by the capacitor CD8. Thus, the current supplied by the transistor M28 is set to $I_3$.

<<Fourth Operation>>

The fourth operation is an operation for setting the current Ii flowing to the transistor M1 in the circuit 10 and for flowing the current $-I1_1+I_3-I_4+I_2$ to the node npr in the reading circuit 120 with the use of the currents $I_2$, $I_3$, and $I_4$, which have set in the first operation to the third operation.

As illustrated in FIG. 17, the voltage $w_0+w$ is input to the wiring BW. In addition, VSS is input to the wiring VX at first. Next, the wiring WW is set to "H" to turn on the transistor M2, whereby the voltage $w_0+w$ is written to the node sn1. Then, after the wiring WW is set to "L" to turn off the transistor M2, the voltage $d_0+d$ is input to the wiring VX. Consequently, the voltage Vgs of the transistor M1 becomes $(w_0+w)+A_{sn}(d_0+d)$, whereby the current Ii flows to the transistor M1 (see the formula (2.6)).

The wiring SW2 is set to "H," the wiring SW4 is set to "H," and the wiring SW6 is set to "H" to turn on the transistor M22, the transistor M27, and the transistor M32. Consequently, the circuit CS2 outputs the current $I_2$ from the terminal ct2, the circuit CS3 outputs the current $I_3$ from the terminal ct3, and the circuit CS4 draws the current $I_2$ from the terminal ct4.

When the switch S20 and the switch S21 are turned on at a predetermined timing, a current $-I_1+I_3-I_4+I_2$ flows to the node npr. In other words, the current $-Ipr(w, d)$ flows to the node npr (see the formula (2.11)). The reading circuit 120 converts the current $-Ipr(w, d)$ into a voltage.

As described above, with the use of the offset cancellation circuit 80, the offset current is canceled from the current $I_1$ generated by the circuit $I_0$, so that the current proportional to the product w·d can be obtained.

Note that this embodiment can be combined with other embodiments in this specification as appropriate.

Embodiment 5

In this embodiment, a hierarchical artificial neural network and an arithmetic circuit using the circuit described in the above embodiments are described.

<Hierarchical Neural Network>

An artificial neural network (ANN, hereinafter referred to as a neural network) generally means a model that imitates a biological neural network. In general, a neural network has a structure in which units that imitate neurons are connected to each other through a unit that imitates a synapse.

The connection strength of the synapse (also referred to as a weight coefficient) can be changed by providing the neural network with existing data. The processing for determining a connection strength by providing a neural network with existing data in such a manner is called "learning" in some cases.

Furthermore, when a neural network in which "learning" has been performed (a connection strength has been determined) is provided with some type of data, new data can be output on the basis of the connection strength. The processing for outputting new data on the basis of provided data and a connection strength in a neural network in such a manner is called "inference" or "recognition" in some cases.

Examples of the model of a neural network are a Hopfield type, a hierarchical type, and the like. In particular, in this specification and the like, a multilayer neural network is called a "deep neural network" (DNN). In this embodiment, a hierarchical neural network including many levels is described.

Figure 18:
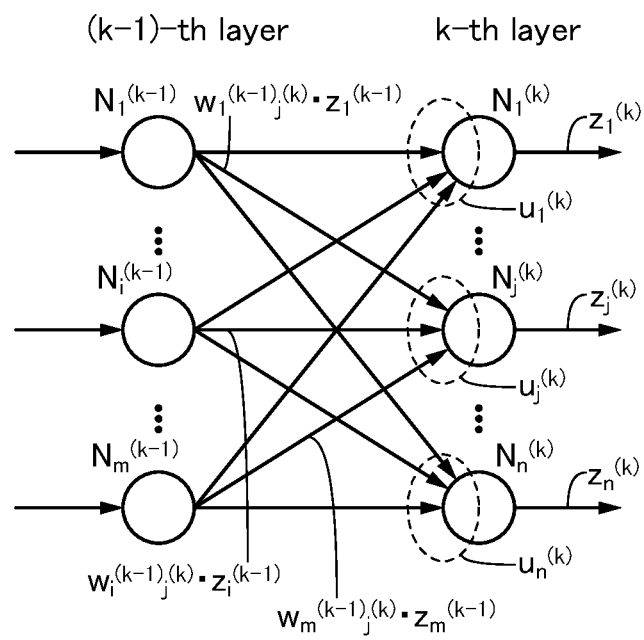
FIG. 18 is a diagram illustrating an example of a hierarchical neural network.

FIG. 18 is a diagram showing an example of the hierarchical neural network. A (k-1)-th layer (here, k is an integer greater than or equal to 2) includes a neuron $N_1^{(k-1)}$ to a neuron $N_m^{(k-1)}$ as m (here, m is an integer greater than or equal to 1) neurons in total. The k-th layer includes a neuron $N_1^{(k)}$ to a neuron $N_n^{(k)}$ (here, n is an integer greater than or equal to 1) as n neurons in total.

FIG. 18 illustrates neurons $N_1^{(k-1)}$, $N_i^{(k-1)}$, and $N_m^{(k-1)}$ in the (k-1)-th layer and neurons $N_1^{(k)}$, $N_j^{(k)}$, and $N_n^{(k)}$ in the k-th layer. The other neurons are not illustrated.

In the hierarchical neural network, the neuron $N_i^{(k-1)}$ (here, i is an integer greater than or equal to 1 and less than or equal to m) outputs an output signal $z_i^{(k-1)}$, and the product of the output signal $z_i^{(k-1)}$ and a weight coefficient $w_i^{(k-1)(k)}_j$ is input to the neuron $N_j^{(k)}$ (here, j is an integer greater than or equal to 1 and less than or equal to n). Note that as the weight coefficient is larger, the signal transmitted between the neurons is increased.

Note that in FIG. 18, the signal $w_1^{(k-1)(k)}_j \cdot z_1^{(k-1)}$ transmitted from neuron $N_1^{(k-1)}$ to the neuron $N_j^{(k)}$, the signal $w_i^{(k-1)(k)}_j \cdot z_i^{(k-1)}$ transmitted from neuron $N_i^{(k-1)}$ to the neuron $N_j^{(k)}$, and a signal $w_m^{(k-1)(k)}_j \cdot z_m^{(k-1)}$ transmitted from neuron $N_m^{(k-1)}$ to the neuron $N_j^{(k)}$ are shown as the reference numerals, and the reference numerals of the other signals are not shown.

Here, the neuron $N_j^{(k)}$ is focused on. The sum of the signals input to the neuron $N_j^{(k)}$ is expressed by the following formula.

[Formula 7]

$$u_j^{(k)} = \sum_{i=1}^{m} w_{ij}^{(k-1)(k)} \cdot z_i^{(k-1)} \quad (3.1)$$

In addition, an output signal $z_j^{(k)}$ from the neuron $N_j^{(k)}$ is defined by the following formula.

[Formula 8]

$$z_j^{(k)} = f(u_j^{(k)}) \quad (3.2)$$

A function $f(u_j^{(k)})$ is an activation function in the hierarchical neural network, and a step function, a linear ramp function, a sigmoid function, or the like can be used. Note that the activation function may be the same or different among all neurons. Additionally, the output function of the neuron in one layer may be the same as or different from that in another layer.

The neural network performs operation in which an input signal is input to the first layer (input layer), output signals are sequentially generated in layers from the first layer (input layer) to the last layer (output layer) according to the formulae (3.1) and (3.2) on the basis of the signals input from the previous layers, and the output signals are output to the subsequent layers. The signal output from the last layer (output layer) corresponds to the calculation results of the neural network.

<Arithmetic Circuit>

Here, an arithmetic circuit performing calculation of the formula (3.1), which uses the circuit described in the above embodiments, is described.

Figure 19:
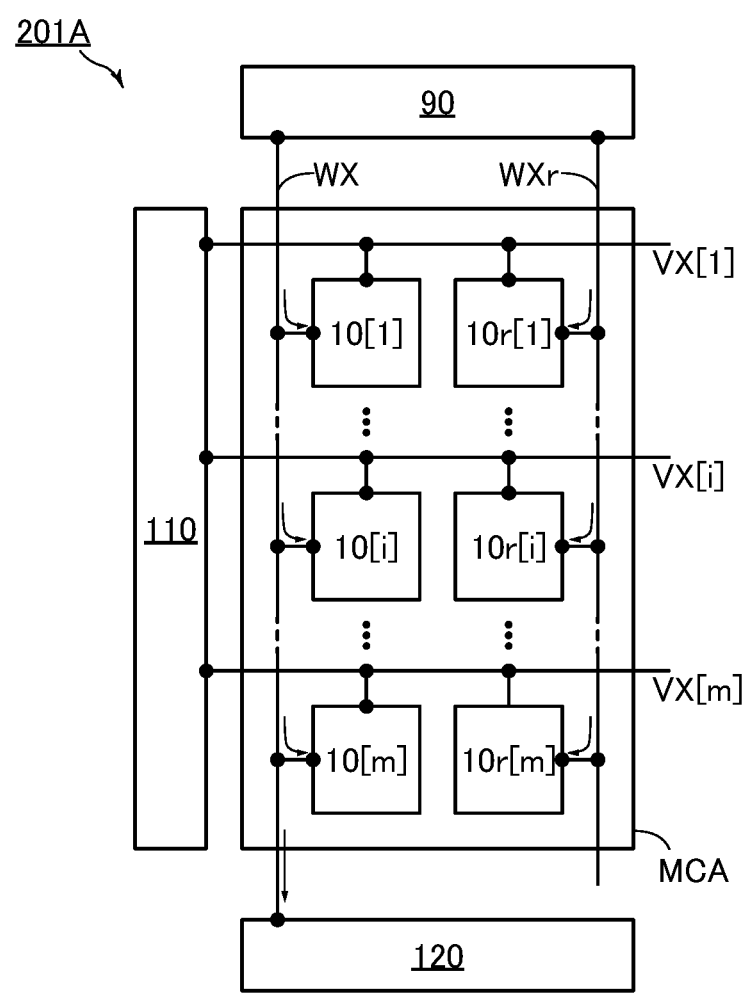
FIG. 19 is a block diagram showing a configuration example of a circuit included in a semiconductor device.

FIG. 19 is a block diagram illustrating a configuration of the arithmetic circuit. An arithmetic circuit 201A includes an offset cancellation circuit 90, a driver circuit 110, the reading circuit 120, and a memory cell array MCA.

As the offset cancellation circuit 90, the offset cancellation circuit 50 described in Embodiment 2 or the offset cancellation circuit 70 described in Embodiment 3 can be employed.

The memory cell array MCA includes m×2 memory cells. In FIG. 19, the memory cells are arranged in a matrix of m rows and 2 columns. In particular, the circuit 10 and the circuit 10r described in the above embodiments are applied to memory cells in the first column and the second column, respectively, of the memory cell array MCA illustrated in FIG. 19. Note that in this embodiment, the circuits 10 and 10r in the i-th row are referred to as circuits 10[i], and 10r[i], respectively.

The reading circuit 120 described in Embodiment 2 and Embodiment 3 can be applied to the reading circuit 120.

Note that the descriptions in Embodiment 2 and Embodiment 3 are taken into consideration in the electrical connection between the offset cancellation circuit 90 and the circuits 10[1] to 10[m], the circuits 10r[1] to 10r[m], and the reading circuit 120. In other words, when the offset cancellation circuit 90 is the offset cancellation circuit 50, the wiring WX is electrically connected to the node ot3 of the current supply circuit 30 and the wiring WXr is electrically connected to the node ot3 of the current supply circuit 30r. When the offset cancellation circuit 90 is the offset cancellation circuit 70, the wiring WX is electrically connected to the node ot3 of the current supply circuit 60 and the wiring WXr is electrically connected to the node ot3 of the current supply circuit 60r. The wiring WX is electrically connected to the node wx of each of the circuits 10[1] to 10[m] and the node inro of the reading circuit 120, and the wiring WXr is electrically connected to the node wx of each of the circuits 10r[1] to 10r[m]. Note that the node ot3, the node wx, and the node inro are not illustrated in FIG. 19.

The driver circuit 110 has a function of supplying a predetermined signal (or a voltage) to the node vx of each of the circuits 10 and 10r through the wiring VX. Note that in FIG. 19, the arithmetic circuit 201A has a configuration including m wirings VX because the memory cell array MCA has the m rows. In this embodiment, the wiring VX in the i-th row is referred to as a wiring VX[i]. The driver circuit 108 described in Embodiment 1 can be used as the driver circuit 110.

The arithmetic circuit 201A illustrated in FIG. 19 is configured, whereby calculation of the formula (3.1) can be performed. Next, an operation example of the arithmetic circuit 201A is described below. Note that in the following description, for convenience, a voltage corresponding to the weight coefficient $w_i^{(k-1)}{}_j^{(k)}$ and a voltage corresponding to the output signal $z_i^{(k-1)}$ are referred to as a voltage $w_i^{(k-1)}{}_j^{(k)}$ and a voltage $z_i^{(k-1)}$, respectively.

For example, a method of calculating $u_j^{(k)}$ input to the neuron $N_j^{(k)}$ is described. First, a weight coefficient $w_i^{(k-1)}{}_j^{(k)}$ between $N_i^{(k-1)}$ and the neuron $N_j^{(k)}$ is referred to as data w; a voltage $w_0 + w_i^{(k-1)}{}_j^{(k)}$ is retained in the node sn1 of the circuit 10[i], and the voltage $w_0$ is retained in the node sn1 of the circuit 10r[i].

Next, the signal $z_i^{(k-1)}$ input from the neuron $N_i^{(k-1)}$ to the neuron $N_j^{(k)}$ is referred to as data d; the case where the voltage $d_0$ is applied to the wiring VX[i] and the case where the voltage $d_0 + z_i^{(k-1)}$ is applied to the wiring VX[i] are considered. The currents $I_3$ and $I_4$ output from the offset cancellation circuit 90 through the wiring WX and the wiring WXr, respectively, when the voltage $d_0$ is applied to the wiring VX[i] and the currents $I_1$ and $I_2$ output from the offset cancellation circuit 90 through the wiring WX and the wiring WXr, respectively, when the voltage $d_0 + Z_i^{(k-1)}$ is applied to the wiring VX[i] can be represented by the following formulae.

[Formula 9]

$$I_1 = \sum_{i=1}^{m} Id1\left(w_0 + w_{ij}^{(k-1)(k)}, d_0 + z_i^{(k-1)}\right) \quad (3.3)$$

$$I_2 = \sum_{i=1}^{m} Id1\left(w_0, d_0 + z_i^{(k-1)}\right) \quad (3.4)$$

$$I_3 = \sum_{i=1}^{m} Id1\left(w_0 + w_{ij}^{(k-1)(k)}, d_0\right) \quad (3.5)$$

$$I_4 = \sum_{i=1}^{m} Id1(w_0, d_0) \quad (3.6)$$

The formula (2.10) is calculated in the above formulae (3.3) to (3.6), whereby the formula (3.7) can be obtained.

[Formula 10]

$$I_1 - I_3 + I_4 - I_2 = \sum_{i=1}^{m} Ipr\left(w_{ij}^{(k-1)(k)}, z_i^{(k-1)}\right) \quad (3.7)$$

$$= A_{sn}\beta \sum_{i=1}^{m} w_{ij}^{(k-1)(k)} \cdot z_i^{(k-1)}$$

The formula (3.7) represents a current value according to the value that is the sum of the products of the signals $z_i^{(k-1)}$ input from the neuron $N_i^{(k-1)}$ to the neuron $N_j^{(k)}$ and the weight coefficients $w_i^{(k-1)}{}_j^{(k)}$ between $N_i^{(k-1)}$ and the neuron $N_j^{(k)}$ where i is varied from 1 to m. The current shown in the formula (2.10) is supplied to the reading circuit 120 as described in Embodiment 2 and Embodiment 3. Thus, the current of the formula (3.7) is supplied to the reading circuit 120, whereby the formula (3.1) input to the neuron $N_j^{(k)}$ can be determined.

The arithmetic circuit of the activation function for calculating the formula (3.2) is included in the reading circuit 120, whereby the output signal $z_j^{(k)}$ of the neuron $N_j^{(k)}$ can be output from the reading circuit 120.

Figure 20:
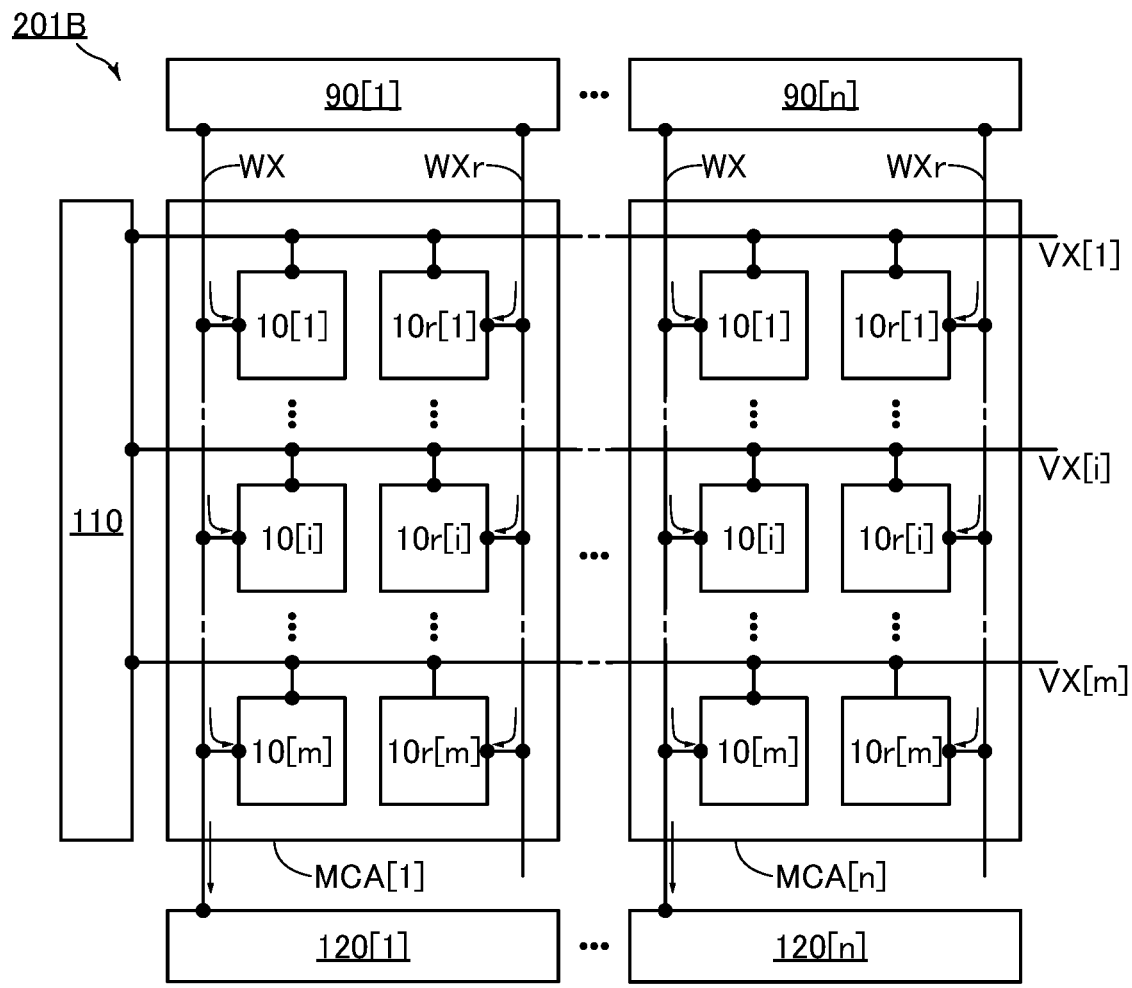
FIG. 20 is a block diagram showing a configuration example of a circuit included in a semiconductor device.

FIG. 20 shows a configuration example of another arithmetic circuit different from the arithmetic circuit 201A. An arithmetic circuit 201B includes n offset cancellation circuits 90, n memory cell arrays MCA, and n reading circuits 120 included in the arithmetic circuit 201A. In FIG. 20, the n offset cancellation circuits 90 are referred to as offset cancellation circuits 90[1] to 90[n], the n memory cell arrays MCA are referred to as memory cell arrays MCA[1] to MCA[n], and the n reading circuits 120 are referred to as reading circuits 120[1] to 120[n].

The arithmetic circuit 201B includes the driver circuit 110 similar to that of the arithmetic circuit 201A, and the driver circuit 110 is electrically connected to the memory cell arrays MCA[1] to MCA[n] through the wirings VX[1] to VX[m].

FIG. 20 illustrates the arithmetic circuit 201B, the offset cancellation circuits 90[1] and 90[n], the memory cell arrays MCA[1] and MCA[n], the reading circuits 120[1] and 120[n], the driver circuit 110, the circuit 10[1], the circuit 10[i], the circuit 10[m], the circuit 10r[1], the circuit 10r[i], and the circuit 10r[m] included in the memory cell array MCA[1], the circuit 10[1], the circuit 10[i], the circuit 10[m], the circuit 10r[1], the circuit 10r[i], and the circuit 10r[m] included in the memory cell array MCA[n], the wiring WX and the wiring WXr electrically connected to the offset cancellation circuit 90[1], the wiring WX and the wiring WXr electrically connected to the offset cancellation circuit 90[n], the wiring WX[1], the wiring WX[i], and the wiring WX[m]. The other block diagrams, wirings, and reference numerals are not illustrated.

When the arithmetic circuit 201B illustrated in FIG. 20 is configured, a plurality of calculations of the formula (3.1) can be performed at the same time. While in the description of the arithmetic circuit 201A illustrated in FIG. 19, $z_j^{(k)}$ is calculated with a focus put on the neuron $N_j^{(k)}$ of the k-th layer illustrated in FIG. 18, with the use of the arithmetic circuit 201B illustrated in FIG. 20, $z_1^{(k)}$ to $z_n^{(k)}$ output from the neuron $N_1^{(k)}$ to the neuron $N_n^{(k)}$, respectively, of the k-th layer illustrated in FIG. 18 can be calculated at the same time.

Specifically, as a weight coefficient between the neuron $N_i^{(k-1)}$ and the neuron $N_1^{(k)}$, a voltage $w_i^{(k-1)}{}_1^{(k)}$ is retained in the node sn1 of the circuit 10[i] of the memory cell array MCA[1], and $w_0$ is retained in the node sn1 of the circuit 10r[i] of the memory cell array MCA[1]. As a weight coefficient between the neuron $N_i^{(k-1)}$ and the neuron $N_n^{(k)}$, a voltage $wi^{(k-1)}n^{(k)}$ is retained in the node sn1 of the circuit 10[i] of the memory cell array MCA[n], and $w_0$ is retained in the node sn1 of the circuit 10r[i] of the memory cell array MCA[n]. Although not illustrated in FIG. 20, as a weight coefficient between the neuron $N_i^{(k-1)}$ and the neuron $N_j^{(k)}$, a voltage $w_i^{(k-1)}{}_j^{(k)}$ is retained in the node sn1 of the circuit 10[j] of the memory cell array MCA[], and $w_0$ is retained in the node sn1 of the circuit 10r[i] of the memory cell array MCA[1].

After that, as in the arithmetic circuit 201A in FIG. 19, the offset cancellation circuit 90[1], the memory cell array MCA[1], and the driver circuit 110 are operated, so that $u_1^{(k)}$ input to the neuron $N_n^{(k)}$ in the reading circuit 120[1] can be calculated. The offset cancellation circuit 90[n], the memory cell array MCA[n], and the driver circuit 110 are operated, so that $u_n^{(k)}$ input to the neuron $N_n^{(k)}$ in the reading circuit 120[n] can be calculated. Although not illustrated in FIG. 20, the offset cancellation circuit 90[j], the memory cell array MCA[], and the driver circuit 110 are operated, so that $u_j^{(k)}$ input to the neuron $N_j^{(k)}$ in the reading circuit 120[j] can be calculated. After that, $z_1^{(k)}$ to $z_n^{(k)}$ can be determined from $u_1^{(k)}$ to $u_n^{(k)}$ by the reading circuit 120[1] to the reading circuit 120[n], respectively.

In the arithmetic circuit 201B in FIG. 20, the voltage $w_0$ is retained in the node sn1 of each of the circuits 10r[1] to 10r[m] included in the memory cell arrays MCA[1] to MCA[n], respectively. Accordingly, currents flowing through the wirings WXr electrically connected to the offset cancellation circuits 90[1] to 90[n] are equal in amount. In other words, when the voltage $d_0$ is applied to all of the wirings VX[1] to VX[m], the equal currents $I_2$ flow through the wiring WXr electrically connected to the offset cancellation circuits 90[1] to 90[n]; when voltages $d_0+z_1^{(k-1)}$ to $d_0+z_m^{(k-1)}$ are applied to the wirings VX[1] to VX[m], respectively, the equal currents $I_4$ flow through the wirings WXr electrically connected to the offset cancellation circuits 90[1] to 90[n].

Figure 21:
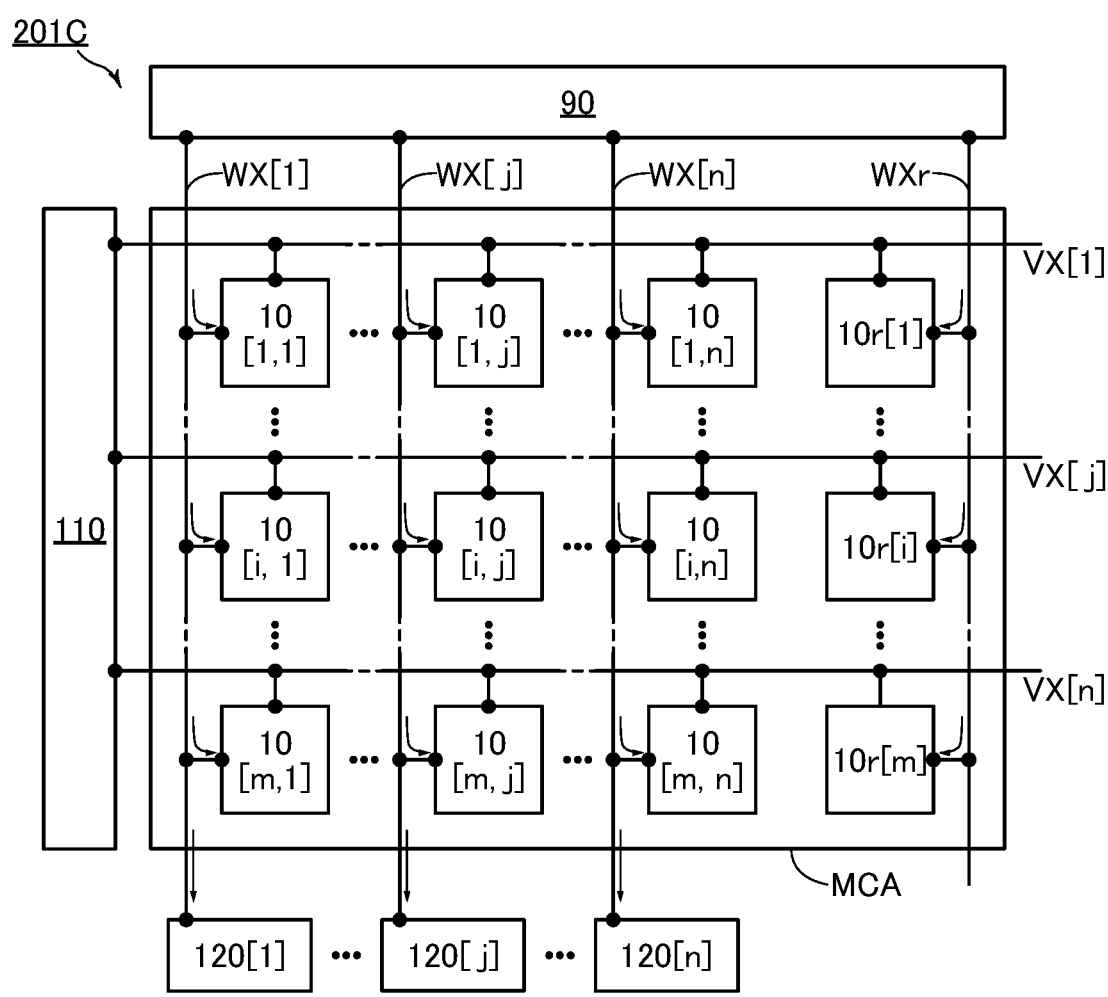
FIG. 21 is a block diagram showing a configuration example of a circuit included in a semiconductor device.

Thus, the arithmetic circuit 201B in FIG. 20 can be changed to have a configuration in which the circuits 10r[1] to 10r[m] are shared between the memory cell arrays MCA[1] to MCA[n]. Such a configuration is illustrated in FIG. 21. An arithmetic circuit 201C has a configuration in which the memory cell arrays MCA[1] to MCA[n] are combined into one memory cell array MCA. The memory cell array MCA includes circuits 10[1,1] to 10[m,n], and includes circuits 10r[i] as replica circuits in the rows corresponding to the circuits 10[i,1] to 10[i,n]. In other words, the memory cell array MCA has a configuration in which mxn circuits 10 and mx1 circuits 10r are arranged in a matrix of m×(n+1).

The offset cancellation circuit 90 is electrically connected to the memory cell array MCA through a wiring WX[j]. The wiring WX[j] is electrically connected to circuits 10[1A] to 10[m, j] and the reading circuit 120[j]. The offset cancellation circuit 90 illustrated in FIG. 21 is capable of canceling offset currents flowing through the wirings WX[1] to WX[n], referring to the current flowing through the wiring WXr.

In the arithmetic circuit 201C, $u_1^{(k)}$ to $u_n^{(k)}$ input to the neuron $N_1^{(k)}$ to the neuron $N_n^{(k)}$, respectively, can be calculated by the operation similar to that of the arithmetic circuit 201B.

Figure 22B:
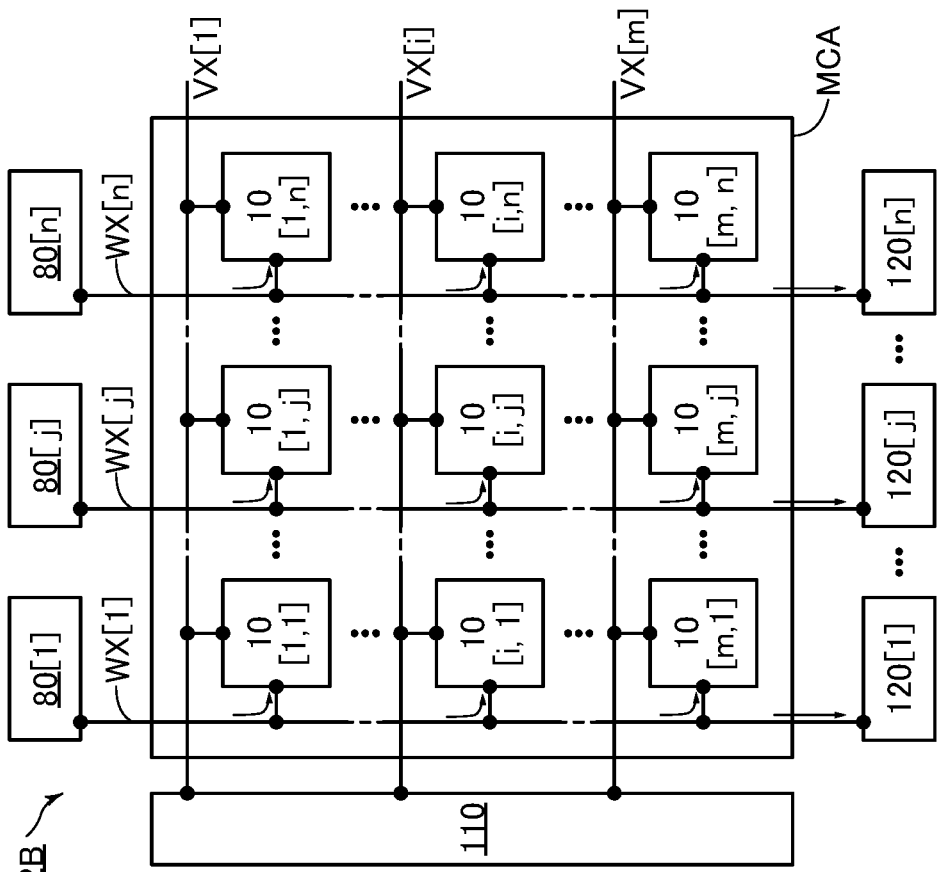
FIGS. 22(A) and 22(B) are block diagrams showing configuration examples of a circuit included in a semiconductor device.
Figure 22A:
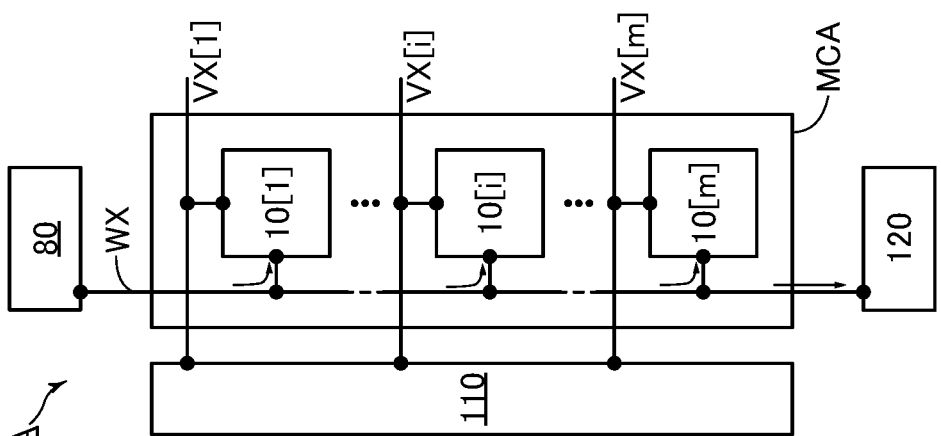

FIG. 22(A) is a block diagram showing a configuration example of an arithmetic circuit to which the offset cancellation circuit 80 described in Embodiment 4 is applied as an offset cancellation circuit. An arithmetic circuit 202A includes the offset cancellation circuit 80, the driver circuit 110, the reading circuit 120, and the memory cell array MCA.

The memory cell array MCA includes m×1 memory cells. In FIG. 22(A), the memory cells are arranged in a matrix of m rows and 1 column. In particular, the circuit 10 described in the above embodiments is applied to memory cell of the memory cell array MCA illustrated in FIG. 22(A). Note that in this embodiment, the circuit 10 in the i-th row is referred to as the circuits 10[i].

The reading circuit 120 described in Embodiment 4 can be applied to the reading circuit 120.

Note that the description in Embodiment 4 is taken into consideration in the electrical connection between the offset cancellation circuit 80 and the circuits 10[1] to 10[m], and the reading circuit 120. In other words, the wiring WX is electrically connected to the terminal ct2 of the circuit CS2. The wiring WX is electrically connected to the node wx of each of the circuits 10[1] to 10[m] and the node inro of the reading circuit 120.

The driver circuit 110 has a function of supplying a predetermined signal (or a voltage) to the node vx of the circuit 10 through the wiring VX. Note that in FIG. 22(A), the arithmetic circuit 202A has a configuration including m wirings VX because the memory cell array MCA has the m rows. In this embodiment, the wiring VX in the i-th row is referred to as a wiring VX[i]. The driver circuit 108 described in Embodiment 1 can be used as the driver circuit 110.

The arithmetic circuit 202A illustrated in FIG. 22(A) is configured, whereby calculation of the formula (3.1) can be performed. Next, an operation example of the arithmetic circuit 202A is described below. Note that in the following description, a voltage corresponding to the weight coefficient $w_i^{(k-1)}{}_j^{(k)}$ and a voltage corresponding to the output signal $z_i^{(k-1)}$ are referred to as the voltage $w_i^{(k-1)}{}_j^{(k)}$ and a voltage $z_i^{(k-1)}$, respectively, as in the descriptions of FIG. 19 to FIG. 21.

For example, a method of calculating $u^{(k)}$ input to the neuron $N_j^{(k)}$ is described.

First, the voltage $w_0$ is retained in the node sn1 of the circuit 10[i] in the first operation described in Embodiment 4. After that, the voltage $d_0$ is applied to the wiring VX[i], whereby the current $I_4$ shown in the formula (3.6) can be output from the offset cancellation circuit 80.

Next, the voltage $w_0$ is retained in the node sn1 in the circuit 10[i] in the second operation described in Embodiment 4. After that, the voltage $d_0+z_i^{(k-1)}$, where $z_i^{(k-1)}$ represents a signal input from the neuron $N_i^{(k-1)}$ to the neuron $N_j^{(k)}$, is applied to the wiring VX[i], whereby the current $I_2$ shown in the formula (3.4) can be output from the offset cancellation circuit 80.

In the third operation described in Embodiment 4, the voltage $w_0+w_i^{(k-1)}{}_j^{(k)}$ is retained in the node sn1 of the circuit 10[i], where $w_i^{(k-1)}{}_j^{(k)}$ represents the weight coefficient between $N_i^{(k-1)}$ and the neuron $N_j^{(k)}$. After that, the voltage $d_0$ is applied to the wiring VX[i], whereby the current $I_3$ shown in the formula (3.5) can be output from the offset cancellation circuit 80.

Then, the voltage $w_0+w_i^{(k-1)}{}_j^{(k)}$ is retained in the node sn1 in the circuit 10[i] in the fourth operation described in Embodiment 4. After that, the voltage $d_0+z_i^{(k-1)}$ is applied to the wiring VX[i], whereby the current $I_1$ shown in the formula (3.3) can be output from the offset cancellation circuit 80. At this time, the offset current is canceled by the operation of the offset cancellation circuit 80. Thus, the current value according to the value that is the sum of the products of the signals $z_i^{(k-1)}$ input from the neuron $N_i^{(k-1)}$ to the neuron $N_j^{(k)}$ and the weight coefficients $w_i^{(k-1)}{}_j^{(k)}$ between $N_i^{(k-1)}$ and the neuron $N_j^{(k)}$ where i is varied from 1 to m, that is, the formula (3.7) can be output. After that, the current of the formula (3.7) is supplied to the reading circuit 120, whereby the formula (3.1) input to the neuron $N_j^{(k)}$ can be determined.

The arithmetic circuit of the activation function for calculating the formula (3.2) is included in the reading circuit 120, whereby the output signal $z_j^{(k)}$ of the neuron $N_j^{(k)}$ can be output from the reading circuit 120.

FIG. 22(B) shows a configuration example of another arithmetic circuit different from the arithmetic circuit 202A. An arithmetic circuit 202B includes n offset cancellation circuits 80 and n reading circuits 120 included in the arithmetic circuit 202A. The memory cell array MCA of the arithmetic circuit 202B includes the mxn circuits 10, and the circuits 10 are arranged in a matrix of m rows and n columns. Note that in FIG. 22(B), the n offset cancellation circuits 80 are referred to as offset cancellation circuits 80[1] to 80[n], respectively, and n reading circuits 120 are referred to as reading circuits 120[1] to 120[n].

The arithmetic circuit 202B includes the driver circuit 110 similar to that of the arithmetic circuit 202A, and the driver circuit 110 is electrically connected to the memory cell array MCA through the wirings VX[1] to VX[m].

FIG. 22(B) illustrates the arithmetic circuit 202B, the offset cancellation circuits 80[1], 80[j], and 80[n], the memory cell array MCA, the reading circuits 120[1], 120[j], and 120[n], the driver circuit 110, the circuit 10[1,1], the circuit 10[i,1], the circuit 10[m,1], the circuit 10[1,j], the circuit 10[i,j], the circuit 10[m,j], the circuit 10[1,n], the circuit 10[i,n], the circuit 10[m,n], the wiring WX[1], the wiring WX[j], the wiring WX[n], the wiring VX[1], the wiring VX[i], the wiring VX[m], and the memory cell array MCA. The other block diagrams, wirings, and reference numerals are not illustrated.

When the arithmetic circuit 202B illustrated in FIG. 22(B) is configured, a plurality of calculations of the formula (3.1) can be performed at the same time. While in the description of the arithmetic circuit 202A illustrated in FIG. 22(A), $z_j^{(k)}$ is calculated with a focus put on the neuron $N_j^{(k)}$ of the k-th layer illustrated in FIG. 18, with the use of the arithmetic circuit 202B illustrated in FIG. 22(B), $z_1^{(k)}$ to $z_n^{(k)}$ input to the neuron $N_1^{(k)}$ to the neuron $N_n^{(k)}$, respectively, of the k-th layer illustrated in FIG. 18 can be calculated at the same time.

Note that the arithmetic circuit included in the semiconductor device according to one embodiment of the present invention is not limited to the arithmetic circuit described in this embodiment. The arithmetic circuit included in the semiconductor device according to one embodiment of the present invention can have a configuration in which the arithmetic circuit described in this embodiment is changed as appropriate.

Note that this embodiment can be combined with other embodiments in this specification as appropriate.

Embodiment 6

In this embodiment, an example of a structure of an OS transistor that can be used in the semiconductor device described in the above embodiment will be described.
<Structure Example of Semiconductor Device>

Figure 23:
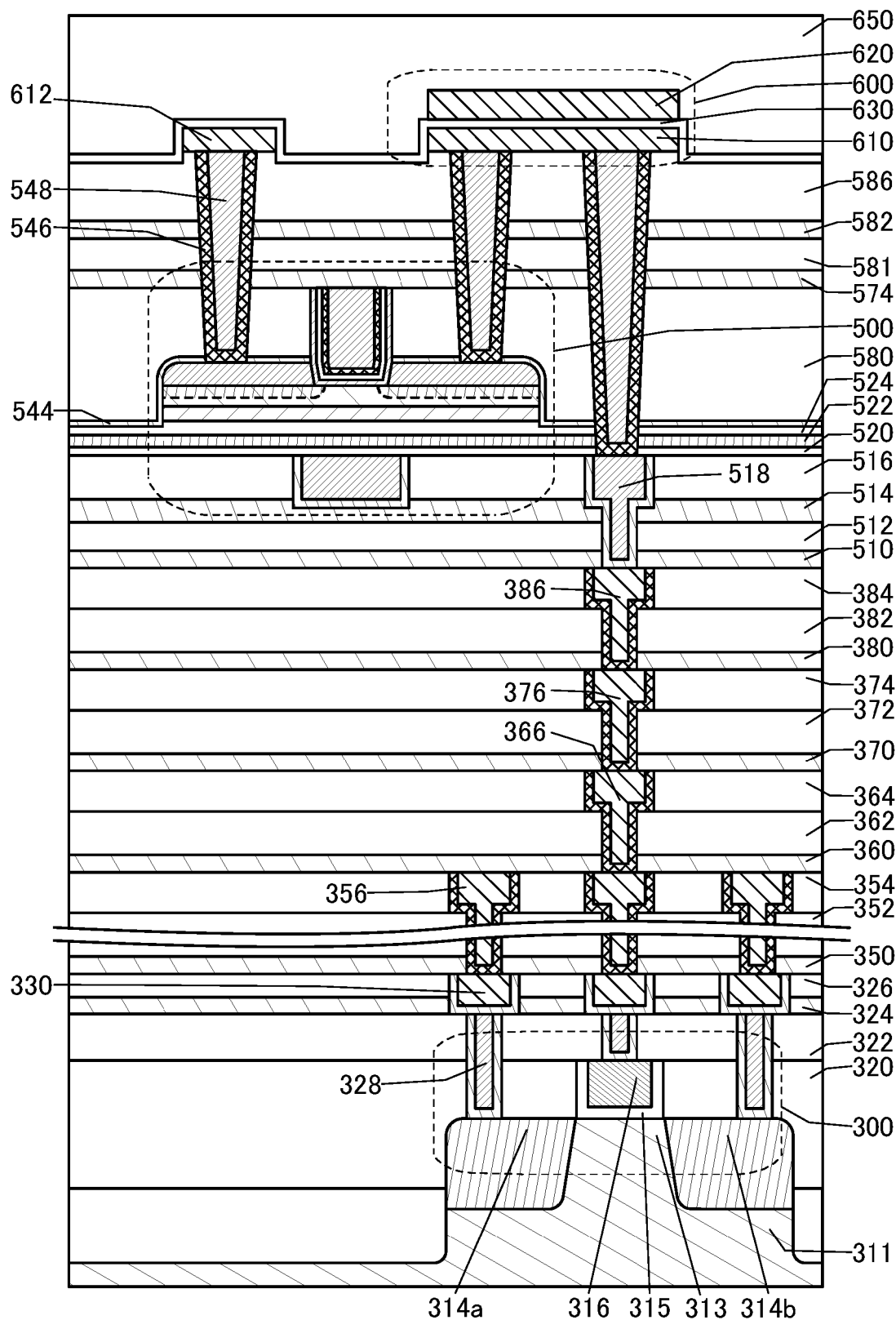
FIG. 23 is a cross-sectional view showing a configuration example of a semiconductor device.
Figure 25A:
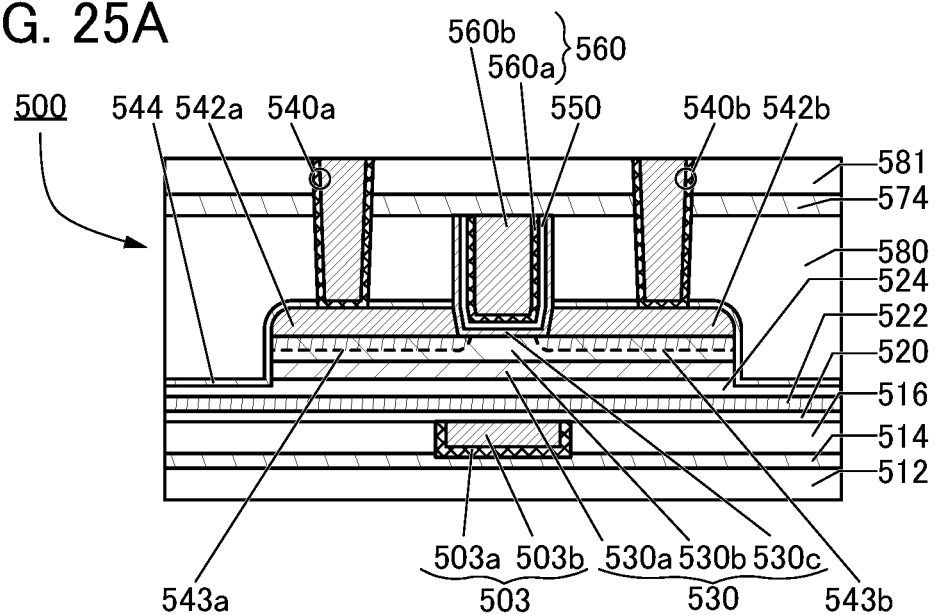
FIGS. 25(A), 25(B), and 25(C) are cross-sectional views showing a structure example of a semiconductor device.
Figure 25B:
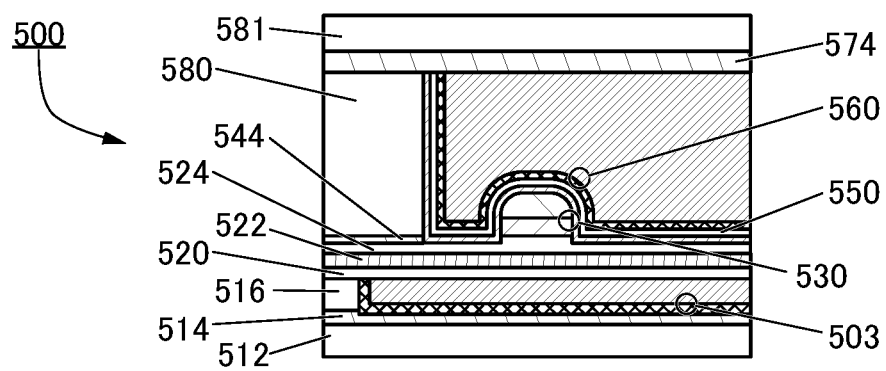
Figure 25C:
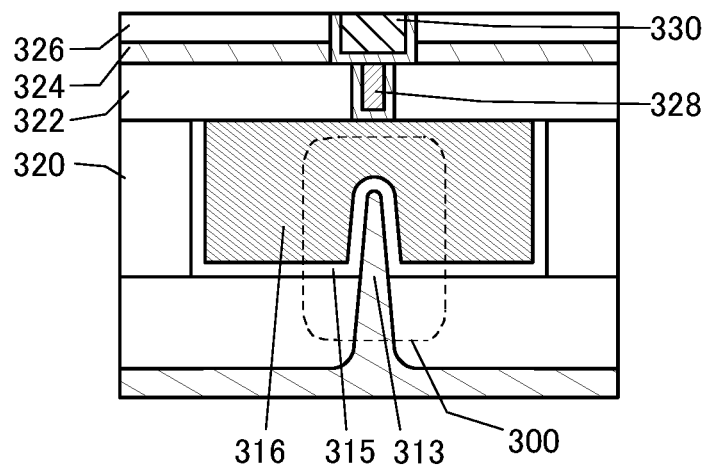

A semiconductor device illustrated in FIG. 23 includes a transistor 300, a transistor 500, and a capacitor 600. FIG. 25(A) is a cross-sectional view of the transistor 500 in the channel length direction, FIG. 25(B) is a cross-sectional view of the transistor 500 in the channel width direction, and FIG. 25(C) is a cross-sectional view of the transistor 300 in the channel width direction.

The transistor 500 is a transistor including a metal oxide in its channel formation region (an OS transistor). Since the off-state current of the transistor 500 is low, written data can be retained for a long time when this transistor is used in a semiconductor device, particularly as the transistors M2 and M3 in the circuit 10, the transistors MA1 and MA2 in the current supply circuit 30, the transistors M24, M29, and M34 in the offset cancellation circuit 80, or the like. In other words, power consumption of the semiconductor device can be reduced because the semiconductor device has a low frequency of refresh operation or requires no refresh operation.

The semiconductor device described in this embodiment includes the transistor 300, the transistor 500, and the capacitor 600 as illustrated in FIG. 23. The transistor 500 is provided above the transistor 300, and the capacitor 600 is provided above the transistor 300 and the transistor 500. Note that, for example, the capacitor C1 in the circuit 10 can be used as the capacitor 600.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. Note that the transistor 300 can be used as the transistor M1 in the above embodiment, for example.

In the transistor 300, the top surface and the side surface in the channel width direction of the semiconductor region 313 are covered with the conductor 316 with the insulator 315 therebetween, as illustrated in FIG. 25(C). Such a Fin-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 may be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 24:
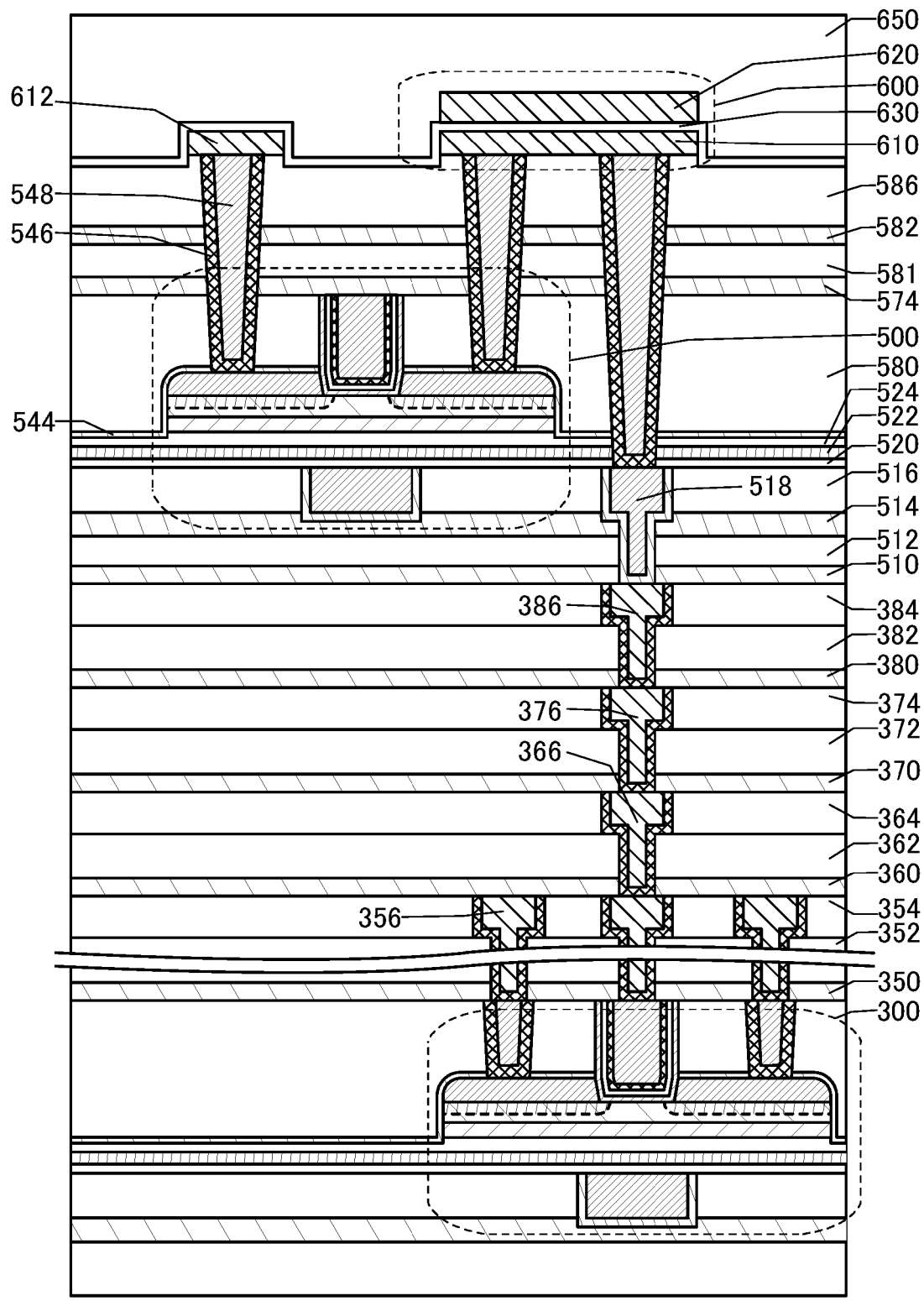
FIG. 24 is a cross-sectional view showing a configuration example of a semiconductor device.

Note that the transistor 300 illustrated in FIG. 23 is just an example and is not limited to having the structure shown therein; an appropriate transistor can be used in accordance with a circuit configuration or a driving method. For example, when the semiconductor device is a single-polarity circuit composed only of OS transistors, the transistor 300 may have a structure similar to that of the transistor 500 using an oxide semiconductor, as illustrated in FIG. 24. Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 500 is provided.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10\times10^{15}$ atoms/cm$^2$, preferably less than or equal to $5\times10^{15}$ atoms/cm$^2$ in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. The use of a material having a low permittivity for an interlayer film can reduce the parasitic capacitance between wirings.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 23, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. With this structure, the transistor 300 and the transistor 500 can be separated by the barrier layer, so that the diffusion of hydrogen from the transistor 300 to the transistor 500 can be inhibited.

Note that as the conductor having a barrier property against hydrogen, tantalum nitride can be used, for example. Stacking tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 23, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 23, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 23, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less or five or more.

An insulator 510, an insulator 512, an insulator 514, and an insulator 516 are stacked in this order over the insulator 384. A material with a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents hydrogen or impurities from the substrate 311, a region where the transistor 300 is provided, or the like from diffusing to a region where the transistor 500 is provided. Therefore, a material similar to that for the insulator 324 can be used.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Thus, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. The use of a material with a relatively low permittivity for these insulators can reduce the parasitic capacitance between wirings. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be formed using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 to the transistor 500 can be inhibited.

The transistor 500 is provided over the insulator 516.

As illustrated in FIG. 25(A) and FIG. 25(B), the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and has an opening between the conductor 542a and the conductor 542b, an oxide 530c positioned on a bottom surface and a side surface of the opening, an insulator 550 positioned on the formation surface of the oxide 530c, and a conductor 560 positioned on the formation surface of the insulator 550.

As illustrated in FIG. 25(A) and FIG. 25(B), an insulator 544 is preferably provided between the insulator 580 and the oxide 530a, the oxide 530b, the conductor 542a, and the conductor 542b. As illustrated in FIG. 25(A) and FIG. 25(B), the conductor 560 preferably includes a conductor 560a provided on the inner side of the insulator 550 and a conductor 560b provided to be embedded on the inner side of the conductor 560a. As illustrated in FIG. 25(A) and FIG. 25(B), an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has a structure where the three layers of the oxide 530a, the oxide 530b, and the oxide 530c are stacked in the region where the channel is formed and its vicinity; however, the present invention is not limited to this. For example, the transistor may have a single-layer structure of the oxide 530b, a two-layer structure of the oxide 530b and the oxide 530a, a two-layer structure of the oxide 530b and the oxide 530c, or a stacked-layer structure of four or more layers. Although the conductor 560 is shown to have a two-layer structure in the transistor 500, the present invention is not limited to this. For example, the conductor 560 may have a single-layer structure or a stacked-layer structure of three or more layers. The transistor 500 illustrated in FIG. 23, FIG. 25(A), and FIG. 25(B) is just an example and is not limited to the structure shown therein; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is embedded in an opening of the insulator 580 and the region between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and the conductors 542a and 542b can be reduced. As a result, the transistor 500 can have increased switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be smaller in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of an opening in the insulator 514 and the insulator 516, and a conductor 503b is formed on the inner side. Although the transistor 500 in which the conductor 503a and the conductor 503b are stacked is illustrated, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom (a conductive material through which the above impurities are less likely to pass). Alternatively, the conductor 503a is preferably formed using a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, the conductor 503b is preferably formed using a conductive material that has high conductivity and contains tungsten, copper, or aluminum as its main component. In that case, a conductor 505 does not always need to be provided. Note that the conductor 503b is a single layer in the diagram but may have a stacked-layer structure, for example, a stacked-layer structure of titanium or titanium nitride and any of the above conductive materials.

The insulator 520, the insulator 522, and the insulator 524 have a function of a second gate insulating film.

Here, as the insulator 524 in contact with the oxide 530, an insulator containing more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced, and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

When the insulator 524 includes an excess-oxygen region, the insulator 522 preferably has a function of inhibiting diffusion of oxygen (e.g., oxygen atoms and oxygen molecules) (or that the insulator 522 be less likely to transmit the above oxygen).

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO3), or (Ba,Sr)TiO3 (BST). As miniaturization and high integration of transistors progress, a problem such as generation of leakage current may arise because of a thinner gate insulating film. When a high-k material is used for an insulator functioning as the gate insulating film, a gate potential at the time when the transistor operates can be reduced while the physical thickness of the gate insulating film is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator which is a high-k material is combined with silicon oxide or silicon oxynitride, the insulator 520 having a stacked-layer structure that has thermal stability and a high dielectric constant can be obtained.

Note that the transistor 500 in FIG. 25(A) and FIG. 25(B) includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, the stacked layers are not necessarily formed of the same material and may be formed of different materials.

In the transistor 500, a metal oxide functioning as an oxide semiconductor is preferably used as the oxide 530 including a channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. The In-M-Zn oxide that can be used as the oxide 530 is particularly preferably a CAAC-OS or a CAC-OS each of which will be described in Embodiment 4. Alternatively, an In-Ga oxide or an In-Zn oxide may be used as the oxide 530.

The metal oxide functioning as the channel formation region in the oxide 530 has a band gap of preferably 2 eV or higher, further preferably 2.5 eV or higher. The use of a metal oxide having a wide band gap can reduce the off-state current of the transistor.

By including the oxide 530a under the oxide 530b, the oxide 530 can inhibit diffusion of impurities into the oxide 530b from the components formed below the oxide 530a. By including the oxide 530c over the oxide 530b, the oxide 530 can inhibit diffusion of impurities into the oxide 530b from the components formed above the oxide 530c.

The oxide 530 preferably has a stacked-layer structure of oxides that differ in the atomic ratio of metal atoms. Specifically, the atomic proportion of the element M to the constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Furthermore, the atomic ratio of In to the element M in the metal oxide used as the oxide 530b is preferably greater than that in the metal oxide used as the oxide 530a. The oxide 530c can be formed using a metal oxide that can be used as the oxide 530a or the oxide 530b.

The energy of the conduction band minimum of the oxide 530a and the oxide 530c is preferably higher than that of the oxide 530b. In other words, the electron affinity of the oxide 530a and the oxide 530c is preferably smaller than that of the oxide 530b.

Here, the energy level of the conduction band minimum is gradually varied at junction portions of the oxide 530a, the oxide 530b, and the oxide 530c. In other words, the energy level of the conduction band minimum at the junction portions of the oxide 530a, the oxide 530b, and the oxide 530c is continuously varied or continuously connected. To vary the energy level gradually, the density of defect states in a mixed layer formed at the interface between the oxide 530a and the oxide 530b and the interface between the oxide 530b and the oxide 530c is decreased.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In-Ga-Zn oxide, it is preferable to use an In-Ga-Zn oxide, a Ga-Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542a and the conductor 542b each having a single-layer structure are illustrated in FIG. 25(A), a stacked-layer structure of two or more layers may be employed. For example, a tantalum nitride film and a tungsten film can be stacked. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed over the aluminum film or the copper film; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 25(A), a region 543a and a region 543b are sometimes formed as low-resistance regions in the oxide 530 at and around the interface with the conductor 542a (the conductor 542b). In this case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In such cases, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide or silicon nitride can be used as the insulator 544, for example.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate is preferable because it has higher heat resistance than a hafnium oxide film and thus is less likely to be crystallized by heat treatment in later steps. Note that the insulator 544 is not an essential component when the conductor 542a and the conductor 542b are an oxidation-resistant material or $d_0$ not significantly lose the conductivity even after absorbing oxygen. Design is appropriately determined in consideration of required transistor characteristics.

The insulator 544 can inhibit impurities such as water and hydrogen contained in the insulator 580 from diffusing into the oxide 530b through the oxide 530c and the insulator 550. The insulator 544 can also inhibit oxidation of the conductor 560 due to excess oxygen contained in the insulator 580.

The insulator 550 functions as a first gate insulating film. The insulator 550 is preferably in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably inhibits oxygen diffusion from the insulator 550 to the conductor 560. Providing the metal oxide that inhibits oxygen diffusion suppresses diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be suppressed. For the metal oxide, a material that can be used for the insulator 544 is used.

Note that the insulator 550 may have a stacked-layer structure like the second gate insulating film. With miniaturization and high integration of transistors, a problem such as leakage current may arise because of a thinner gate insulating film. For that reason, when the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high dielectric constant.

Although the conductor 560 functioning as the first gate electrode has a two-layer structure in FIG. 25(A) and FIG. 25(B), the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., N2O, NO, and NO2), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation of the conductor 560b caused by oxygen in the insulator 550. As a conductive material having a function of inhibiting oxygen diffusion, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electric resistance to be a conductor. Such a conductor is referred to as an OC (Oxide Conductor) electrode.

The conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening in the insulator 580 overlaps with the region between the conductor 542a and the conductor 542b. Accordingly, the conductor 560 is embedded in the opening of the insulator 580 and the region between the conductor 542a and the conductor 542b.

For miniaturization of the semiconductor device, the gate length needs to be short, but it is necessary to prevent a reduction in conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with the top surface of the insulator 580, the top surface of the conductor 560, and the top surface of the insulator 550. When the insulator 574 is formed by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, an aluminum oxide film formed by a sputtering method can serve both as an oxygen supply source and as a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in openings formed in the insulator 581, the insulator 574, the insulator 580, and the insulator 544. The conductor 540a and the conductor 540b are provided to face each other with the conductor 560 positioned therebetween. The conductor 540a and the conductor 540b each have a structure similar to that of a conductor 546 and a conductor 548 that will be described later.

An insulator 582 is provided over the insulator 581. A substance having a barrier property against oxygen and hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. The insulator 586 can be formed using a material similar to that for the insulator 320. The use of a material with a relatively low permittivity for these insulators can reduce the parasitic capacitance between wirings. For example, a silicon oxide film or a silicon oxynitride film can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be formed using a material similar to those for the conductor 328 and the conductor 330.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 23; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 positioned therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be formed using a material similar to that for the insulator 320. The insulator 650 may function as a planarization film that covers an uneven shape thereunder.

With the use of this structure, a change in electrical characteristics can be reduced and the reliability can be improved in a semiconductor device including a transistor including an oxide semiconductor. Alternatively, a semiconductor device using a transistor including an oxide semiconductor can be miniaturized or highly integrated.

<Structure Examples of Transistors>

The structure of the transistor 500 in the semiconductor device described in this embodiment is not limited to the above. Structure examples that can be used for the transistor 500 will be described below. Note that transistors described below are variation examples of the above transistor; therefore, differences from the above transistor are mainly described below and the description of portions identical to the above is sometimes omitted.

<<Transistor Structure Example 1>>

A structure example of a transistor 500A will be described with reference to FIG. 26(A) to FIG. 26(C). FIG. 26(A) is a top view of the transistor 500A. FIG. 26(B) is a cross-sectional view of a portion along the dashed-dotted line L1-L2 in FIG. 26(A). FIG. 26(C) is a cross-sectional view of a portion along the dashed-dotted line W1-W2 in FIG. 26(A). Note that for simplification of the drawing, some components are not illustrated in the top view in FIG. 26(A).

The transistor 500A illustrated in FIG. 26(A) to FIG. 26(C) includes an insulator 511 functioning as an interlayer film and the conductor 505 functioning as a wiring in addition to the transistor 500 illustrated in FIG. 25(A).

In the transistor 500A illustrated in FIG. 26(A) to FIG. 26(C), the oxide 530c, the insulator 550, and the conductor 560 are provided in an opening portion in the insulator 580 with the insulator 544 positioned therebetween. Moreover, the oxide 530c, the insulator 550, and the conductor 560 are provided between the conductor 542a and the conductor 542b.

As the insulator 511, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film for inhibiting impurities such as water or hydrogen from entering the transistor 500A from the substrate side. Accordingly, the insulator 511 is preferably formed using an insulating material having a function of inhibiting diffusion of impurities such as a hydrogen atom, a hydrogen molecule, a water molecule, and a copper atom (an insulating material through which the above impurities are less likely to pass). Alternatively, the insulator 511 is preferably formed using an insulating material having a function of inhibiting diffusion of oxygen (e.g., at least one of oxygen atoms, oxygen molecules, and the like) (an insulating material through which the above oxygen is less likely to pass). Further alternatively, aluminum oxide or silicon nitride, for example, may be used for the insulator 511. Such a structure can inhibit diffusion of impurities such as hydrogen or water into the transistor 500A from the substrate side through the insulator 511.

For example, the permittivity of the insulator 512 is preferably lower than that of the insulator 511. The use of a material having a low permittivity for the interlayer film can reduce the parasitic capacitance between wirings.

The conductor 505 is formed to be embedded in the insulator 512. Here, the top surface of the conductor 505 and the top surface of the insulator 512 can be at substantially the same level. Although the conductor 505 is shown as a single layer in FIG. 26, the present invention is not limited to this. For example, the conductor 505 may have a multilayer structure of two or more layers. The conductor 505 is preferably formed using a conductive material that has high conductivity and contains tungsten, copper, or aluminum as its main component.

Like the insulator 511 or the insulator 512, the insulator 514 and the insulator 516 function as interlayer films. For example, the insulator 514 preferably functions as a barrier film for inhibiting impurities such as water or hydrogen from entering the transistor 500A from the substrate side. This structure can inhibit diffusion of impurities such as hydrogen or water into the transistor 500A side from the substrate side through the insulator 514. Moreover, for example, the insulator 516 preferably has a lower permittivity than the insulator 514. The use of a material having a low permittivity for the interlayer film can reduce the parasitic capacitance between wirings.

The insulator 522 preferably has a barrier property. The insulator 522 having a barrier property functions as a layer that inhibits entry of impurities such as hydrogen into the transistor 500A from the surroundings of the transistor 500A.

Note that the oxide 530c is preferably provided in the opening portion in the insulator 580 with the insulator 544 positioned therebetween. When the insulator 544 has a barrier property, diffusion of impurities from the insulator 580 into the oxide 530 can be inhibited.

A barrier layer may be provided over the conductor 542a and the conductor 542b. The barrier layer is preferably formed using a material having a barrier property against oxygen or hydrogen. This structure can inhibit oxidation of the conductor 542a and the conductor 542b at the time of forming the insulator 544.

For the barrier layer, for example, a metal oxide can be used. In particular, an insulating film of aluminum oxide, hafnium oxide, gallium oxide, or the like, which has a barrier property against oxygen and hydrogen, is preferably used. Alternatively, silicon nitride deposited by a CVD method may be used.

When the barrier layer is included, the range of choices for the material of the conductor 542a and the conductor 542b can be expanded. For example, the conductor 542a and the conductor 542b can be formed using a material with a low oxidation resistance and high conductivity, such as tungsten or aluminum. Furthermore, a conductor that can be easily deposited or processed can be used, for example.

The insulator 550 functions as a first gate insulating film. The insulator 550 is preferably provided in the opening portion in the insulator 580 with the oxide 530c and the insulator 544 positioned therebetween.

Like the conductor 503, the conductor 540a and the conductor 540b can be a single layer or stacked layers using a conductive material such as a metal material, an alloy material, a metal nitride material, or a metal oxide material. For example, a high-melting-point material having both heat resistance and conductivity, such as tungsten or molybdenum, is preferably used. Alternatively, a low-resistance conductive material such as aluminum or copper is preferably used. The use of a low-resistance conductive material can reduce wiring resistance.

For example, by employing a stacked-layer structure of tantalum nitride or the like, which is a conductor having a barrier property against hydrogen and oxygen, and tungsten, which has high conductivity, the conductor 540a and the conductor 540b can inhibit diffusion of impurities from the outside while maintaining conductivity as wirings.

The above structure makes it possible to provide a semiconductor device including a transistor that contains an oxide semiconductor and has a high on-state current. Alternatively, a semiconductor device including a transistor that contains an oxide semiconductor and has a low off-state current can be provided. Alternatively, a semiconductor device that has small variation in electrical characteristics, stable electrical characteristics, and high reliability can be provided.

<<Transistor Structure Example 2>>

Figure 27A:
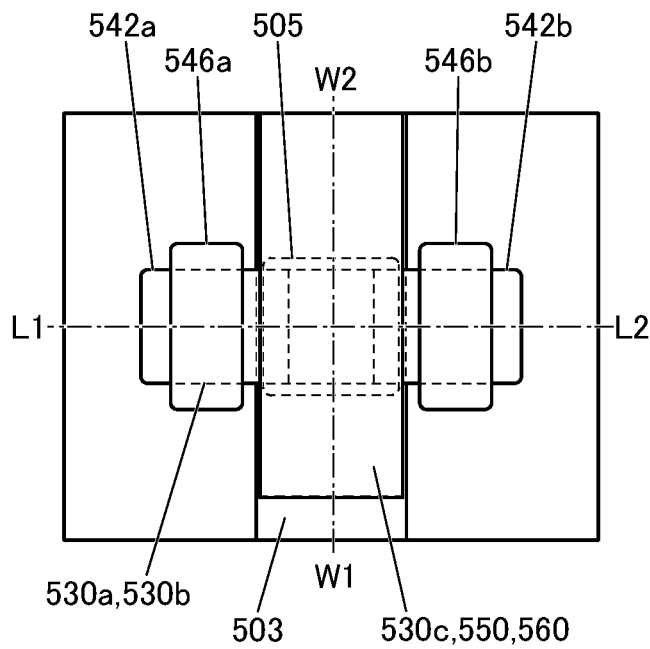
FIG. 27(A) is a top view showing a structure example of a transistor.
Figure 27C:
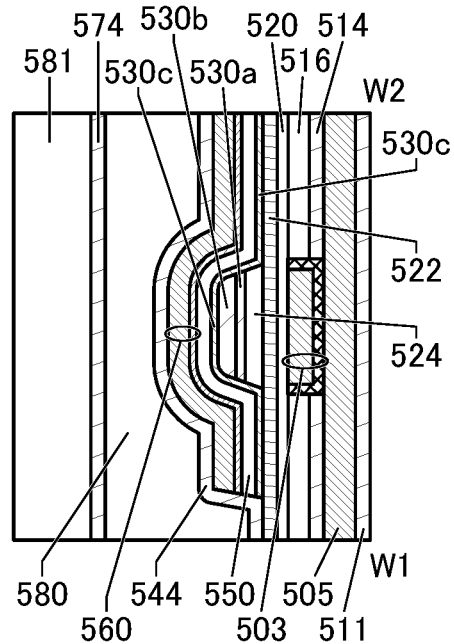
FIGS. 27(B) and 27(C) are cross-sectional views showing the structure example of the transistor.
Figure 27B:
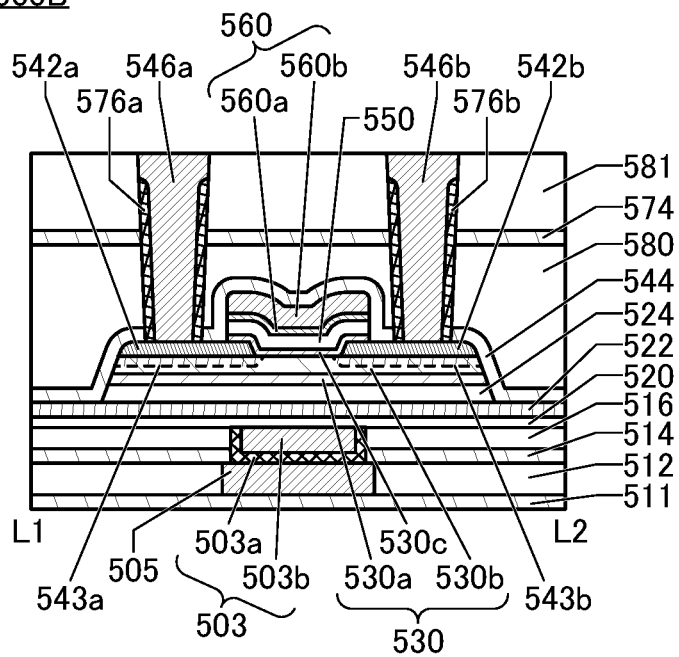

A structure example of a transistor 500B will be described with reference to FIG. 27(A) to FIG. 27(C). FIG. 27(A) is a top view of the transistor 500B. FIG. 27(B) is a cross-sectional view of a portion along the dashed-dotted line L1-L2 in FIG. 27(A). FIG. 27(C) is a cross-sectional view of a portion along the dashed-dotted line W1-W2 in FIG. 27(A). Note that for simplification of the drawing, some components are not illustrated in the top view in FIG. 27(A).

The transistor 500B is a variation example of the transistor 500A. Therefore, differences from the transistor 500A are mainly described to avoid repeated description.

The transistor 500B includes a region where the conductor 542a (the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as a first gate electrode includes the conductor 560a and the conductor 560b over the conductor 560a. Like the conductor 503a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 544 is preferably provided to cover a top surface and a side surface of the conductor 560, a side surface of the insulator 550, and a side surface of the oxide 530c.

The insulator 544 can inhibit oxidation of the conductor 560. Moreover, the insulator 544 can inhibit diffusion of impurities such as water and hydrogen contained in the insulator 580 into the transistor 500B.

A contact plug of the transistor 500B has a structure different from that of the contact plug of the transistor 500A. In the transistor 500B, an insulator 576a (an insulator 576b) having a barrier property is provided between the insulator 580 and the conductor 546a (the conductor 546b) serving as a contact plug. Providing the insulator 576a (the insulator 576b) can prevent oxygen in the insulator 580 from reacting with the conductor 546 and oxidizing the conductor 546.

Furthermore, with the insulator 576a (the insulator 576b) having a barrier property, the range of choices for the materials for the conductors used as plugs and wirings can be expanded. The use of a metal material having an oxygen absorbing property and high conductivity for the conductor 546a (the insulator 546b), for example, can provide a semiconductor device with low power consumption. Specifically, it is possible to use a material with a low oxidation resistance and high conductivity, such as tungsten or alumi-

51 num. Furthermore, a conductor that can be easily formed or processed can be used, for example.

<<Transistor Structure Example 3>>

Figure 28A:
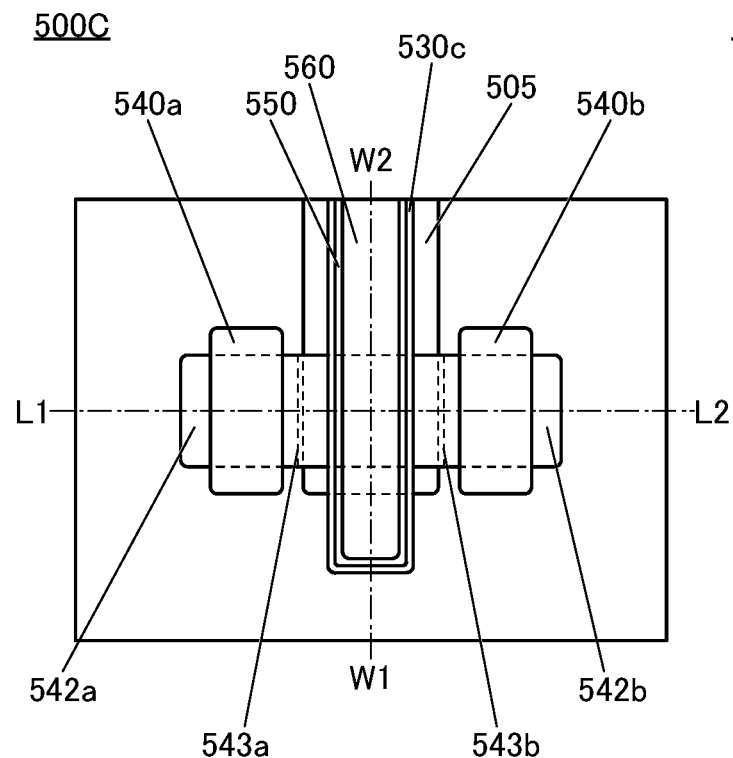
FIG. 28(A) is a top view showing a structure example of a transistor.
Figure 28C:
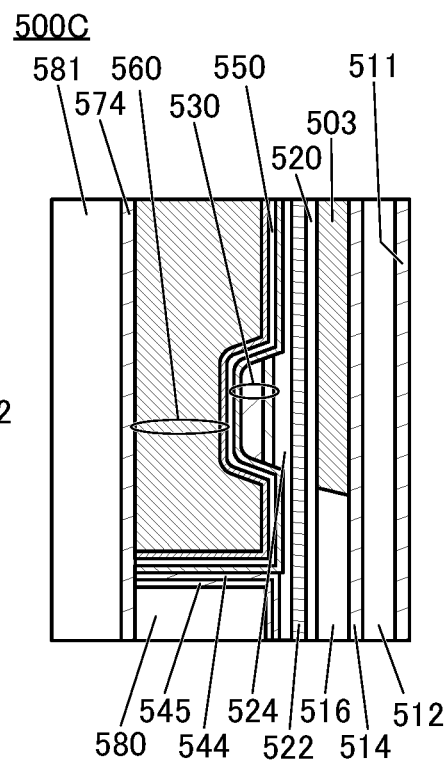
FIGS. 28(B) and 28(C) are cross-sectional views showing the structure example of the transistor.
Figure 28B:
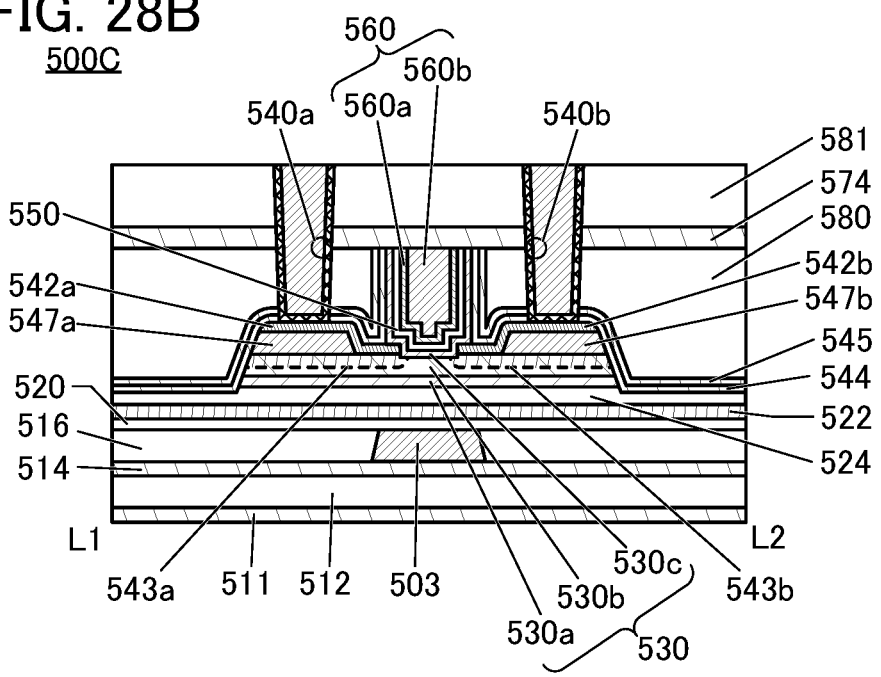

A structure example of a transistor 500C will be described with reference to FIG. 28(A) to FIG. 28(C). FIG. 28(A) is a top view of the transistor 500C. FIG. 28(B) is a cross-sectional view of a portion along the dashed-dotted line L1-L2 in FIG. 28(A). FIG. 28(C) is a cross-sectional view of a portion along the dashed-dotted line W1-W2 in FIG. 28(A). Note that for simplification of the drawing, some components are not illustrated in the top view in FIG. 28(A).

The transistor 500C is a variation example of the transistor 500A. Therefore, differences from the transistor 500A are mainly described to avoid repeated description.

The transistor 500C illustrated in FIG. 28(A) to FIG. 28(C) includes a conductor 547*a* between the conductor 542*a* and the oxide 530*b*, and a conductor 547*b* between the conductor 542*b* and the oxide 530*b*. The conductor 542*a* (the conductor 542*b*) has a region that extends beyond the top surface of the conductor 547*a* (the conductor 547*b*) and its side surface close to the conductor 560 and is in contact with the top surface of the oxide 530*b*. Here, the conductor 547*a* and the conductor 547*b* can be formed using a conductor that can be used as the conductor 542*a* and the conductor 542*b*. Furthermore, the conductor 547*a* and the conductor 547*b* are preferably thicker than at least the conductor 542*a* and the conductor 542*b*.

In the transistor 500C illustrated in FIG. 28(A) to FIG. 28(C), because of the above structure, the conductor 542*a* and the conductor 542*b* can be closer to the conductor 560 than in the transistor 500A. Alternatively, the conductor 560 and the end portions of the conductor 542*a* and the conductor 542*b* can overlap with each other. Accordingly, the effective channel length of the transistor 500C can be shortened, and the on-state current and the frequency characteristics can be improved.

The conductor 547*a* (conductor 547*b*) is preferably provided to overlap with the conductor 542*a* (the conductor 542*b*). With this structure, the conductor 547*a* (the conductor 547*b*) can function as a stopper to prevent over-etching of the oxide 530*b* in etching for forming the opening in which the conductor 540*a* (the conductor 540*b*) is to be embedded.

The transistor 500C illustrated in FIG. 28(A) to FIG. 28(C) has a structure in which an insulator 545 is positioned on and in contact with the insulator 544. The insulator 544 preferably functions as a barrier insulating film for inhibiting impurities such as water or hydrogen and excess oxygen from entering the transistor 500C from the insulator 580 side. The insulator 545 can be formed using an insulator that can be used as the insulator 544. The insulator 544 may be formed using a nitride insulator such as aluminum nitride, aluminum titanium nitride, titanium nitride, silicon nitride, or silicon nitride oxide, for example.

Unlike in the transistor 500A in FIG. 26(A) to FIG. 26(C), the conductor 503 has a single-layer structure in the transistor 500C in FIG. 28(A) to FIG. 28(C). In this case, an insulating film to be the insulator 516 is formed over the patterned conductor 503, and an upper portion of the insulating film is removed by a CMP method or the like until the top surface of the conductor 503 is exposed. Preferably, the planarity of the top surface of the conductor 503 is made favorable. For example, the average surface roughness (Ra) of the top surface of the conductor 503 is less than or equal to 1 nm, preferably less than or equal to 0.5 nm, further preferably less than or equal to 0.3 nm. This allows the improvement in planarity of the insulating layer formed over

52 the conductor 503 and the increase in crystallinity of the oxide 530*b* and the oxide 530*c*.

<<Transistor Structure Example 4>>

Figure 29A:
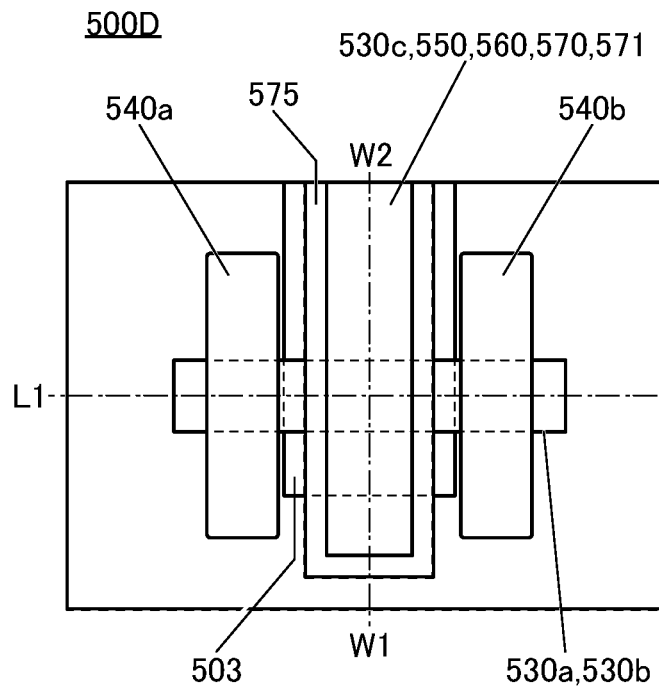
FIG. 29(A) is a top view showing a structure example of a transistor.
Figure 29C:
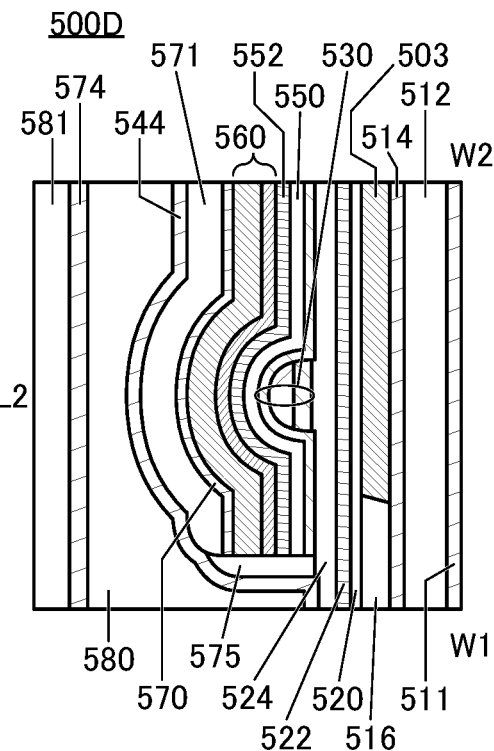
FIGS. 29(B) and 29(C) are cross-sectional views showing the structure example of the transistor.
Figure 29B:
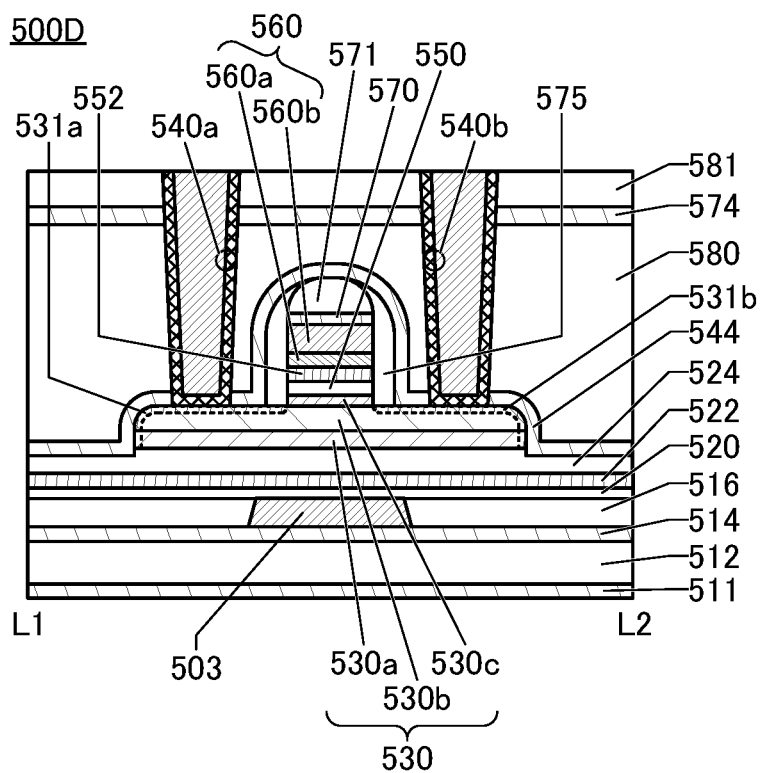

A structure example of a transistor 500D will be described with reference to FIG. 29(A) to FIG. 29(C). FIG. 29(A) is a top view of the transistor 500D. FIG. 29(B) is a cross-sectional view of a portion along the dashed-dotted line L1-L2 in FIG. 29(A). FIG. 29(C) is a cross-sectional view of a portion along the dashed-dotted line W1-W2 in FIG. 29(A). Note that for simplification of the drawing, some components are not illustrated in the top view of FIG. 29(A).

The transistor 500D is a variation example of the above transistors. Therefore, differences from the above transistors are mainly described to avoid repeated description.

The transistor 500D illustrated in FIG. 29(A) to FIG. 29(C) is different from the transistor 500 and the transistor 500A to the transistor 500C in that the conductor 542*a* and the conductor 542*b* are not provided and a region 531*a* and a region 531*b* are provided on part of the exposed surface of the oxide 530*b*. One of the region 531*a* and the region 531*b* functions as a source region, and the other functions as a drain region.

In the transistor 500D, the conductor 505 is not provided as in the transistor 500C in FIG. 28, and the conductor 503 having a function of a second gate also functions as a wiring. The transistor 500D includes the insulator 550 over the oxide 530*c* and a metal oxide 552 over the insulator 550. The conductor 560 is placed over the metal oxide 552, and an insulator 570 is placed over the conductor 560. An insulator 571 is placed over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be suppressed.

Note that the metal oxide 552 may have a function of part of the first gate. For example, an oxide semiconductor that can be used as the oxide 530 can be used as the metal oxide 552. In this case, when the conductor 560 is formed by a sputtering method, the electrical resistance of the metal oxide 552 is lowered so that the metal oxide 552 can be a conductive layer. This can be referred to as an OC (Oxide Conductor) electrode.

The metal oxide 552 may have a function of part of a gate insulating film. For that reason, when silicon oxide, silicon oxynitride, or the like is used for the insulator 550, the metal oxide 552 is preferably a metal oxide that is a high-k material with a high dielectric constant. Such a stacked-layer structure can be thermally stable and can have a high dielectric constant. Accordingly, a gate potential that is applied during operation of the transistor can be reduced while the physical thickness is maintained. In addition, the equivalent oxide thickness (EOT) of an insulating layer functioning as the gate insulating film can be reduced.

Although the metal oxide 552 in the transistor 500D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 500D can be increased without a reduction in influence of electric fields from the conductor 560. Meanwhile, with the metal oxide 552 functioning as a gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric fields applied from the conductor 560 to the oxide 530 can be easily adjusted as appropriate.

Specifically, for the metal oxide 552, a material obtained by lowering the resistance of an oxide semiconductor that can be used for the metal oxide 530 can be used. Alternatively, a metal oxide containing one or more selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate is preferable because it has higher heat resistance than a hafnium oxide film and thus is less likely to be crystallized by heat treatment in later steps. Note that the metal oxide 552 is not an essential component. Design is appropriately determined in consideration of required transistor characteristics.

The insulator 570 is preferably formed using an insulating material having a function of inhibiting the passage of oxygen and impurities such as water or hydrogen. For example, aluminum oxide or hafnium oxide is preferably used. Thus, oxidation of the conductor 560 due to oxygen from above the insulator 570 can be inhibited. Moreover, impurities such as water or hydrogen from above the insulator 570 can be prevented from entering the oxide 530 through the conductor 560 and the insulator 550.

The insulator 571 functions as a hard mask. By provision of the insulator 571, the conductor 560 can be processed to have a side surface that is substantially perpendicular; specifically, the angle formed by the side surface of the conductor 560 and the substrate surface can be greater than or equal to 75° and less than or equal to 100°, preferably greater than or equal to 80° and less than or equal to 95°.

The insulator 571 may be formed using an insulating material having a function of inhibiting the passage of oxygen and impurities such as water or hydrogen so that the insulator 571 also functions as a barrier layer. In this case, the insulator 570 is not necessarily provided.

Parts of the insulator 570, the conductor 560, the metal oxide 552, the insulator 550, and the oxide 530c are selectively removed using the insulator 571 as a hard mask, whereby their side surfaces can be substantially aligned with each other and the surface of the oxide 530b can be partly exposed.

The transistor 500D includes the region 531a and the region 531b on part of the exposed surface of the oxide 530b. One of the region 531a and the region 531b functions as the source region, and the other functions as the drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an impurity element refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of the regions of the oxide 530b to which the impurity element is added decreases. For that reason, the region 531a and the region 531b are sometimes referred to impurity regions or low-resistance regions.

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between the channel formation region and the source/drain region (the region 531a or the region 531b). The formation of the region 531a and the region 531b in a self-aligned manner achieves a higher on-state current, a lower threshold voltage, and a higher operating frequency, for example.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of the insulator 575. In this case, the insulator 575 serves as a mask like the insulator 571 or the like. Thus, the impurity element is not added to the region of the oxide 530b overlapping with the insulator 575, so that the electrical resistivity of the region can be kept high.

The transistor 500D includes the insulator 575 on the side surfaces of the insulator 570, the conductor 560, the metal oxide 552, the insulator 550, and the oxide 530c. The insulator 575 is preferably an insulator having a low dielectric constant. The insulator 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used as the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 500D also includes the insulator 544 over the insulator 575 and the oxide 530. The insulator 544 is preferably formed by a sputtering method. When a sputtering method is used, an insulator containing few impurities such as water or hydrogen can be deposited. For example, aluminum oxide is preferably used for the insulator 544.

Note that an oxide film formed by a sputtering method may extract hydrogen from the component over which the oxide film is formed. For that reason, the hydrogen concentration in the oxide 530 and the insulator 575 can be reduced when the insulator 544 absorbs hydrogen and water from the oxide 530 and the insulator 575.

<<Transistor Structure Example 5>>

Figure 30A:
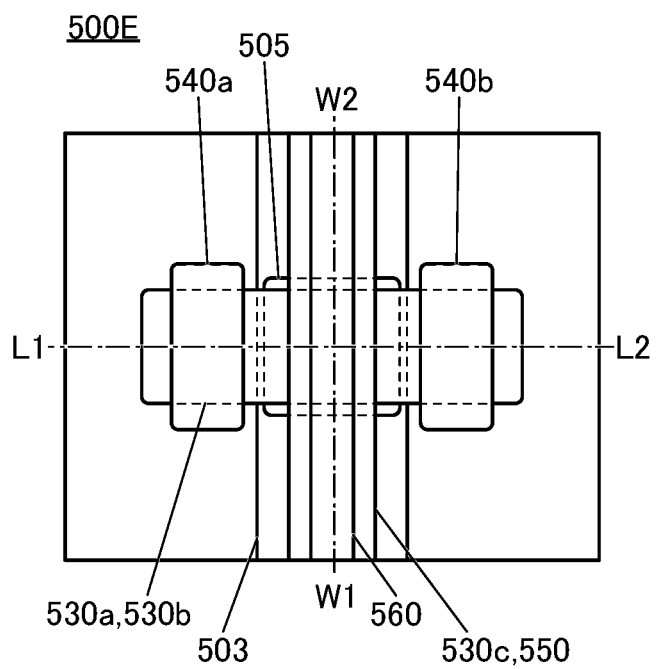
FIG. 30(A) is a top view showing a structure example of a transistor.
Figure 30C:
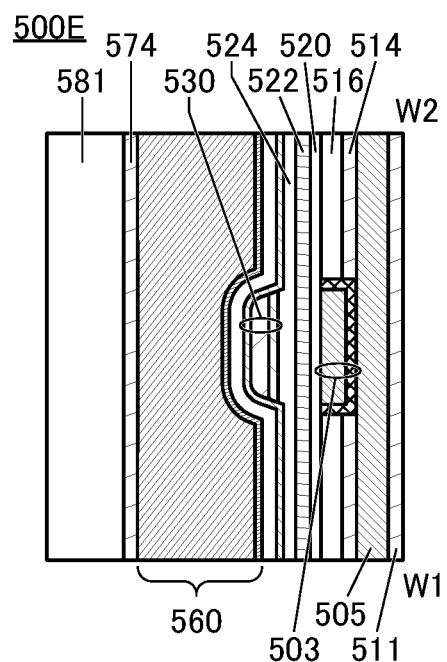
FIGS. 30(B) and 30(C) are cross-sectional views showing the structure example of the transistor.
Figure 30B:
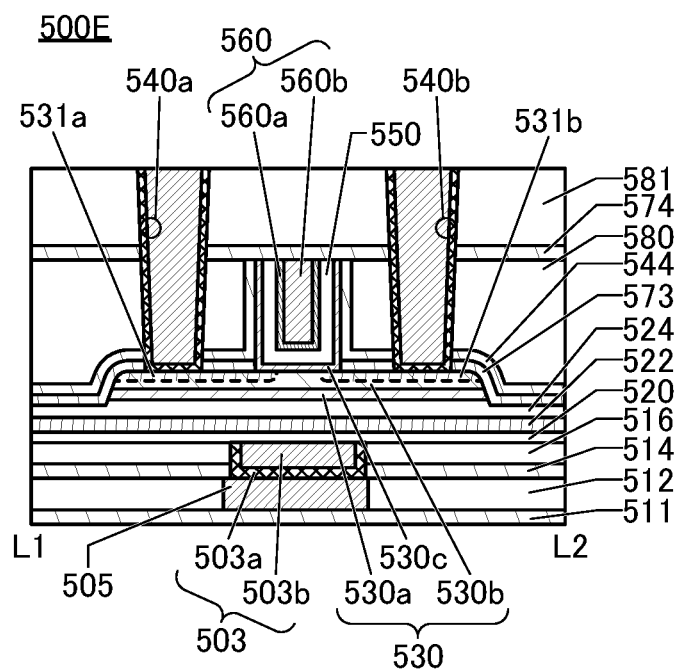

A structure example of a transistor 500E will be described with reference to FIG. 30(A) to FIG. 30(C). FIG. 30(A) is a top view of the transistor 500E. FIG. 30(B) is a cross-sectional view of a portion along the dashed-dotted line L1-L2 in FIG. 30(A). FIG. 30(C) is a cross-sectional view of a portion along the dashed-dotted line W1-W2 in FIG.

30(A). Note that for simplification of the drawing, some components are not illustrated in the top view in FIG. 30(A).

The transistor 500E is a variation example of the above transistors. Therefore, differences from the above transistors are mainly described to avoid repeated description.

In FIG. 30(A) to FIG. 30(C), the conductor 542a and the conductor 542b are not provided and part of the exposed surface of the oxide 530b includes the region 531a and the region 531b, as in the transistor 500D. One of the region 531a and the region 531b functions as a source region, and the other functions as a drain region. Moreover, an insulator 573 is provided between the oxide 530b and the insulator 544.

The region 531a and the region 531b illustrated in FIG. 30(B) are regions where an element described below is added to the oxide 530b. The region 531a and the region 531b can be formed using a dummy gate, for example.

Specifically, a dummy gate is provided over the oxide 530b, and an element that reduces the resistance of some regions of the oxide 530b is added using the dummy gate as a mask. That is, the element is added to regions of the oxide 530 that $d_0$ not overlap with the dummy gate, whereby the region 531a and the region 531b are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of some regions of the oxide 530b are boron and phosphorus. Moreover, hydrogen, carbon, nitrogen, fluorine, sulfur, chlorine, titanium, a rare gas, or the like may be used. Typical examples of a rare gas include helium, neon, argon, krypton, and xenon. The concentration of the element can be measured by secondary ion mass spectrometry (SIMS) or the like.

In particular, boron and phosphorus can be added by an apparatus in the manufacturing line for a Si transistor containing amorphous silicon, low-temperature polysilicon, or the like in its semiconductor layer; thus, the resistance of part of the oxide 530b can be reduced by using the apparatus in the manufacturing line. That is, part of the manufacturing line for a Si transistor can be used in the process of manufacturing the transistor 500E.

Next, an insulating film to be the insulator 573 and an insulating film to be the insulator 544 may be formed over the oxide 530b and the dummy gate. Stacking the insulating film to be the insulator 573 and the insulating film to be the insulator 544 can provide a region where the region 531a or the region 531b, the oxide 530c, and the insulator 550 overlap with each other.

Specifically, after an insulating film to be the insulator 580 is provided over the insulating film to be the insulator 544, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 544 and the insulator 573 are exposed at the side surface of the opening portion provided in the insulator 580, and the region 531a and the region 531b provided in the oxide 530b are partly exposed at the bottom surface of the opening portion. Next, an oxide film to be the oxide 530c, an insulating film to be the insulator 550, and a conductive film to be the conductor 560 are formed in this order in the opening portion, and then are partly removed by CMP treatment or the like until the insulator 580 is exposed; consequently, the transistor illustrated in FIG. 30(A) to FIG. 30(C) can be formed.

Note that the insulator 573 and the insulator 544 are not essential components. Design is appropriately determined in consideration of required transistor characteristics.

Since the transistor in FIG. 30(A) to FIG. 30(C) is not provided with the conductor 542a and the conductor 542b, the cost can be reduced.

<<Transistor Structure Example 6>>

Although FIG. 25(A) and FIG. 25(B) illustrate the structure example in which the conductor 560 functioning as the gate is formed inside the opening in the insulator 580, it is possible to employ a structure where the insulator is provided above the conductor, for example. FIG. 31(A), FIG. 31(B), FIG. 32(A), and FIG. 32(B) illustrate a structure example of such a transistor.

Figure 31A:
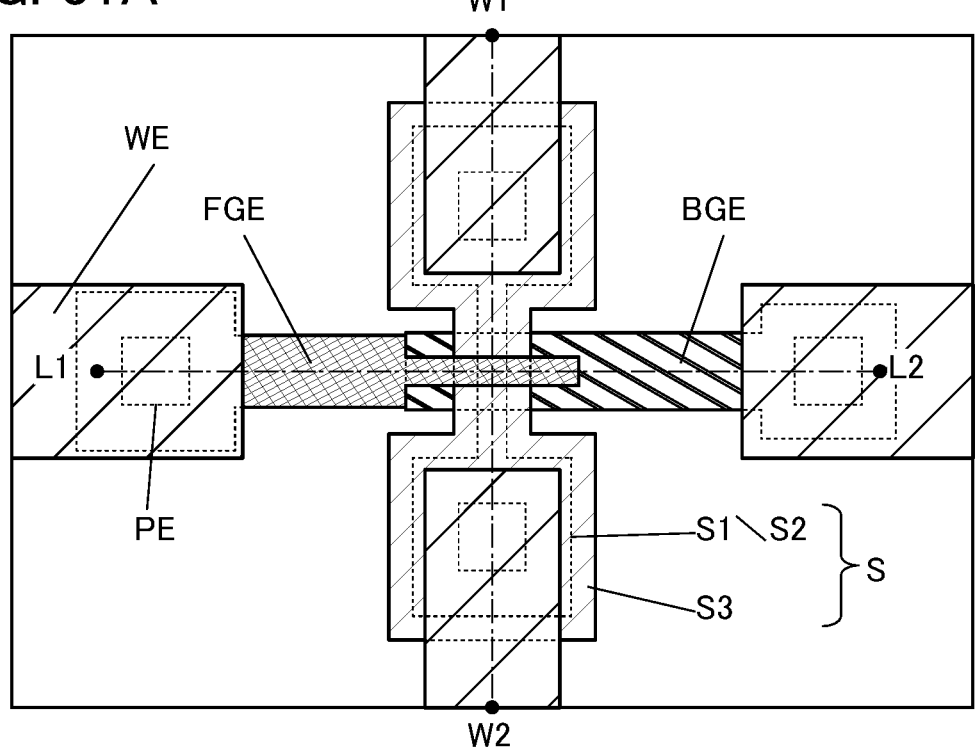
FIG. 31(A) is a top view showing a structure example of a transistor.
Figure 31B:
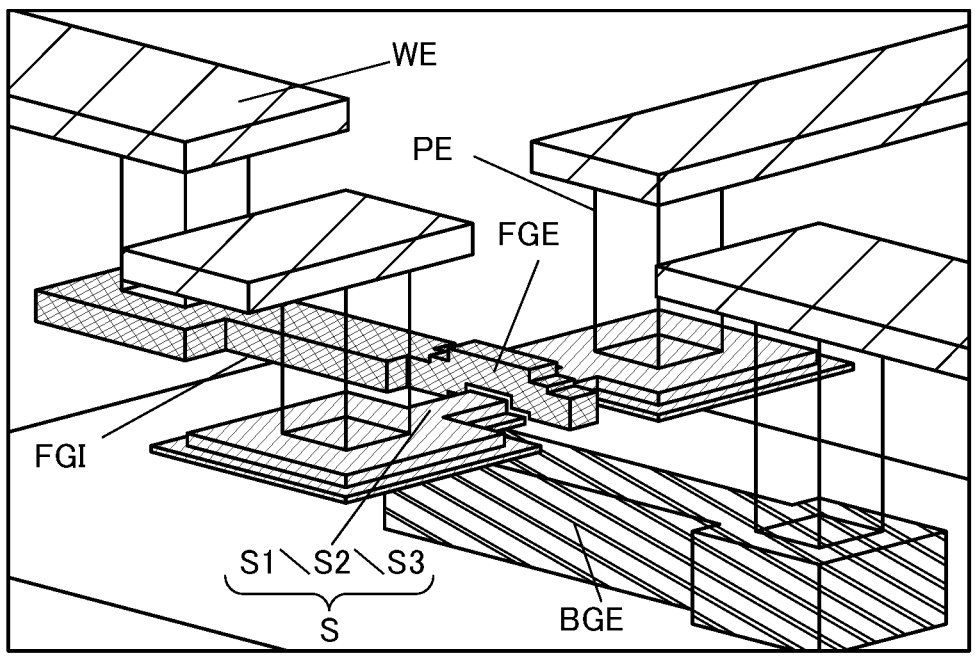
FIG. 31(B) is a perspective view showing the structure example of the transistor.
Figure 32A:
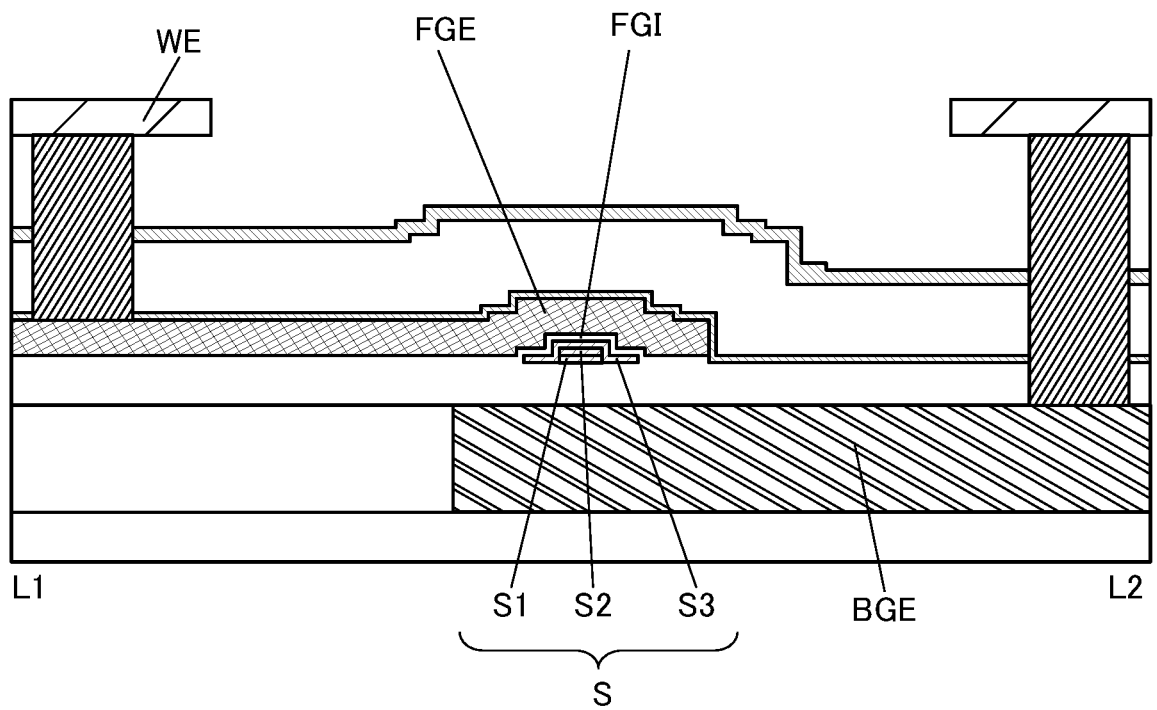
FIGS. 32(A) and 32(B) are cross-sectional views showing a structure example of a transistor.
Figure 32B:
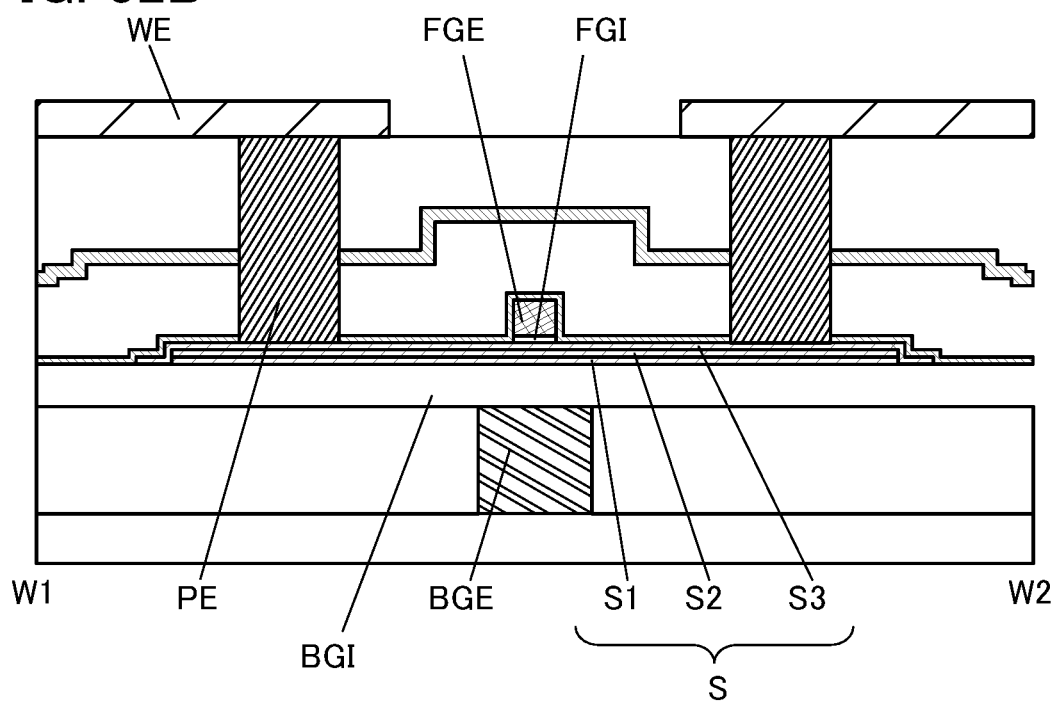

FIG. 31(A) is a top view of the transistor, and FIG. 31(B) is a perspective view of the transistor. FIG. 32(A) is a cross-sectional view along L1-L2 in FIG. 31(A), and FIG. 32(B) is a cross-sectional view along W1-W2.

The transistor illustrated in FIG. 31(A), FIG. 31(B), FIG. 32(A), and FIG. 32(B) includes a conductor BGE having a function of a back gate, an insulator BGI having a function of a gate insulating film, an oxide semiconductor S, an insulator FGI having a function of a gate insulating film, a conductor FGE having a function of a front gate, and a conductor WE having a function of a wiring. A conductor PE has a function of a plug for connecting the conductor WE to the oxide S, the conductor BGE, or the conductor FGE. An example where the oxide semiconductor S includes three layers of oxides S1, S2, and S3 is shown here.

<<Structure Example of Capacitor>>

Figure 33A:
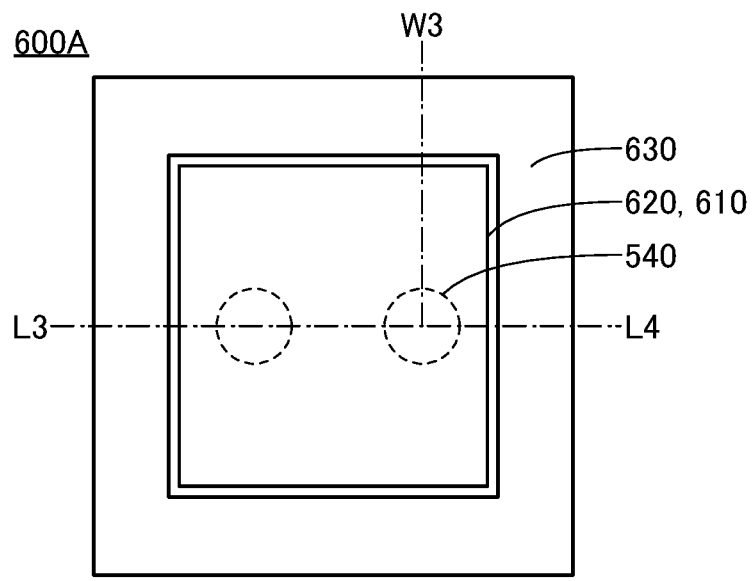
FIG. 33(A) is a top view showing a structure example of a capacitor.
Figure 33B:
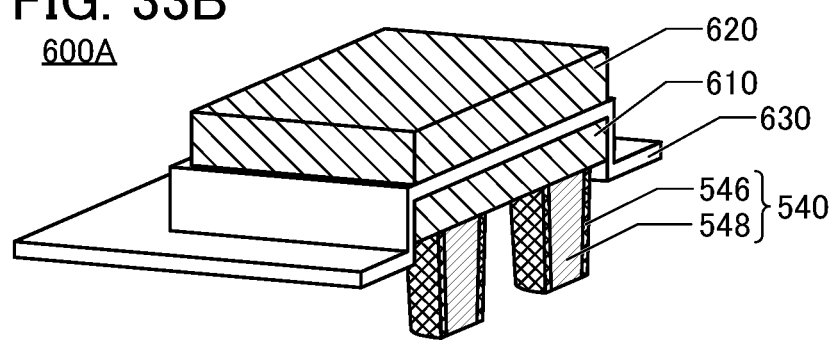
FIGS. 33(B) and 33(C) are cross-sectional perspective views showing the structure example of a capacitor.
Figure 33C:
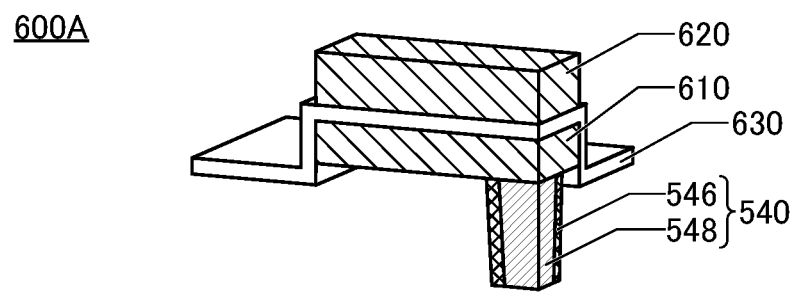

FIG. 33(A) to FIG. 33(C) illustrate a capacitor 600A as an example of the capacitor 600 that can be used in the semiconductor device shown in FIG. 23. FIG. 33(A) is a top view of the capacitor 600A. FIG. 33(B) is a perspective view illustrating a cross section of the capacitor 600A along the dashed-dotted line L3-L4. FIG. 33(C) is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric that is interposed between the pair of electrodes.

The bottom portion of the conductor 610 in the capacitor 600A is electrically connected to the conductor 546 and the conductor 548. The conductor 546 and the conductor 548 function as plugs or wirings for connecting to another circuit component. In FIGS. 33(B) and 33(C), the conductor 546 and the conductor 548 are collectively indicated by a conductor 540.

For simplification, FIG. 33(A) to FIG. 33(C) do not show the insulator 586 in which the conductor 546 and the conductor 548 are embedded, and the insulator 650 that covers the conductor 620 and the insulator 630.

Although the capacitor 600 in FIG. 23 and the capacitor 600A in FIG. 33(A) to FIG. 33(C) are planar capacitors, the shape of the capacitor is not limited thereto. For example, the capacitor 600 may be a cylindrical capacitor 600B illustrated in FIG. 34(A) to FIG. 34(C).

Figure 34A:
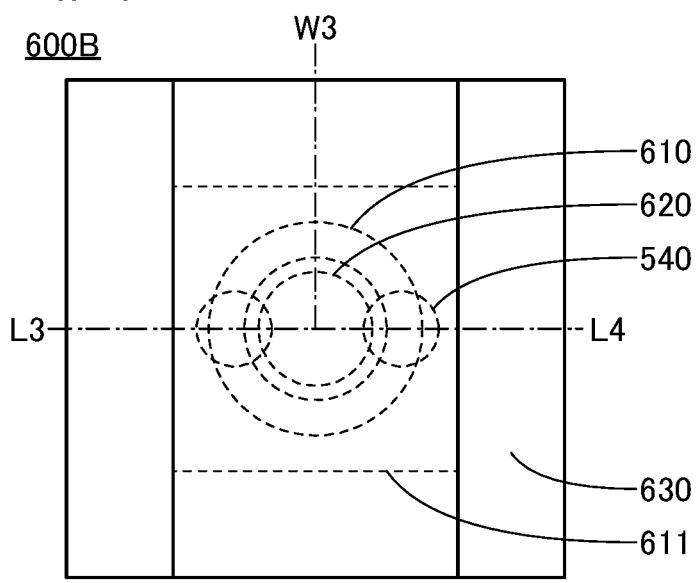
FIG. 34(A) is a top view showing a structure example of a capacitor.
Figure 34B:
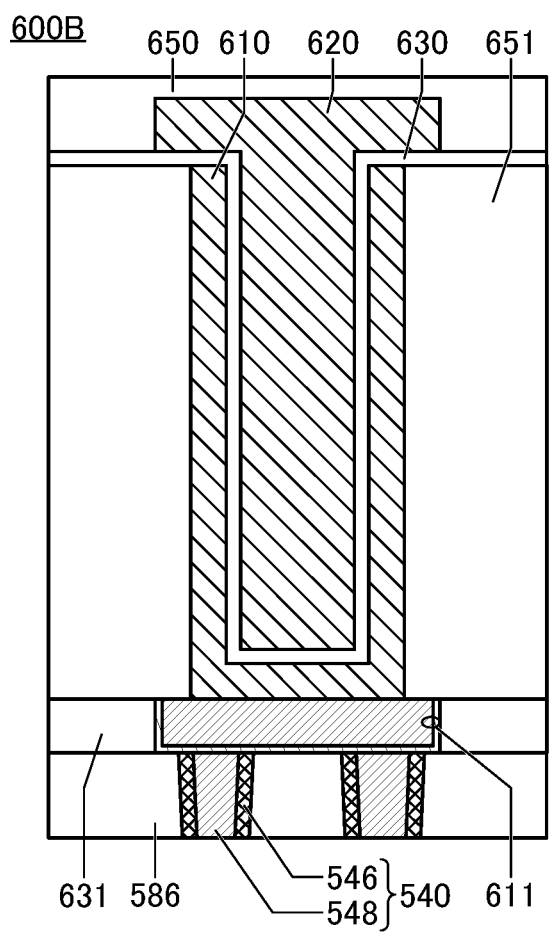
FIG. 34(B) is a cross-sectional view showing the structure example of a capacitor.
Figure 34C:
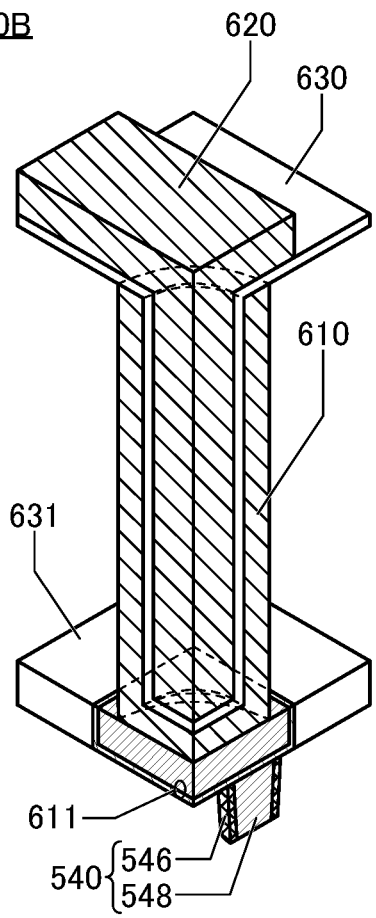
FIG. 34(C) is a cross-sectional perspective view showing the structure example of a capacitor.

FIG. 34(A) is a top view of the capacitor 600B. FIG. 34(B) is a perspective view illustrating a cross section of the capacitor 600B along the dashed-dotted line L3-L4. FIG. 34(C) is a perspective view illustrating a cross section of the capacitor 600B along the dashed-dotted line W3-L4.

In FIG. 34(B), the capacitor 600B includes an insulator 631 over the insulator 586 in which the conductor 540 is embedded, an insulator 651 having an opening portion, the conductor 610 functioning as one of a pair of electrodes, and the conductor 620 functioning as the other of the pair of electrodes.

For simplification, the insulator 586, the insulator 650, and the insulator 651 are omitted in FIG. 34(C).

The insulator 631 can be formed using a material similar to that for the insulator 586, for example.

A conductor 611 is embedded in the insulator 631 to be electrically connected to the conductor 540. The conductor 611 can be formed using a material similar to that for the conductor 330 and the conductor 518, for example.

The insulator 651 can be formed using a material similar to that for the insulator 586, for example.

The insulator 651 has an opening portion as described above, and the opening portion overlaps the conductor 611.

The conductor 610 is formed on the bottom portion and the side surface of the opening portion. In other words, the conductor 610 overlaps the conductor 611 and is electrically connected to the conductor 611.

The conductor 610 is formed in such a manner that an opening portion is formed in the insulator 651 by an etching method or the like, the conductor 610 is then deposited by a sputtering method, an ALD method, or the like, and after that, the conductor 610 deposited over the insulator 651 is removed by a CMP (Chemichal Mechanical Polishing) method or the like while the conductor 610 deposited in the opening portion is left.

The insulator 630 is positioned over the insulator 651 and the conductor 610. In the capacitor, the insulator 630 functions as a dielectric between the pair of electrodes.

The conductor 620 is formed over the insulator 630 so as to fill the opening portion of the insulator 651.

The insulator 650 is formed to cover the insulator 630 and the conductor 620.

The capacitance of the cylindrical capacitor 600B in FIG. 34(A) to FIG. 34(C) can be higher than that of the planar capacitor 600A. Thus, when the capacitor 600B is used as the capacitors C1, C3, C11, C12, CD4, CD8, and CD12 described in the above embodiment, for example, a voltage between the terminals of the capacitor can be maintained for long time.

Note that this embodiment can be combined with other embodiments in this specification as appropriate.

Embodiment 7

In this embodiment, the compositions of a CAC-OS (Cloud-Aligned Composite Oxide Semiconductor) and a CAAC-OS (c-axis Aligned Crystalline Oxide Semiconductor), which are metal oxides that can be used in the OS transistor described in the above embodiments, will be described. Note that in the specification and the like, CAAC refers to an example of a crystal structure, and CAC refers to an example of a function or a material composition.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

<Structure of Metal Oxide>

Oxide semiconductors are classified into a single-crystal oxide semiconductor and a non-single-crystal oxide semiconductor. Examples of the non-single-crystal oxide semiconductors include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OX transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, the transistor having high field-effect mobility can be achieved. In addition, the transistor having high reliability can be achieved.

Furthermore, an oxide semiconductor with a low carrier density is preferably used for the transistor. In the case where the carrier density of an oxide semiconductor film is reduced, the impurity concentration in the oxide semiconductor film is reduced to reduce the density of defect states. In this specification and the like, a state with a low impurity concentration and a low density of defect states is referred to as a highly purified intrinsic or substantially highly purified intrinsic state. For example, an oxide semiconductor has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic oxide semiconductor film has a low density of defect states and accordingly may have a low density of trap states.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the concentration of impurities in the oxide semiconductor. In addition, in order to reduce the concentration of impurities in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon that is a Group 14 element is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are set to lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated, in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is set to lower than or equal to $1\times10^{18}$ atoms/$cm^3$, preferably lower than or equal to $2\times10^{16}$ atoms/$cm^3$.

Furthermore, when containing nitrogen, the oxide semiconductor easily becomes n-type by generation of electrons serving as carriers and an increase in carrier density. As a result, a transistor using an oxide semiconductor containing nitrogen as a semiconductor is likely to have normally-on characteristics. Thus, nitrogen in the oxide semiconductor is preferably reduced as much as possible; for example, the nitrogen concentration in the oxide semiconductor is set to lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$ in SIMS.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for a channel formation region of a transistor, stable electrical characteristics can be given.

Note that this embodiment can be combined with other embodiments in this specification as appropriate.

Embodiment 8

In this embodiment, examples of products in which the semiconductor device described in the above embodiments is used for an electronic device will be described.

<Laptop Personal Computer>

Figure 35A:
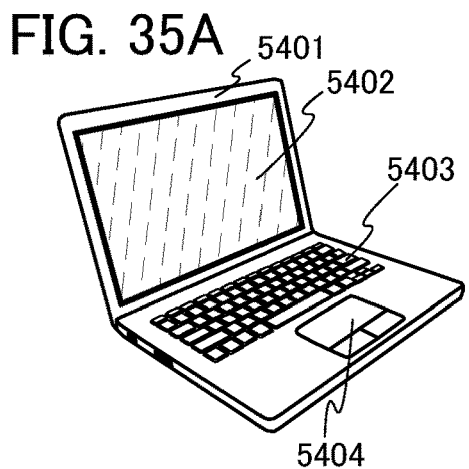
FIGS. 35(A), 35(B), 35(C), 35(D), 35(E), 35(F), 35(G), and 35(H) are perspective views showing examples of electronic devices.

The semiconductor device of one embodiment of the present invention can be used for a display provided in an information terminal device. FIG. 35(A) is a laptop personal computer, which is an information terminal device. The laptop personal computer includes a housing 5401, a display portion 5402, a keyboard 5403, a pointing device 5404, and the like.

<Smartwatch>

Figure 35B:
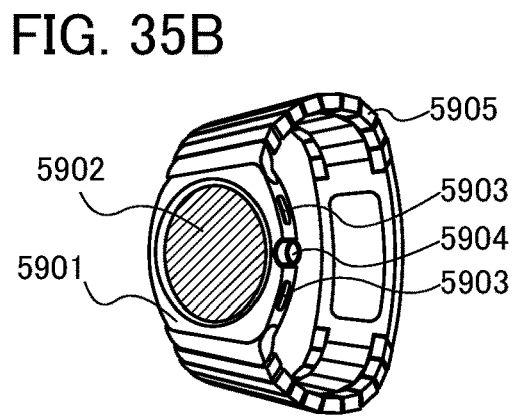

The semiconductor device of one embodiment of the present invention can be used for a wearable terminal. FIG. 35(B) is a smartwatch, which is a wearable terminal. The smart watch includes a housing 5901, a display portion 5902, operation buttons 5903, an operator 5904, a band 5905, and the like. A display device with a function of a position input device may be used for the display portion 5902. The function of the position input device can be added by provision of a touch panel in a display device. Alternatively, the function of the position input device can be added by provision of a photoelectric conversion element called a photosensor in a pixel portion of a display device. As the operation buttons 5903, any of a power switch for activating the smartwatch, a button for operating an application of the smartwatch, a volume control button, a switch for turning on or off the display portion 5902, and the like can be provided. Although the number of operation buttons 5903 is two in the smartwatch illustrated in FIG. 35(B), the number of operation buttons included in the smartwatch is not limited thereto. The operator 5904 functions as a crown used for setting the time on the smartwatch. In addition, the operator 5904 may be used as an input interface for operating an application of the smartwatch as well as the crown for time adjustment. Although the smartwatch illustrated in FIG. 35(B) has the operator 5904, without being limited thereto, a structure without the operator 5904 may be used.

<Video Camera>

Figure 35C:
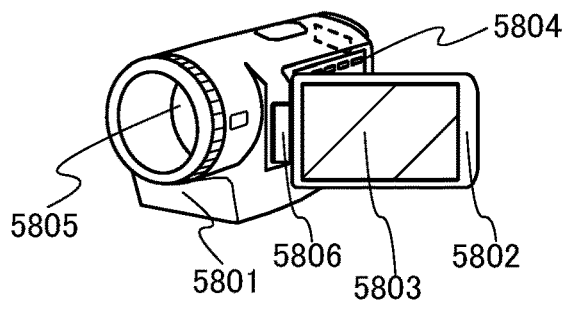

The semiconductor device of one embodiment of the present invention can be used for a video camera. The video camera illustrated in FIG. 35(C) includes a first housing 5801, a second housing 5802, a display portion 5803, operation keys 5804, a lens 5805, a joint portion 5806, and the like. The operation keys 5804 and the lens 5805 are provided in the first housing 5801, and the display portion 5803 is provided in the second housing 5802. The first housing 5801 and the second housing 5802 are connected to each other with the joint portion 5806, and the angle between the first housing 5801 and the second housing 5802 can be changed with the joint portion 5806. A structure in which images on the display portion 5803 are changed in accordance with the angle at the joint portion 5806 between the first housing 5801 and the second housing 5802 may be employed.

<Mobile Phone>

Figure 35D:
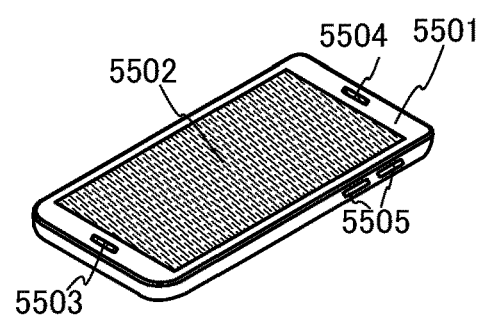

The semiconductor device of one embodiment of the present invention can be used for a mobile phone. FIG. 35(D) is a mobile phone that has a function of an information terminal and includes a housing 5501, a display portion 5502, a microphone 5503, a speaker 5504, and operation buttons 5505. A display device with a function of a position input device may be used for the display portion 5502. The function of the position input device can be added by provision of a touch panel in a display device. Alternatively, the function of the position input device can be added by provision of a photoelectric conversion element called a photosensor in a pixel portion of a display device. As the operation buttons 5505, any of a power switch for activating the mobile phone, a button for operating an application of the mobile phone, a volume control button, a switch for turning on or off the display portion 5502, and the like can be provided.

Although the mobile phone illustrated in FIG. 35(D) includes two operation buttons 5505, the number of operation buttons included in the mobile phone is not limited thereto. Although not illustrated, the mobile phone illustrated in FIG. 35(D) may include a light-emitting device for use as a flash light or a lighting device.

<Stationary Game Console>

Figure 35E:
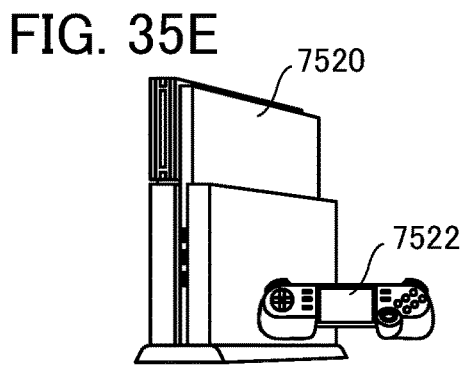

The semiconductor device of one embodiment of the present invention can be used for a stationary game console, which is an example of game machines. FIG. 35(E) illustrates a game console main unit 7520 and a controller 7522 as a stationary game console. The controller 7522 can be connected to the game console main unit 7520 with or without a wire. Although not illustrated in FIG. 35(E), the controller 7522 can include a display portion that displays a game image, and an input interface besides a button, such as a touch panel, a stick, a rotating knob, and a sliding knob, for example. The shape of the controller 7522 is not limited to that in FIG. 35(E) and may be changed variously in accordance with the genres of games. For example, in a shooting game such as an FPS (First Person Shooter) game, a gun-shaped controller having a trigger button can be used. As another example, in a music game or the like, a controller having a shape of a music instrument, audio equipment, or the like can be used. Furthermore, the stationary game console may include a camera, a depth sensor, a microphone, and the like so that the game player can play a game using a gesture and/or a voice instead of a controller.

<Portable Game Console>

Figure 35F:
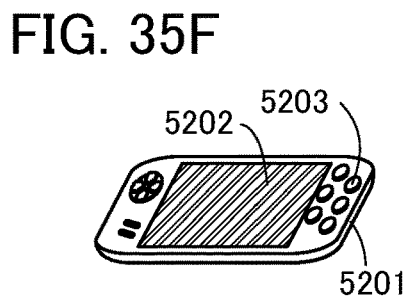

The semiconductor device of one embodiment of the present invention can be used for a portable game console, which is an example of game machines. A portable game console illustrated in FIG. 35(F) includes a housing 5201, a display portion 5202, a button 5203, and the like. Note that a portable game console 5200 illustrated in FIG. 35(F) is an example; the position, shape, and number of a display portion, a button, and the like of a portable game console using the semiconductor device of one embodiment of the present invention are not limited to those of the components illustrated in FIG. 35(F). The shape of the housing of the portable game console is not limited to that of the component illustrated in FIG. 35(F).

In the above description, a stationary game console and a portable game console are given as examples of game machines; the semiconductor device of one embodiment of the present invention can also be used for an arcade game machine and the like in addition to the above.

<Television Device>

Figure 35G:
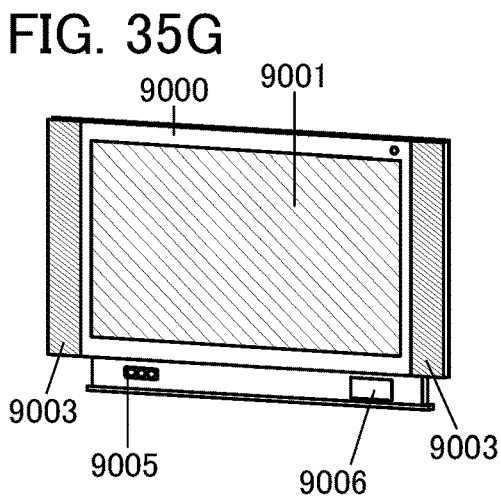

The semiconductor device of one embodiment of the present invention can be used for a television device. A television device illustrated in FIG. 35(G) includes a housing 9000, a display portion 9001, a speaker 9003, an operation key 9005 (including a power switch or an operation switch), a connection terminal 9006, and the like. The television device can include the display portion 9001 having a large screen size of, for example, 50 inches or more, or 100 inches or more.

<Vehicle>

The semiconductor device of one embodiment of the present invention can be used around a driver's seat in a car, which is a vehicle.

Figure 35H:
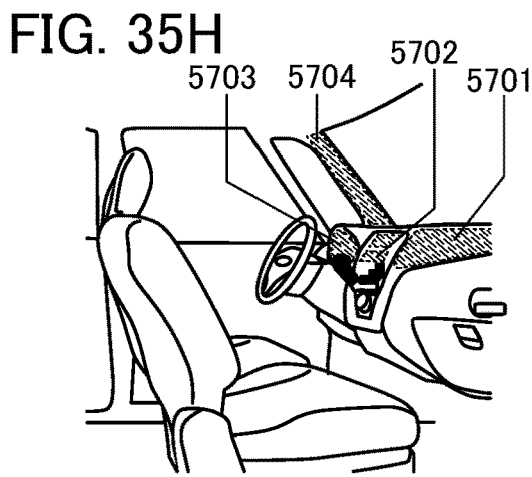

FIG. 35(H) illustrates a windshield and its vicinity inside a car, for example. FIG. 35(H) illustrates a display panel 5701, a display panel 5702, and a display panel 5703 that are attached to a dashboard and a display panel 5704 that is attached to a pillar.

The display panel 5701 to the display panel 5703 can display a variety of information such as navigation information, a speedometer, a tachometer, a mileage, a fuel meter, a gearshift state, and air-conditioner settings. The content, layout, and the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (blind areas) by showing an image taken by an imaging unit provided for the car body. That is, showing an image taken by an imaging unit provided on the outside of the car leads to elimination of blind areas and enhancement of safety. In addition, showing an image for compensating for the area which a driver cannot see makes it possible for the driver to confirm safety more easily and comfortably. The display panel 5704 can also be used as a lighting device.

<Electronic Device for Electronic Advertisement>

Figure 36A:
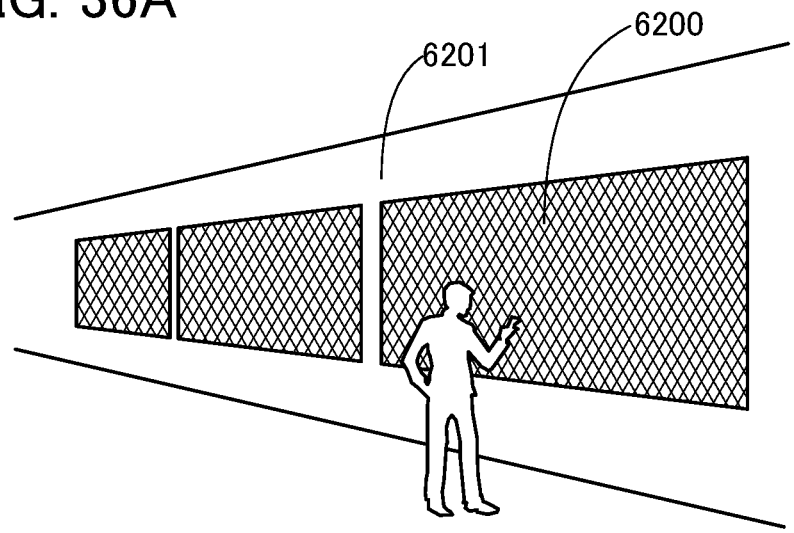
FIGS. 36(A) and 36(B) are perspective views showing examples of electronic devices.

The semiconductor device of one embodiment of the present invention can be used for a display used for an electronic advertisement. FIG. 36(A) shows an example of digital signage that can be attached to a wall. FIG. 36(A) illustrates how digital signage 6200 is attached to a wall 6201.

<Foldable Tablet Information Terminal>

Figure 36B:
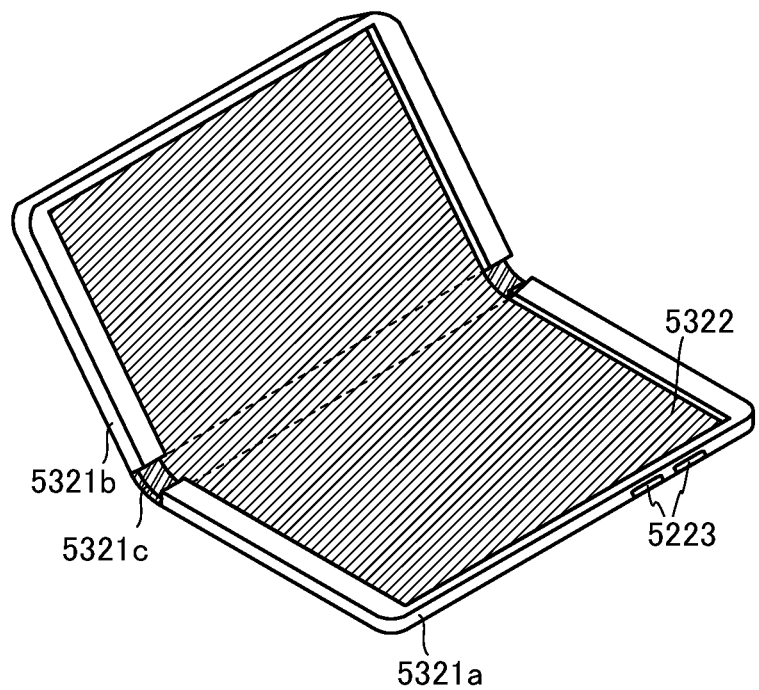

The semiconductor device of one embodiment of the present invention can be used for a tablet information terminal. FIG. 36(B) illustrates a tablet information terminal with a structure that can be folded. The information terminal in FIG. 36(B) includes a housing 5321*a*, a housing 5321*b*, a display portion 5322, and operation buttons 5323. In particular, the display portion 5322 includes a flexible base, and the base enables a structure that can be folded.

The housing 5321*a* and the housing 5321*b* are connected to each other with a hinge portion 5321*c* that allows the display portion 5322 to be folded in half. The display portion 5322 is provided in the housing 5321*a*, the housing 5321*b*, and the hinge portion 5321*c*.

Although not illustrated, the electronic devices illustrated in FIG. 35(A) to FIG. 35(C), FIG. 35(E), FIG. 36(A), and FIG. 36(B) may include a microphone and a speaker. With this structure, the above electronic devices can have an audio input function, for example.

Although not illustrated, the electronic devices illustrated in FIG. 35(A), FIG. 35(B), FIG. 35(D), FIG. 36(A), and FIG. 36(B) may include a camera.

Although not illustrated, the electronic devices illustrated in FIG. 35(A) to FIG. 35(F), FIG. 36(A), and FIG. 36(B) may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) in the housing. In particular, when a detection device including a sensor for detecting inclination, such as a gyroscope sensor or an acceleration sensor, is provided for the mobile phone illustrated in FIG. 35(D), the direction of the mobile phone (which direction the mobile phone faces with respect to the vertical direction) is determined, so that the display on the display portion 5502 can be automatically changed in accordance with the direction of the mobile phone.

Although not illustrated, the electronic devices illustrated in FIG. 35(A) to FIG. 35(F), FIG. 36(A), and FIG. 36(B) may include a device for obtaining biological information such as fingerprints, veins, iris, or voice prints. Employing this structure can achieve an electronic device having a biometric identification function.

A flexible base may be used for the display portion of each of the electronic devices illustrated in FIG. 35(A) to FIG. 35(E) and FIG. 36(A). Specifically, the display portion may have a structure in which a transistor, a capacitor, a display element, and the like are provided over a flexible base. Employing this structure can achieve not only the electronic device having a housing with a flat surface as illustrated in FIG. 35(A) to FIG. 35(E) and FIG. 36(A) but also an electronic device having a housing with a curved surface like the dashboard and the pillar illustrated in FIG. 35(H).

As a flexible base that can be used for the display portions in FIG. 35(A) to FIG. 35(F), 35(H), FIG. 36(A), and FIG. 36(B), any of the following materials that transmit visible light can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, and the like. Alternatively, a mixture or a stack including any of these materials may be used.

Note that this embodiment can be combined with other embodiments in this specification as appropriate.

REFERENCE NUMERALS

M1: transistor, M1*r* : transistor, M2: transistor, M2*r:* transistor, M3: transistor, M4: transistor, M5: transistor, M11: transistor, M11*r:* transistor, M12: transistor, M12*r:* transistor, M13: transistor, M13*r:* transistor, M22: transistor, M23: transistor, M24: transistor, M27: transistor, M28: transistor, M29: transistor, M32: transistor, M33: transistor, M34: transistor, MA1 : transistor, MA1*r:* transistor, MA2: transistor, MA2*r:* transistor, MA3: transistor, MA3*r:* transistor, MS1: transistor, MS1*r:* transistor, MS2: transistor, MS2*r:* transistor, MC1: transistor, MC1*r:* transistor, C1: capacitor, C1*r:* capacitor, C3: capacitor, C11: capacitor, C11*r:* capacitor, C12: capacitor, C12*r:* capacitor, C13: capacitor, CD3: capacitor, CD4: capacitor, CD7:

capacitor, CD8: capacitor, CD11: capacitor, CD12: capacitor, S20: switch, S21: switch, ss: node, ss1: node, mss: node, dd: node, bgc: node, bgc1: node, bw: node, ww: node, vx: node, ot1: node, ot3: node, ot4: node, cs1: node, cs2: node, cs3: node, cm1: node, cm2: node, cmg: node, cmg1: node, cmg2: node, pt1: node, pt2: node, pt3: node, po: node, wx: node, wb: node, vb1: node, ga: node, st: node, sn1: node, mb1: node, ms1: node, inro: node, npr: node, WCS: wiring, WCS2: wiring, WBCS: wiring, EN_WBG: wiring, WBG: wiring, WBGr: wiring, VX: wiring, VX[1]: wiring, VX[i]: wiring, VX[m]: wiring, WW: wiring, WX: wiring, WX[1]: wiring, WX[j]: wiring, WX[n]: wiring, WXr: wiring, BW: wiring, BWr: wiring, PO: wiring, POr: wiring, EN_PO: wiring, ENB_PO: wiring, MVSSL: wiring, MVSSLr: wiring, VAL: wiring, SW2: wiring, SW3: wiring, SW3B: wiring, SW4: wiring, SW5: wiring, SW5B: wiring, SW6: wiring, SW7: wiring, SW7B: wiring, CS2: circuit, CS3: circuit, CS4: circuit, ct2: terminal, ct3: terminal, ct4: terminal, $N_1^{(k-1)}$: neuron, $N_i^{(k-1)}$: neuron, $N_m^{(k-1)}$: neuron, $N_1^{(k)}$: neuron, $N_j^{(k)}$: neuron, $N_n^{(k)}$: neuron, MCA: memory cell array, MCA[1]: memory cell array, MCA[n]: memory cell array, BGI: insulator, FGI: insulator, BGE: conductor, FGE: conductor, PE: conductor, WE: conductor, 10: circuit, 10[1]: circuit, 10[j]: circuit, 10[m]: circuit, 10[1,1]: circuit, 10[i, 1]: circuit, 10[m,1]: circuit, 10[1,j]: circuit, 10[i,j]: circuit, 10[m, j]: circuit, 10[1,n]: circuit, 10[i,n]: circuit, 10[m,n]: circuit, 10r: circuit, 10r[1]: circuit, 10r[i]: circuit, 10r[m]: circuit, 11: circuit, 15: circuit, 17: circuit, 18: circuit, 30: current supply circuit, 30r: current supply circuit, 41: circuit, 41r: circuit, 42: circuit, 50: offset cancellation circuit, 60: current supply circuit, 60r: current supply circuit, 70: offset cancellation circuit, 80: offset cancellation circuit, 80[1]: offset cancellation circuit, 80[j]: offset cancellation circuit, 80[n]: offset cancellation circuit, 90: offset cancellation circuit, 90[1]: offset cancellation circuit, 90[n]: offset cancellation circuit, 101: control circuit, 102: temperature sensor, 103: memory device, 104: DAC, 106: driver circuit, 107: driver circuit, 108: driver circuit, 109: driver circuit, 110: driver circuit, 112: reading circuit, 113: arithmetic array, 120: reading circuit, 120[1]: reading circuit, 120[j]: reading circuit, 120[n]: reading circuit, 201A: arithmetic circuit, 201B: arithmetic circuit, 201C: arithmetic circuit, 202A: arithmetic circuit, 202B: arithmetic circuit, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 500A: transistor, 500B: transistor, 500C: transistor, 500D: transistor, 500E: transistor, 503: conductor, 503a: conductor, 503b: conductor, 505: conductor, 510: insulator, 511: insulator, 512: insulator, 514: insulator, 516: insulator, 518: conductor, 520: insulator, 522: insulator, 524: insulator, 530: oxide, 530a: oxide, 530b: oxide, 530c: oxide, 531a: region, 531b: region, 540: conductor, 540a: conductor, 540b: conductor, 542a: conductor, 542b: conductor, 543a: region, 543b: region, 544: insulator, 545: insulator, 546: conductor, 546a: conductor, 546b: conductor, 547a: conductor, 547b: conductor, 548: conductor, 550: insulator, 552: metal oxide, 560: conductor, 560a: conductor, 560b: conductor, 570: insulator, 571: insulator, 573: insulator, 574: insulator, 575: insulator, 576a: insulator, 576b: insulator, 580: insulator, 581: insulator, 582: insulator, 586: insulator, 600: capacitor, 600A: capacitor, 600B: capacitor, 610: conductor, 611: conductor, 612: conductor, 620: conductor, 621: conductor, 630: insulator, 631: insulator, 650: insulator, 651: insulator, 5201: housing, 5202: display portion, 5203: button, 5321a: housing, 5321b: housing, 5321c: hinge portion, 5322: display portion, 5323: operation button, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: joint portion, 5901: housing, 5902: display portion, 5903: operation button, 5904: operator, 5905: band, 6200: digital signage, 6201: wall, 7520: gaming console, 7522: controller, 9000: housing, 9001: display portion, 9003: speaker, 9005: operation key, 9006: connection terminal

The invention claimed is:

1. A semiconductor device comprising:
a first current supply circuit and a second current supply circuit,
wherein the second current supply circuit comprises the same configuration as the first current supply circuit,
wherein the first current supply circuit comprises first to fourth transistors, a first capacitor, a second capacitor, and first to third nodes,
wherein a first terminal of the first transistor is electrically connected to a first terminal of the second transistor and the first node,
wherein a back gate of the first transistor is electrically connected to a first terminal of the third transistor and a first terminal of the first capacitor,
wherein a second terminal of the third transistor is electrically connected to the second node,
wherein a gate of the first transistor is electrically connected to the third node,
wherein a second terminal of the first capacitor is electrically connected to a second terminal of the first transistor,
wherein a gate of the second transistor is electrically connected to a first terminal of the fourth transistor and a first terminal of the second capacitor,
wherein a second terminal of the second capacitor is electrically connected to the first terminal of the second transistor,
wherein the first current supply circuit is configured to:
vary a threshold voltage of the first transistor by writing a first correction voltage from the second node to the back gate of the first transistor when the third transistor is in an on states and
retain a voltage between the second terminal and the back gate of the first transistor by the first capacitor when the third transistor is in an off state, and
wherein the first node of the first current supply circuit is electrically connected to the third node of the first current supply circuit and the third node of the second current supply circuit.

2. The semiconductor device according to claim 1,
further comprising a first circuit, a second circuit, and a reading circuit,
wherein the first circuit is electrically connected to the first node of the first current supply circuit,
wherein the second circuit is electrically connected to the first node of the second current supply circuit, wherein the reading circuit is electrically connected to the first node of the second current supply circuit, wherein the first circuit is configured to draw a first current or a second current from the first node of the first current supply circuit, wherein the second circuit is configured to draw a third current or a fourth current from the first node of the second current supply circuit, wherein the second transistor of the first current supply circuit is configured to flow a fifth current corresponding to a gate-source voltage of the second transistor of the first current supply circuit when the first current is drawn from the first node of the first current supply circuit, wherein the first transistor of the first current supply circuit is configured to:

flow a first differential current between the fifth current and the first current when the first current is drawn from the first node of the first current supply circuit; and flow a second differential current between the fifth current and the second current when the second current is drawn from the first node of the first current supply circuit, wherein the first transistor of the second current supply circuit is configured to:

flow the first differential current when the first current is drawn from the first node of the first current supply circuit; and flow the second differential current when the second current is drawn from the first node of the first current supply circuit, wherein the second transistor of the second current supply circuit is configured to flowing a sixth current corresponding to a gate-source voltage of the second transistor of the second current supply circuit when the third current and the first differential current are drawn from the first node of the second current supply circuit, and wherein the reading circuit is configured to draw a seventh current obtained by subtracting a sum of the second differential current and the fourth current from the sixth current when the first current drawn from the first node of the first current supply circuit is varied to the second current and the third current drawn from the first node of the second current supply circuit is varied to the fourth current.

3. The semiconductor device according to claim 2, wherein the second circuit comprises the same configuration as the first circuit, wherein the first circuit comprises a seventh transistor, an eighth transistor, and a third capacitor, wherein a gate of the seventh transistor is electrically connected to a first terminal of the eighth transistor and a first terminal of the third capacitor, wherein a first terminal of the seventh transistor of the first circuit is electrically connected to the first node of the first current supply circuit, wherein a first terminal of the seventh transistor of the second circuit is electrically connected to the first node of the second current supply circuit, wherein the seventh transistor of the first circuit is configured to:

flow the first current when a first potential is applied to a gate of the seventh transistor and a second potential is applied to a second terminal of the third capacitor in the first circuit; and a function of flow the second current when the first potential is applied to the gate of the seventh transistor and a third potential is applied to the second terminal of the third capacitor in the first circuit, wherein the seventh transistor of the second circuit is configured to:

flow the third current when a fourth potential is applied to a gate of the seventh transistor and the second potential is applied to a second terminal of the third capacitor in the second circuit; and flow the fourth current when the fourth potential is applied to the gate of the seventh transistor and the third potential is applied to the second terminal of the third capacitor in the second circuit, wherein a difference between the first potential and the fourth potential is a potential difference corresponding to first data, wherein a difference between the second potential and the third potential is a potential difference corresponding to second data, and wherein the seventh current is a current corresponding to a product of the first data and the second data.

4. The semiconductor device according to claim 3, wherein the first circuit further comprises a ninth transistor and a fourth capacitor, wherein the seventh transistor comprises a back gate, wherein the back gate of the seventh transistor is electrically connected to a first terminal of the ninth transistor and a first terminal of the fourth capacitor, wherein a second terminal of the fourth capacitor is electrically connected to a second terminal of the seventh transistor, and wherein the first circuit is configured to:

write a second correction voltage from a second terminal of the ninth transistor to the back gate of the seventh transistor to vary a threshold voltage of the seventh transistor when the ninth transistor is in an on state; and retain a voltage between the second terminal and the back gate of the seventh transistor by the fourth capacitor when the ninth transistor is in an off state.

5. The semiconductor device according to claim 1, wherein the first current supply circuit further comprises a fifth capacitor, and wherein a first terminal of the fifth capacitor is electrically connected to the gate of the second transistor.

6. The semiconductor device according to claim 1, wherein the first circuit further comprises a tenth transistor, wherein a source and a drain of the tenth transistor are electrically connected to each other, wherein one of the gate and the source of the tenth transistor is electrically connected to a gate of the second transistor, and wherein a channel width of the tenth transistor is less than or equal to 0.5 times a channel width of the fourth transistor.

7. A semiconductor device, wherein all the transistors included in the semiconductor device according to claim 1 comprise a metal oxide in a channel formation region and comprise the same polarity.

8. A semiconductor device comprising:

a first current supply circuit and a second current supply circuit, wherein the second current supply circuit comprises the same configuration as the first current supply circuit, wherein the first current supply circuit comprises first to fifth transistors, a first capacitor, a second capacitor, and first to fifth nodes, wherein a first terminal of the first transistor is electrically connected to a first terminal of the fifth transistor and the fifth node, wherein a first terminal of the second transistor is electrically connected to a second terminal of the fifth transistor and the first node, wherein a back gate of the first transistor is electrically connected to a first terminal of the third transistor and a first terminal of the first capacitor, wherein a second terminal of the third transistor is electrically connected to the second node, wherein a gate of the first transistor is electrically connected to the third node, wherein a second terminal of the first capacitor is electrically connected to a second terminal of the first transistor, wherein a gate of the fifth transistor is electrically connected to the fourth node, wherein a gate of the second transistor is electrically connected to a first terminal of the fourth transistor and a first terminal of the second capacitor, wherein a second terminal of the second capacitor is electrically connected to the first terminal of the second transistor, wherein the first current supply circuit is configured to:
vary a threshold voltage of the first transistor by writing a first correction voltage from the second node to the back gate of the first transistor when the third transistor is in an on state. and
retain a voltage between the second terminal and the back gate of the first transistor by the first capacitor when the third transistor is in an off state, wherein the first node of the first current supply circuit is electrically connected to the fourth node of the first current supply circuit and the fourth node of the second current supply circuit, and wherein the fifth node of the first current supply circuit is electrically connected to the third node of the first current supply circuit and the third node of the second current supply circuit.

9. The semiconductor device according to claim 8, wherein the first current supply circuit further comprises a sixth transistor, and wherein a first terminal of the sixth transistor is electrically connected to the first terminal of the first transistor, and wherein, when the fifth transistor is turned off and the sixth transistor is turned on, a current flowing between the second terminal of the first transistor and the second terminal of the sixth transistor is monitored to determine the first correction voltage in accordance with the current.

\* \* \* \* \*